(12) United States Patent
    Sakamoto

(10) Patent No.: US 10,804,482 B2
(45) Date of Patent: Oct. 13, 2020

(54) SILICON-CONTAINING COMPOUND AND ORGANIC ELECTROLUMINESCENCE DEVICE INCLUDING THE SAME

(71) Applicant: Samsung Display Co., Ltd., Yongin-si, Gyeonggi-do (KR)

(72) Inventor: Naoya Sakamoto, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 365 days.

(21) Appl. No.: 15/946,648

(22) Filed: Apr. 5, 2018

(65) Prior Publication Data

US 2019/0097156 A1    Mar. 28, 2019

(30) Foreign Application Priority Data

Sep. 25, 2017   (KR) .................. 10-2017-0123746

(51) Int. Cl.
    *C07F 7/10*      (2006.01)
    *H01L 51/00*    (2006.01)
    *H01L 51/50*    (2006.01)

(52) U.S. Cl.
    CPC ...... *H01L 51/5028* (2013.01); *H01L 51/0059* (2013.01); *H01L 51/0065* (2013.01);
    (Continued)

(58) Field of Classification Search
    CPC ........ C07F 7/081; C07F 7/10; H01L 51/0094; H01L 51/0059
    See application file for complete search history.

(56) References Cited

U.S. PATENT DOCUMENTS 9,139,582 B2    9/2015  Parham et al.
2015/0236274 A1  8/2015  Hatakeyama et al.

FOREIGN PATENT DOCUMENTS

JP   2001-278889 A    10/2001
JP      5935199 B2     5/2016
(Continued)

OTHER PUBLICATIONS

SciFinder Searches, May 2020.*

*Primary Examiner* — Vu A Nguyen
(74) *Attorney, Agent, or Firm* — Lewis Roca Rothgerber Christie LLP

(57) ABSTRACT

A silicon-containing compound which improves emission efficiency and an organic electroluminescence device including the same are provided. The silicon-containing compound according to the inventive concept is represented by Formula 1 below.

Formula 1

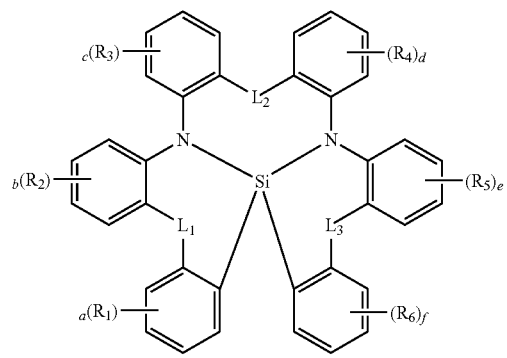

15 Claims, 1 Drawing Sheet

(52) U.S. Cl.
CPC ...... *H01L 51/0094* (2013.01); *H01L 51/0067* (2013.01); *H01L 51/5012* (2013.01)

(56) References Cited

FOREIGN PATENT DOCUMENTS

| | | | |
|---|---|---|---|
| JP | 6009435 | B2 | 9/2016 |
| KR | 10-2013-0098173 | A | 9/2013 |
| KR | 10-2016-0119683 | A | 10/2016 |
| WO | WO 2011/137951 | A1 | 11/2011 |

\* cited by examiner

SILICON-CONTAINING COMPOUND AND ORGANIC ELECTROLUMINESCENCE DEVICE INCLUDING THE SAME

CROSS-REFERENCE TO RELATED APPLICATION

This patent application claims priority to and the benefit of Korean Patent Application No. 10-2017-0123746, filed on Sep. 25, 2017, the entire content of which is hereby incorporated by reference.

BACKGROUND

The present disclosure herein relates to a silicon-containing compound and an organic electroluminescence device including the same, and more particularly, to a silicon-containing compound including a silicon atom and an organic electroluminescence device including the same.

The use of an organic electroluminescence display device as an image display device is being actively developed. Different from a liquid crystal display device, the organic electroluminescence display device is a self-luminescent display device in which holes and electrons injected from a first electrode and a second electrode recombine in an emission layer, and a luminescent material including an organic compound in the emission layer emits light resulting in a display.

The application of an organic electroluminescence device to a display device requires a decrease of the driving voltage, and an increase of both the emission efficiency and the life of the organic electroluminescence device. Suitable materials for stably decreasing the driving voltage and increasing the emission efficiency in an organic electroluminescence device are of interest for the development of organic electroluminescence display devices as image display devices.

In order to accomplish an organic electroluminescence device with high efficiency, both phosphorescence emission and delayed fluorescence emission technologies are currently being developed. Phosphorescence emission uses energy produced from a triplet state and delayed fluorescence emission uses triplet-triplet annihilation (TTA) by which singlet excitons are produced by the collision of triplet excitons. In particular, component materials using thermally activated delayed fluorescence (TADF) are also being developed for organic electroluminescent devices.

SUMMARY

Aspects of embodiments of the present disclosure are directed toward a silicon-containing compound for an organic electroluminescence device which is capable of improving emission efficiency.

Aspects of embodiments of the present disclosure are directed toward an organic electroluminescence device including a silicon-containing compound, the organic electroluminescence device having improved emission efficiency.

An embodiment of the present disclosure provides a silicon-containing compound represented by the following Formula 1:

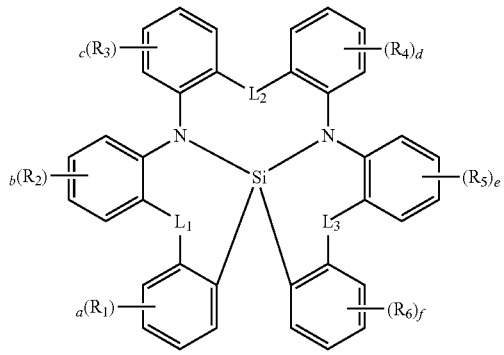

Formula 1

In Formula 1, $L_1$, $L_2$ and $L_3$ are each independently a direct linkage, O, or S, $R_1$ to $R_6$ are each independently a hydrogen atom, a deuterium atom, a halogen atom, a cyano group, a substituted or unsubstituted amine group, a substituted or unsubstituted silyl group, a substituted or unsubstituted phosphine group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, and "a" to "f" are each independently an integer of 0 to 4.

In an embodiment, $L_1$ to $L_3$ may be the same.

In an embodiment, $L_1$ and $L_3$ may be the same, and $L_2$ may be different from $L_1$ and $L_3$.

In an embodiment, Formula 1 may be represented by any one of the following Formula 1-1 to Formula 1-3:

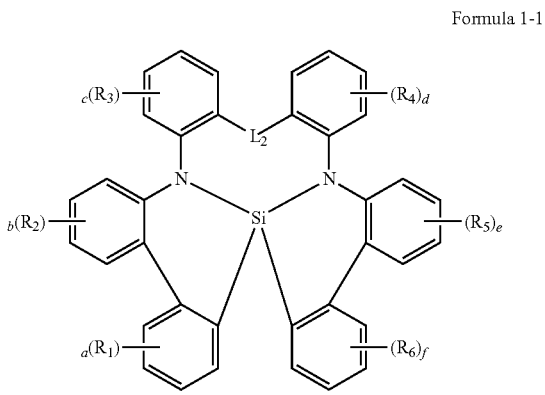

Formula 1-1

Formula 1-2

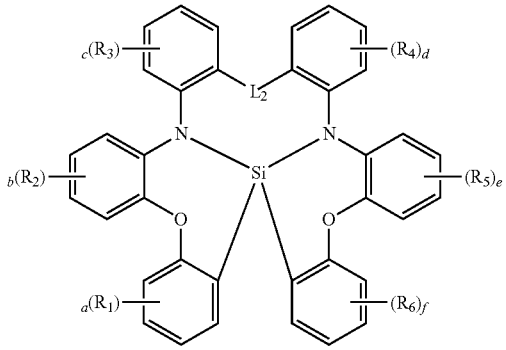

Formula 1-3

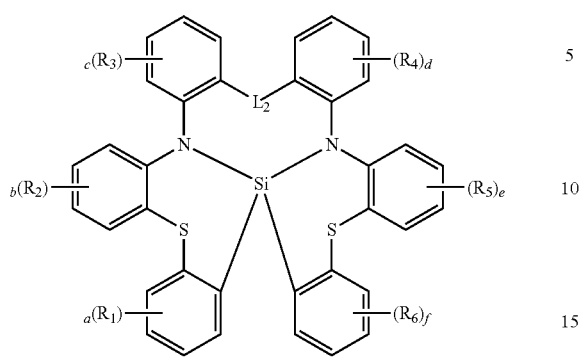

In Formula 1-1 to Formula 1-3, $L_2$, $R_1$ to $R_6$, and "a" to "f" are the same as defined in Formula 1.

In an embodiment, $R_1$ to $R_6$ may each independently be a fluorine atom, a t-butyl group, a substituted or unsubstituted phenyl group, a triphenylsilyl group, a diphenylamino group, a diphenylphosphine oxide group, or a substituted or unsubstituted heteroaryl group including N as a heteroatom and having 2 to 30 carbon atoms for forming a ring.

In an embodiment, the silicon-containing compound represented by Formula 1 may be any one of the compounds (e.g., Compounds 1-27) represented in the following Compound Group 1:

Compound Group 1

1

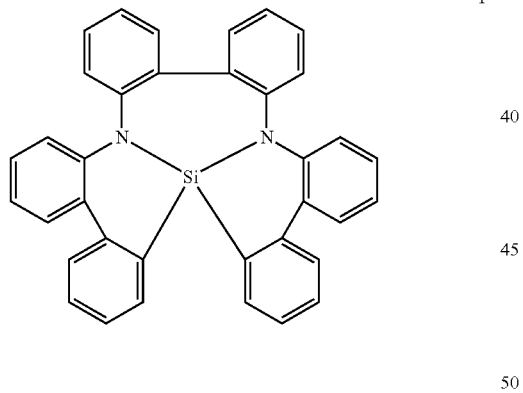

2

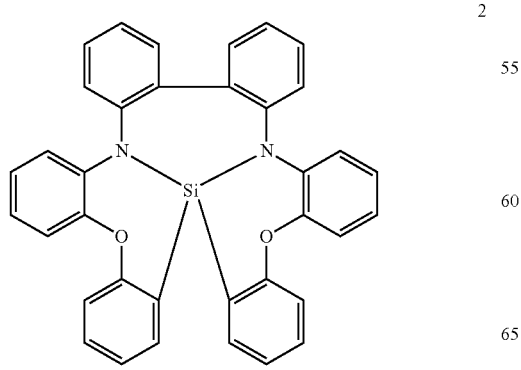

3

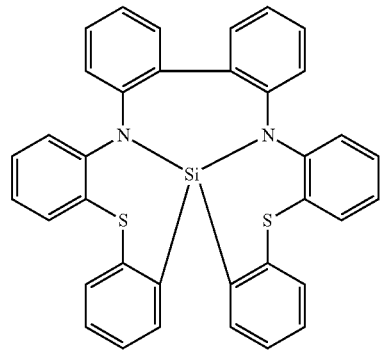

4

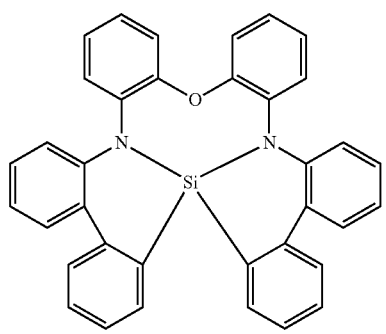

5

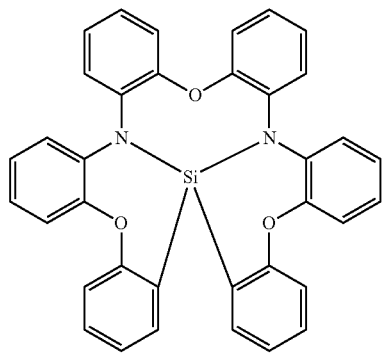

6

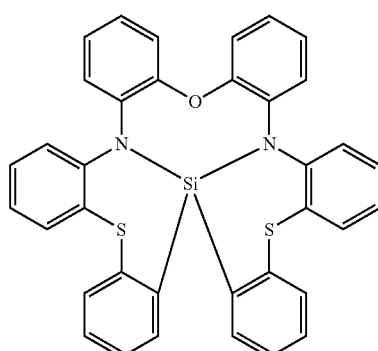

7
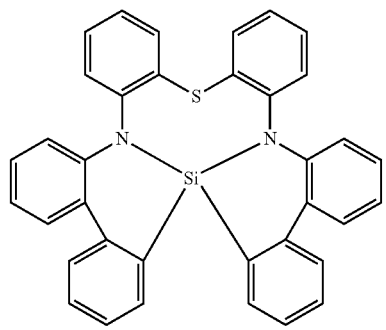
8
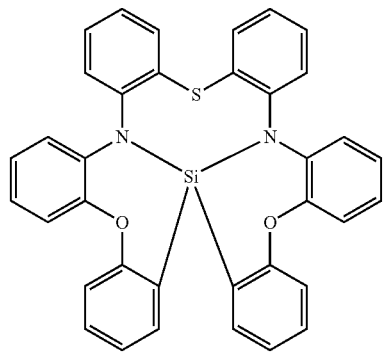
9
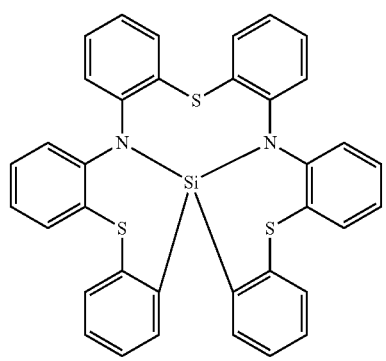
10
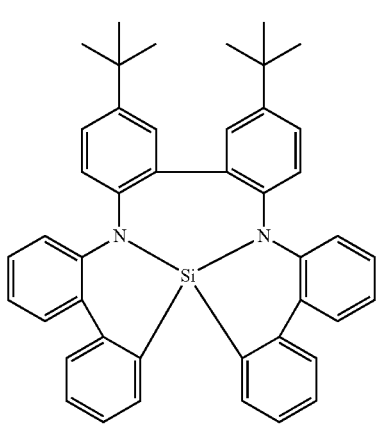
11
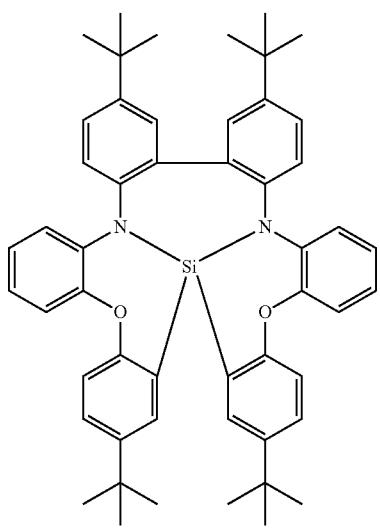
12
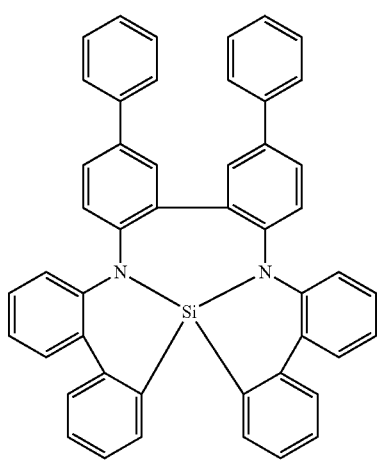
13
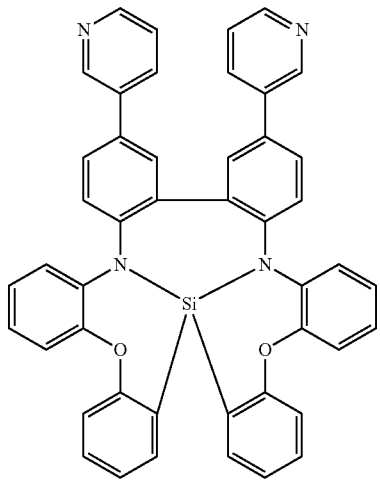

14
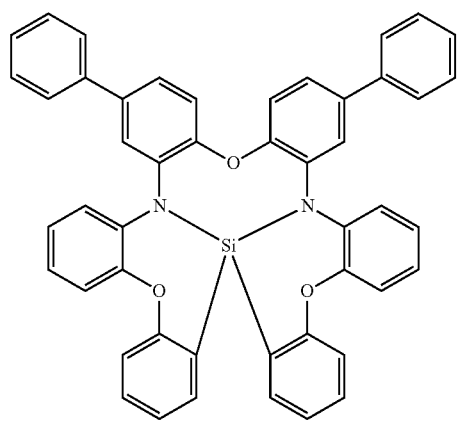
15
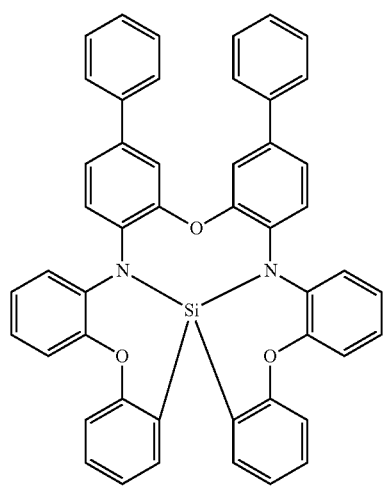
16
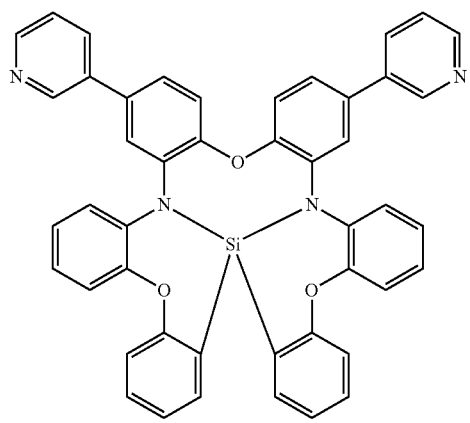
17
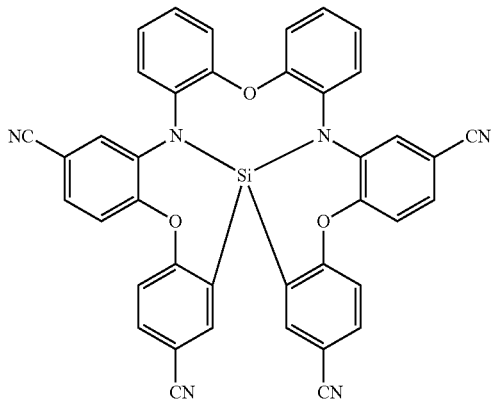
18
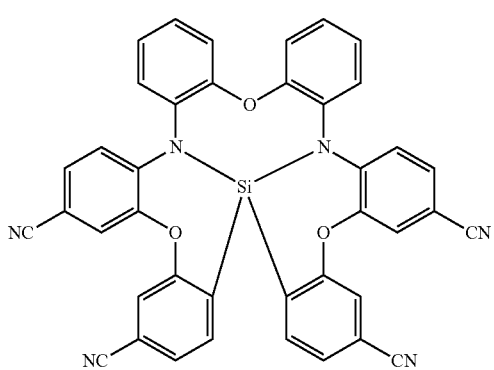
19
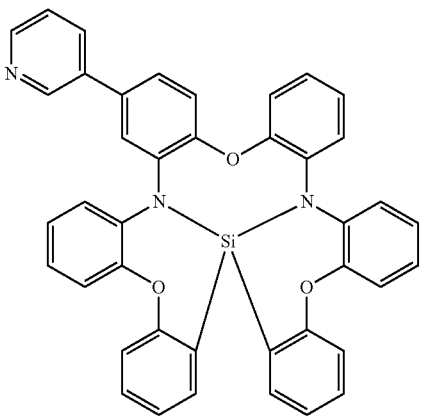

20
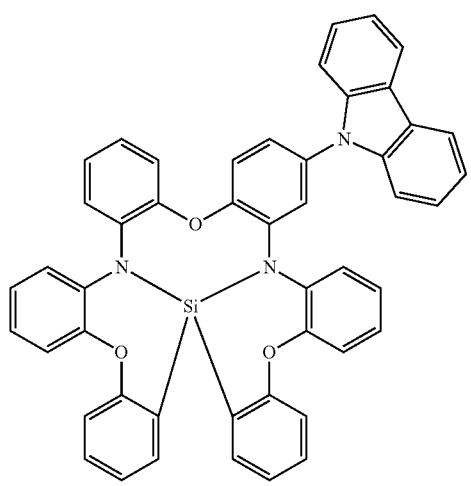
21
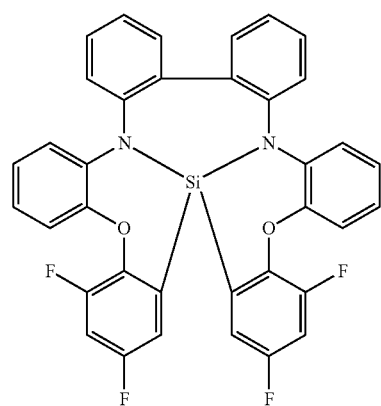
22
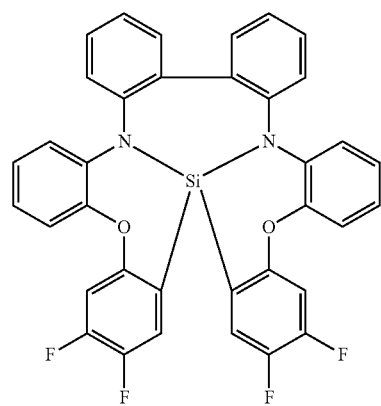
23
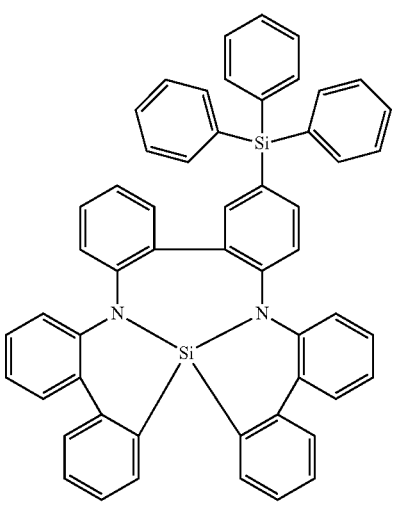
24
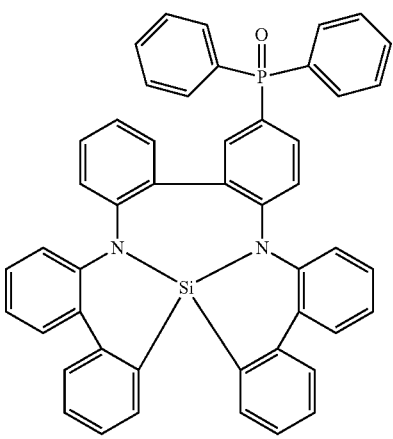
25
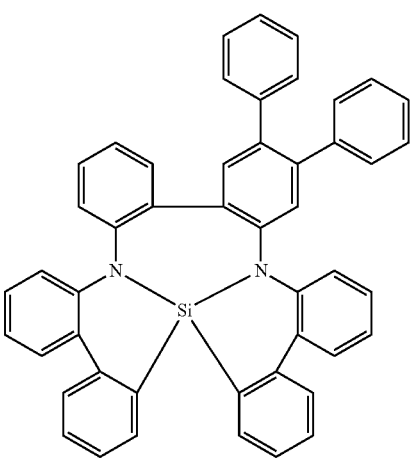

26

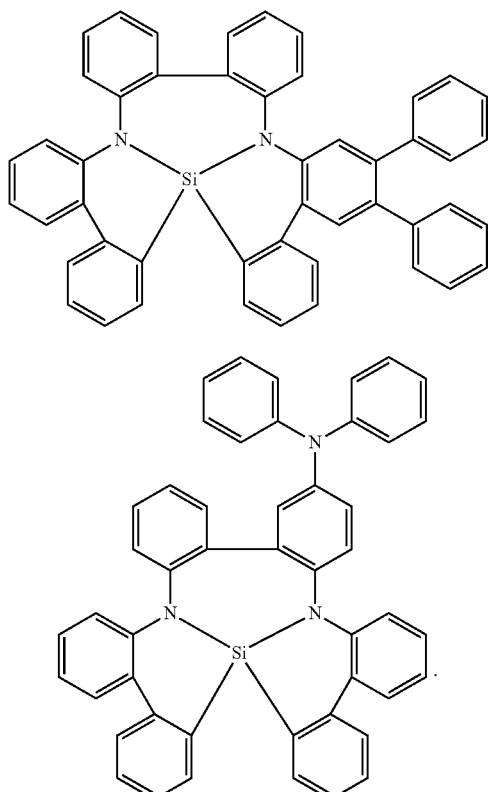

27

In some embodiments of the present disclosure, an organic electroluminescence device includes a first electrode, a second electrode opposite to the first electrode, and a plurality of organic layers disposed between the first electrode and the second electrode, the plurality of organic layers including an emission layer, wherein the first electrode and the second electrode are each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, or a compound of two or more selected from them, a mixture of two or more selected from them, or oxides thereof, and wherein at least one organic layer of the organic layers includes a silicon-containing compound represented by the following Formula 1:

Formula 1

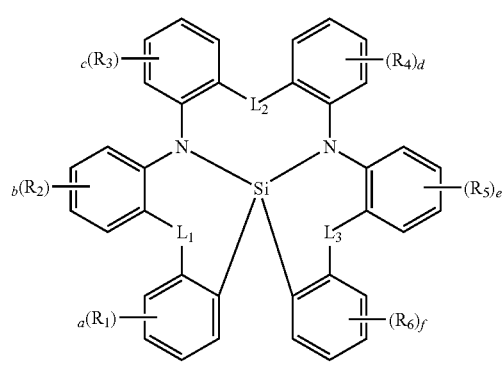

In Formula 1, $L_1$, $L_2$ and $L_3$ are each independently a direct linkage, O, or S, $R_1$ to $R_6$ are each independently a hydrogen atom, a deuterium atom, a halogen atom, a cyano group, a substituted or unsubstituted amine group, a substituted or unsubstituted silyl group, a substituted or unsubstituted phosphine group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, and "a" to "f" are each independently an integer of 0 to 4.

In an embodiment, Formula 1 may be represented by any one of the following Formula 1-1 to Formula 1-3:

Formula 1-1

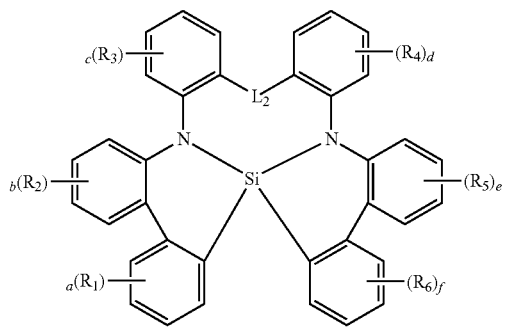

Formula 1-2

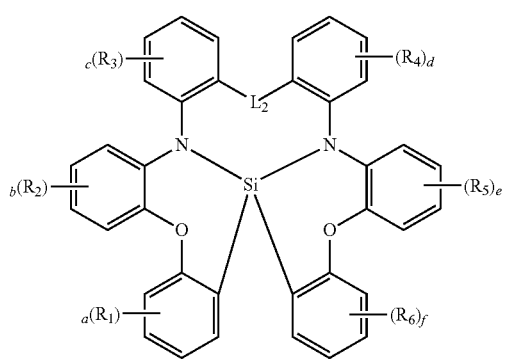

Formula 1-3

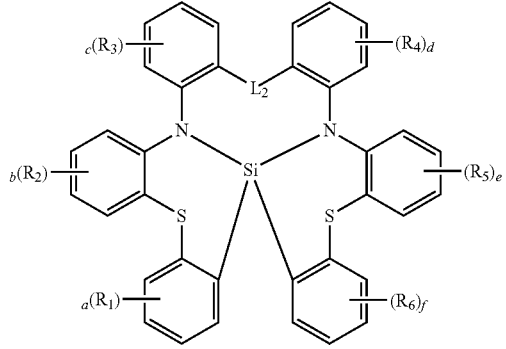

In Formula 1-1 to Formula 1-3, $L_2$, $R_1$ to $R_6$, and "a" to "f" are the same as defined in Formula 1.

In an embodiment, the emission layer of the organic electroluminescence device may include the silicon-containing compound represented by Formula 1.

In an embodiment, the emission layer of the organic electroluminescence device may include a host and a dopant, the dopant may include a thermally activated delayed fluorescence emission dopant, and the host may include the silicon-containing compound represented by Formula 1.

In an embodiment, the dopant of the organic electroluminescence device may include at least one of 10-phenyl-10H,10'H-spiro[acridine-9,9'-anthracene]-10'-one (ACRSA), 3,4,5,6-tetra-9H-carbazol-9-yl-1,2-benzenedicarbonitrile (4CzPN), 2,4,5,6-tetra-9H-carbazol-9-yl-isophthalonitrile (4CzIPN), bis[4-9,9-dimethyl-9,10-dihydroacridine]phenyl]solfone (DMAC-DPS), or2-phenoxazine-4,6-diphenyl-1,3,5-triazine (PSZ-TRZ).

In an embodiment, the lowest triplet energy level of the silicon-containing compound may be higher than the lowest triplet energy level of the dopant.

In an embodiment, the emission layer may emit thermally activated delayed fluorescence blue light.

In an embodiment, the organic layers may include a hole transport region disposed between the first electrode and the emission layer, and an electron transport region may be disposed between the emission layer and the second electrode, wherein the hole transport region includes the silicon-containing compound represented by Formula 1.

In an embodiment, at least one organic layer of the organic layers includes at least one silicon-containing compound of the compounds represented in the following Compound Group 1:

Compound Group 1

1
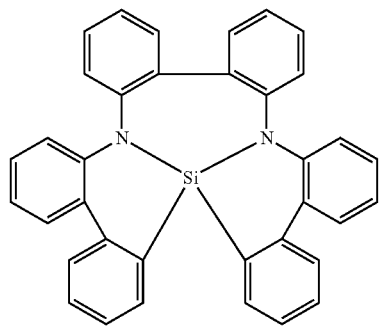

2
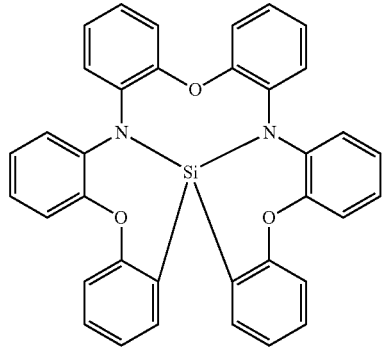

3
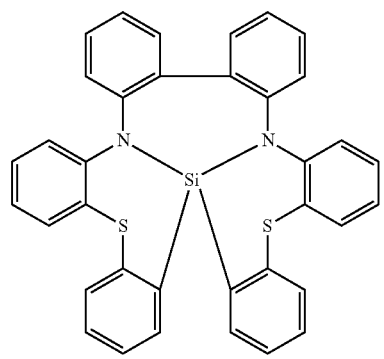

4
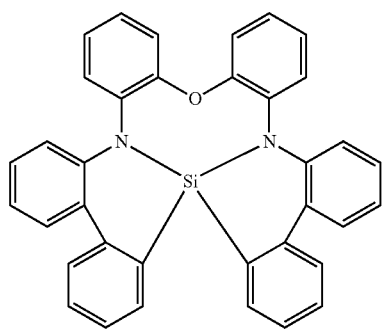

5
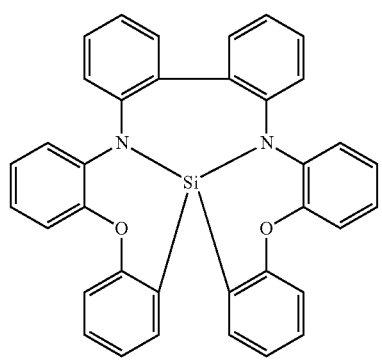

6
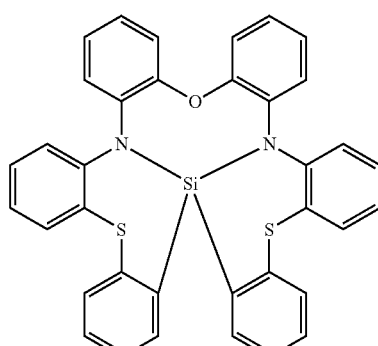

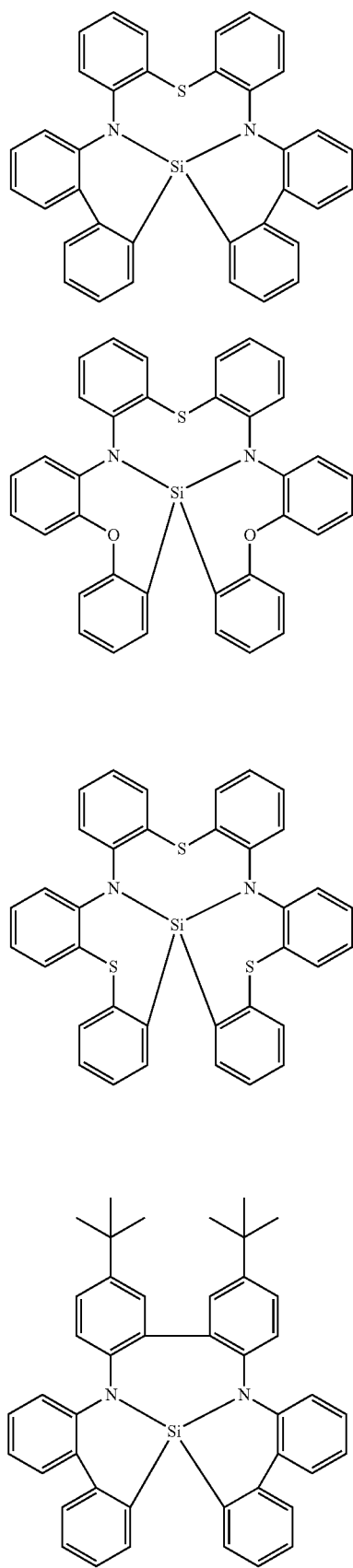
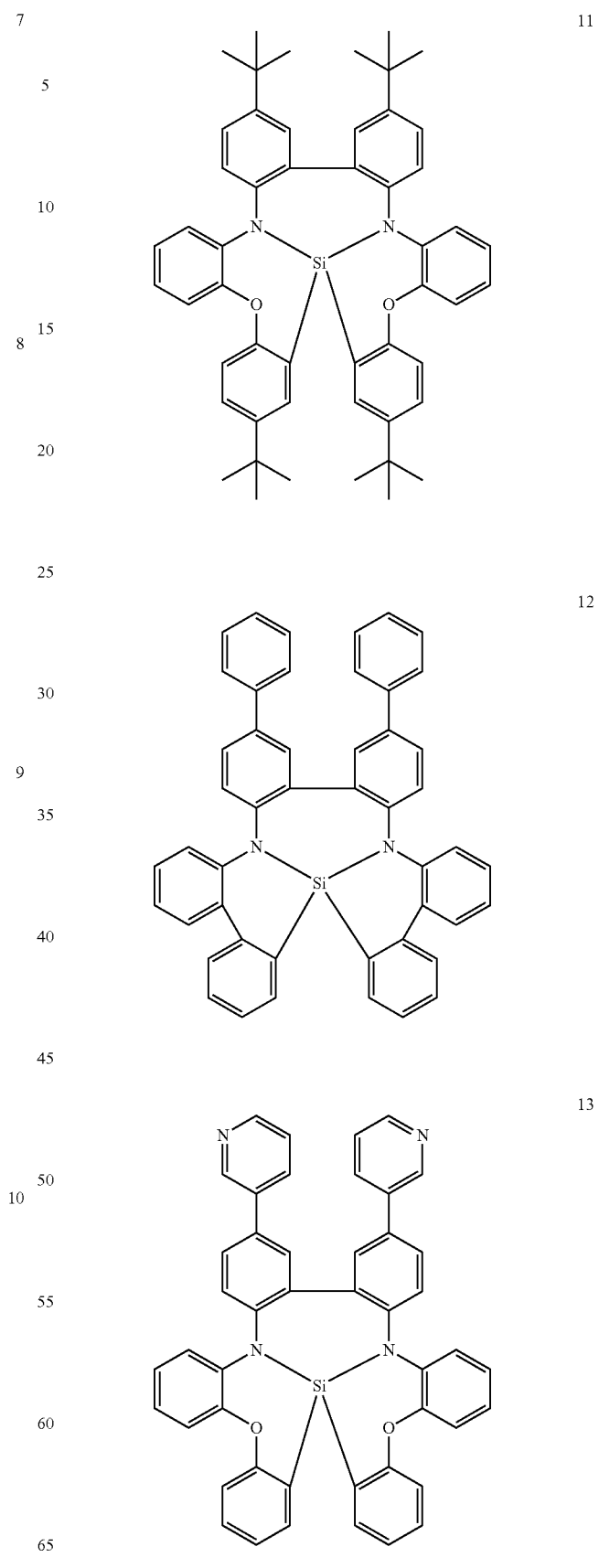

14
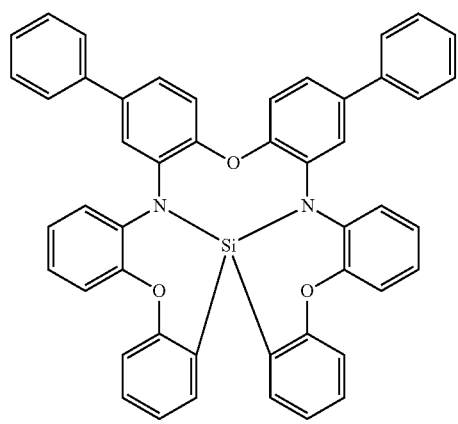
15
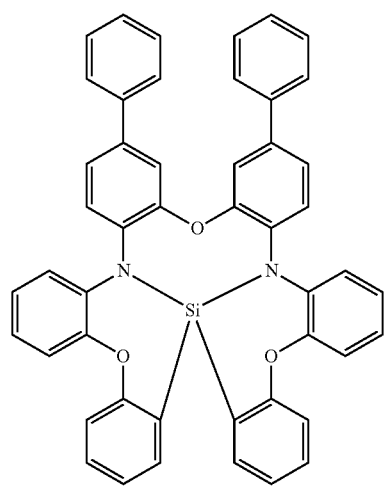
16
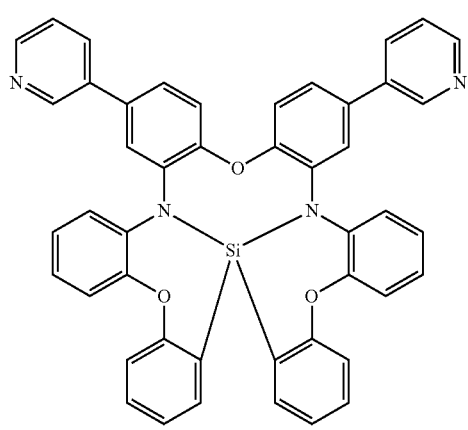
17
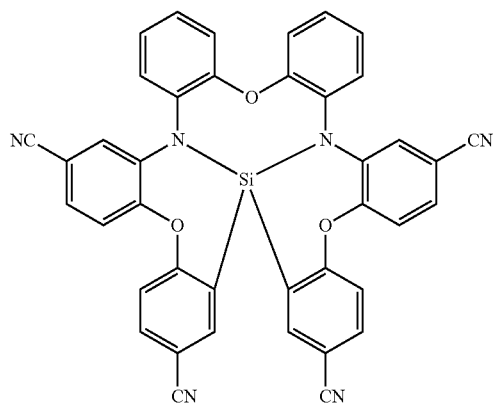
18
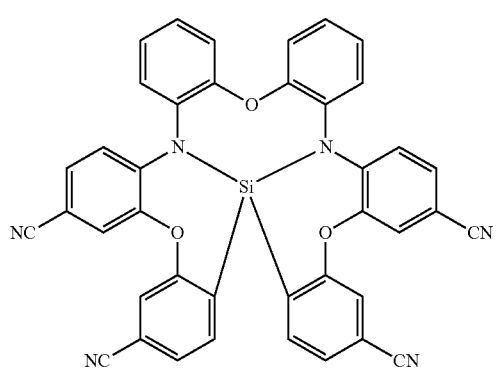
19
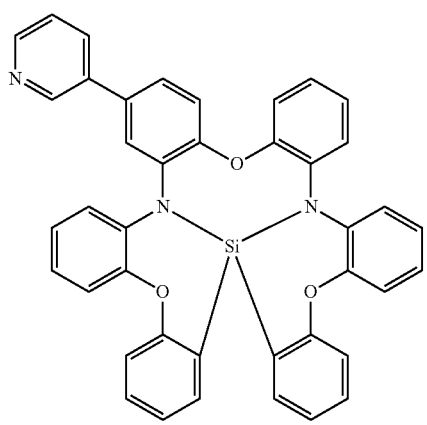

20
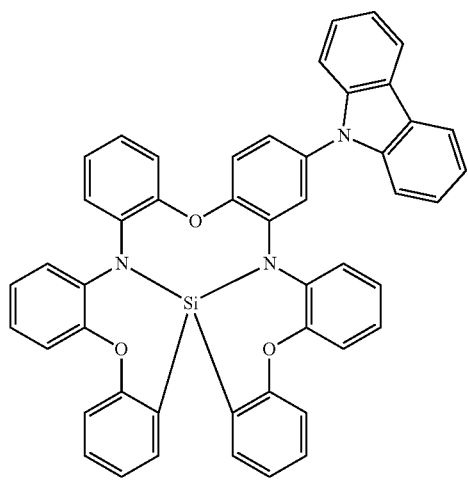
21
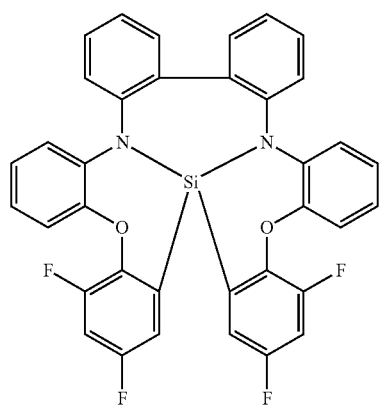
22
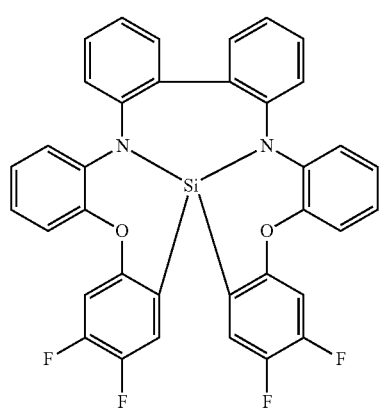
23
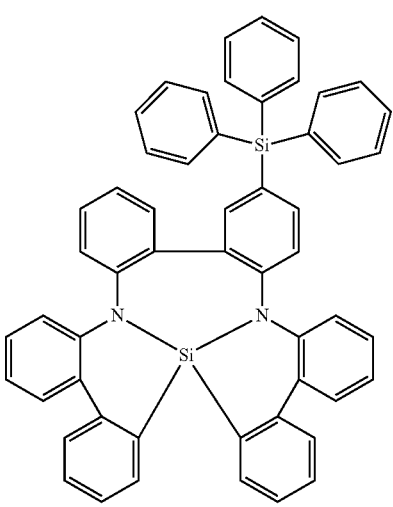
24
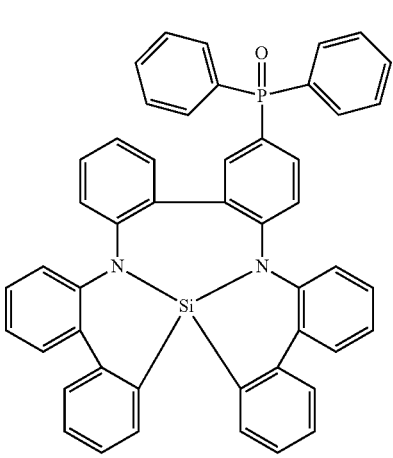
25
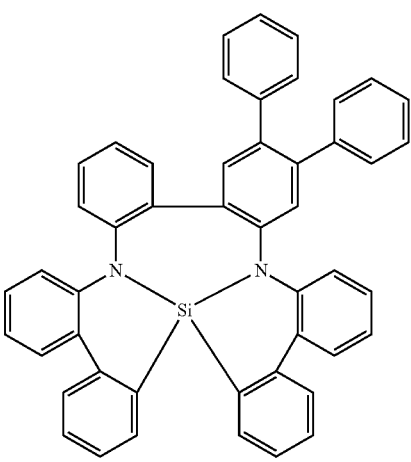

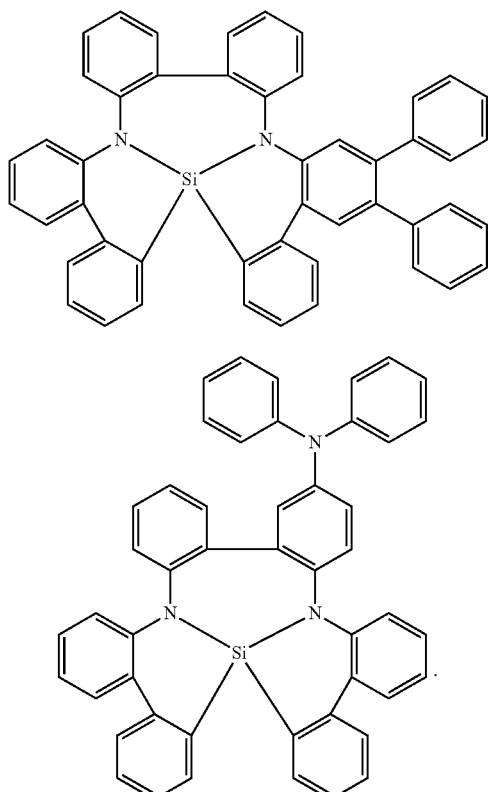

BRIEF DESCRIPTION OF THE FIGURES

The accompanying drawings are included to provide a further understanding of embodiments of the present disclosure, and are incorporated in and constitute a part of this specification. The drawings illustrate exemplary embodiments of the present disclosure and, together with the description, serve to explain principles according to embodiments of the present disclosure. In the drawings.

DETAILED DESCRIPTION

Figure 1:
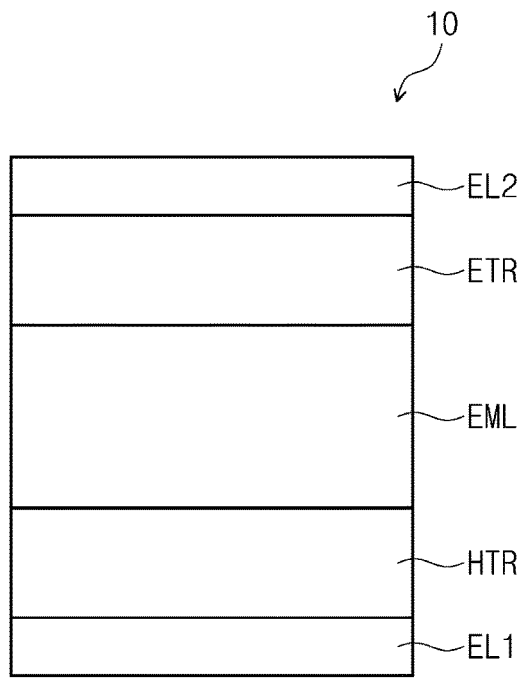
FIG. 1 is a cross-sectional view schematically illustrating an organic electroluminescence device according to exemplary embodiments of the present disclosure.

Aspects of embodiments of the present disclosure may have various modifications and may be embodied in different forms, and example embodiments are described with reference to the accompany drawings. Aspects of the embodiments of the present disclosure may, however, be embodied in different forms and should not be construed as limited to the embodiments set forth herein. Rather, all modifications, equivalents, and substituents which are included in the spirit and technical scope of the present disclosure are encompassed as embodiments of the present disclosure.

In this disclosure, like reference numerals refer to like elements throughout. In the drawings, the dimensions of structures are exaggerated for clarity of illustration. It will be understood that, although the terms first, second, may be used herein to describe various elements, these elements should not be limited by these terms. These terms are only used to distinguish one element from another element. Thus, a first element could be termed a second element without departing from the teachings of the present disclosure. Similarly, a second element could be termed a first element. As used herein, the singular forms are intended to include the plural forms as well, unless the context clearly indicates otherwise.

In the description, it will be further understood that the terms "comprises" and/or "comprising," when used in this specification, specify the presence of stated features, numerals, steps, operations, elements, parts, or the combination thereof, but do not preclude the presence or addition of one or more other features, numerals, steps, operations, elements, parts, or the combination thereof. It will also be understood that when a layer, a film, a region, a plate, etc. is referred to as being "on" another part, it can be "directly on" the other part, or intervening layers may also be present.

As used herein, the term "and/or" includes any and all combinations of one or more of the associated listed items. Expressions such as "at least one of," "one of," "at least one selected from," and "selected from" when preceding a list of elements, modify the entire list of elements and do not modify the individual elements of the list. Further, the use of "may" when describing embodiments of the present disclosure refers to "one or more embodiments of the present disclosure."

In the description, "-*" means a connected site.

In the description, the term "substituted or unsubstituted" corresponds to substituted or unsubstituted with at least one substituent selected from the group consisting of a deuterium atom, a halogen atom, a cyano group, a nitro group, an amino group, a silyl group, a boron group, a phosphine oxide group, a phosphine sulfide group, an alkyl group, an alkenyl group, an aryl group, and a heterocyclic group. In addition, each of the substituents may be substituted or unsubstituted. For example, a biphenyl group may be interpreted as an aryl group or a phenyl group substituted with a phenyl group.

In the description, the halogen atom may include a fluorine atom, a chlorine atom, a bromine atom or an iodine atom.

In the description, the alkyl may be a linear, branched or cyclic type. The carbon number of the alkyl may be from 1 to 50, from 1 to 30, from 1 to 20, from 1 to 10, or from 1 to 6. The alkyl may include, for example, methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, c-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, without limitation.

In the description, the aryl group means an optional functional group or substituent derived from an aromatic hydrocarbon ring. The aryl group may be a monocyclic aryl group or a polycyclic aryl group. The carbon number for forming a ring in the aryl group may be 6 to 30, 6 to 20, or 6 to 15. Examples of the aryl group may include phenyl, naphthyl, fluorenyl, anthracenyl, phenanthryl, biphenyl, terphenyl, quaterphenyl, quinqphenyl, sexiphenyl, triphenylenyl, pyrenyl, benzofluoranthenyl, chrysenyl, without limitation.

In the description, the fluorenyl group may be substituted, and two substituents may be combined to each other to form a spiro structure.

In the description, the heteroaryl may be a heteroaryl including at least one of O, N, P, Si or S as a heteroatom. The carbon number for forming a ring of the heteroaryl may be 2 to 30, or 2 to 20. Examples of the heteroaryl may include monocyclic heteroaryl or polycyclic heteroaryl. Examples of the polycyclic heteroaryl may have a dicyclic or tricyclic structure. Examples of the heteroaryl may include thiophene, furan, pyrrole, imidazole, thiazole, oxazole, oxadiazole, triazole, pyridine, bipyridine, pyrimidine, triazine, triazole, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofuran, phenanthroline, thiazole, isooxazole, oxadiazole, thiadiazole, phenothiazine, dibenzosilole, dibenzofuran, without limitation.

In the description, the silyl may include alkyl silyl or aryl silyl. Examples of the silyl may include trimethylsilyl, triethylsilyl, t-butyldimethylsilyl, vinyldimethylsilyl, propyldimethylsilyl, triphenylsilyl, diphenylsilyl, phenylsilyl, without limitation.

In the description, the boron group may include an alkyl boron group and an aryl boron group. Examples of the boron group may include a trimethylboron group, a triethylboron group, a t-butyldimethylboron group, a triphenylboron group, a diphenylboron group, a phenylboron group, without limitation.

In the description, the alkenyl may be linear or branched. The carbon number is not specifically limited, but may be 2 to 30, 2 to 20, or 2 to 10. Examples of the alkenyl may include vinyl, 1-butenyl, 1-pentenyl, 1,3-butadienyl aryl, styrenyl, styrylvinyl, without limitation.

In the description, the carbon number of the amine group is not specifically limited, and may be 1 to 30. The amine group may include an alkylamine group and an arylamine group. Examples of the amine group may include a methylamine group, a dimethylamine group, a phenylamine group, a naphthylamine group, a 9-methyl-anthracenylamine group, a triphenylamine group, without limitation.

In the description, the phosphine group may include a substituted or unsubstituted arylphosphine group and a substituted or unsubstituted phosphine oxide group. The substituted or unsubstituted phosphine oxide group may be an unsubstituted or substituted phosphine oxide group with alkyl or aryl. For example, the phosphine group may be a diphenylphosphine group, a dimethylphosphine oxide group, or diphenylphosphine oxide group. However, embodiments of the present disclosure are not limited thereto.

Hereinafter, a silicon-containing compound according to embodiments of the present disclosure is described.

The silicon-containing compound according to an embodiment of the present disclosure is represented by the following Formula 1:

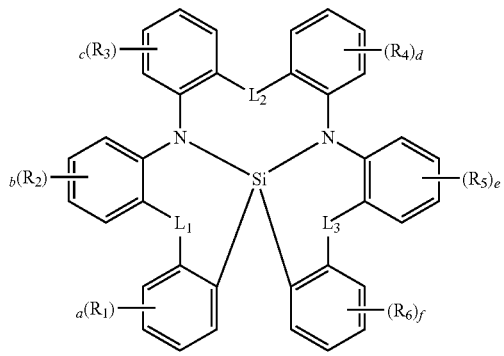

Formula 1

In Formula 1, $L_1$, $L_2$ and $L_3$ may each independently be a direct linkage, O, or S, $R_1$ to $R_6$ may each independently be a hydrogen atom, a deuterium atom, a halogen atom, a cyano group, a substituted or unsubstituted amine group, a substituted or unsubstituted silyl group, a substituted or unsubstituted phosphine group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, and "a" to "f" may each independently be an integer of 0 to 4.

The silicon-containing compound represented by Formula 1 may be diaminosilane derivatives in which a central silicon (Si) atom is bonded to two substituted or unsubstituted amine groups and two substituted or unsubstituted aryl groups. The silicon-containing compound represented by Formula 1 may be a cyclic compound in which a central silicon (Si) atom and substituents are all connected via linkers.

In Formula 1, $L_1$, $L_2$, and $L_3$ may each be the same. Alternatively, in Formula 1, at least one of $L_1$, $L_2$, or $L_3$ may be different.

For example, each of $L_1$, $L_2$, and $L_3$ may be direct linkages. Alternatively, each of $L_1$, $L_2$, and $L_3$ may be O, or each of $L_1$, $L_2$, and $L_3$ may be S.

In Formula 1, at least one of $L_1$, $L_2$, or $L_3$ may be different, for example, $L_1$ and $L_3$ may be the same, and $L_2$ may be different from $L_1$ and $L_3$. For example, $L_1$ and $L_3$ may be direct linkages, and $L_2$ may be O or S. In addition, $L_1$ and $L_3$ may be O, $L_2$ may be a direct linkage or S, $L_1$ and $L_3$ may be S, and $L_2$ may be a direct linkage or O.

In Formula 1, $R_1$ to $R_6$ may each independently be a hydrogen atom, a deuterium atom, a halogen atom, a cyano group, a substituted or unsubstituted amine group, a substituted or unsubstituted silyl group, a substituted or unsubstituted phosphine group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring. In addition, "a" to "f" may each independently be an integer of 0 to 4.

For example, in Formula 1, all "a" to "f" may be 0, and in this case, all the amine groups or the aryl groups connected with the silicon (Si) atom of the silicon-containing compound of an embodiment may be unsubstituted. Alternatively, if "a" to "f" are each independently an integer of 2 or more, any of $R_1$ to $R_6$ may be the same or different.

In Formula 1, $R_1$ to $R_6$ may each independently be a fluorine atom, a t-butyl group, a substituted or unsubstituted phenyl group, a cyano group, a substituted or unsubstituted silyl group, or a heteroaryl group including N as a heteroatom and having 2 to 30 carbon atoms for forming a ring.

Particularly, in Formula 1, at least one of $R_1$ to $R_6$ may be a fluorine atom, a t-butyl group, an unsubstituted phenyl group, a cyano group, a triphenylsilyl group, a carbazole group, a pyridine group. In addition, in Formula 1, at least one of $R_1$ to $R_6$ may be a diphenylamino group, a diphenylphosphine oxide group.

The silicon-containing compound of an embodiment, represented by Formula 1 may be a compound having a bilateral symmetry shape about a silicon (Si) atom. For example, the moieties at both sides in the silicon-containing compound of an embodiment may be symmetric about a silicon (Si) atom or $L_2$. However, embodiments of the present disclosure are not limited thereto.

The silicon-containing compound of an embodiment, represented by Formula 1 may be represented by any one of the following Formula 1-1 to Formula 1-3:

Formula 1-1

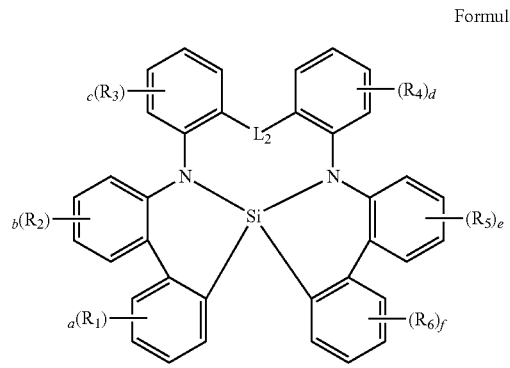

Formula 1-2

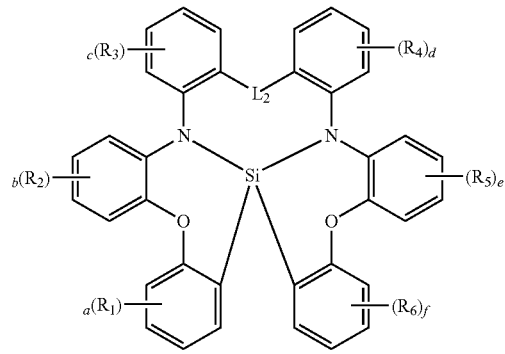

Formula 1-3

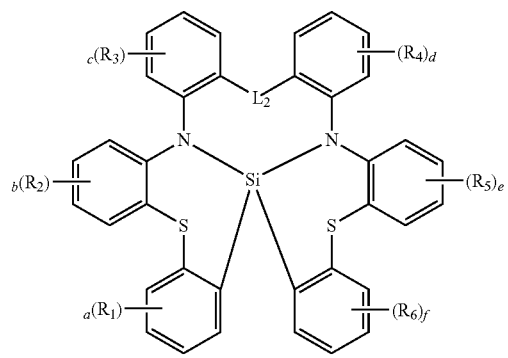

With reference to Formula 1-1 both $L_1$ and $L_3$ are direct linkages. With reference to Formula 1-2 both $L_1$ and $L_3$ are O. With reference to Formula 1-3 both $L_1$ and $L_3$ are S. In Formula 1-1 to Formula 1-3, $L_2$, $R_1$ to $R_6$, and "a" to "f" are as defined in Formula 1.

The silicon-containing compound represented by Formula 1 may be any one of the compounds (e.g., Compounds 1-27) represented in the following Compound Group 1.

Compound Group 1

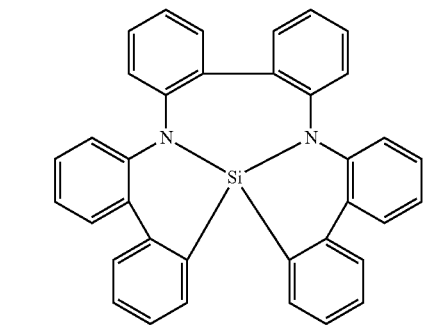

1

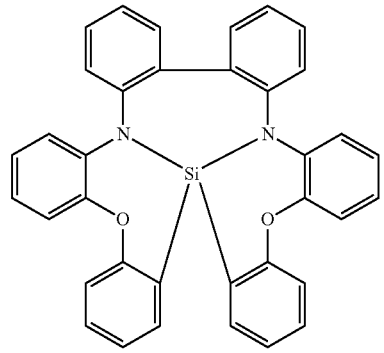

2

3
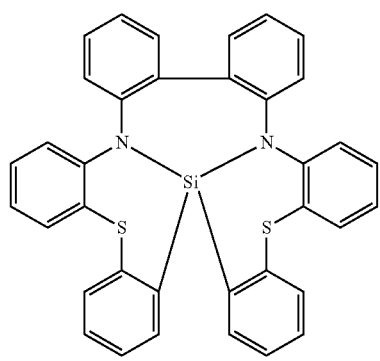
4
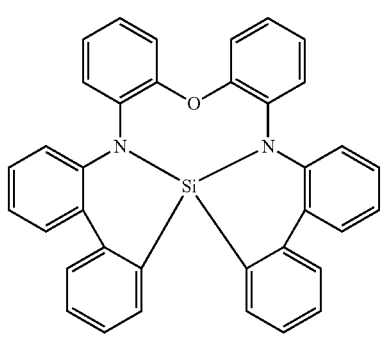
5
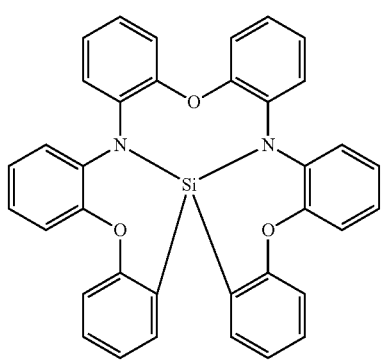
6
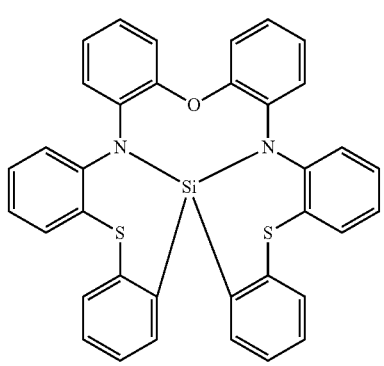
7
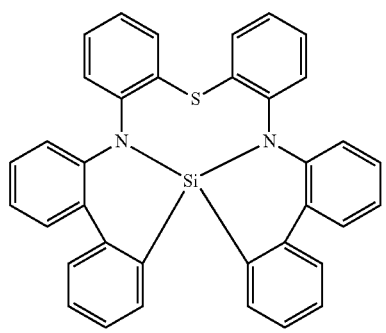
8
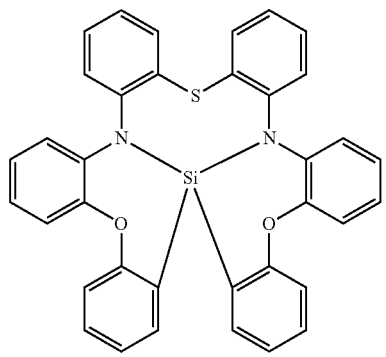
9
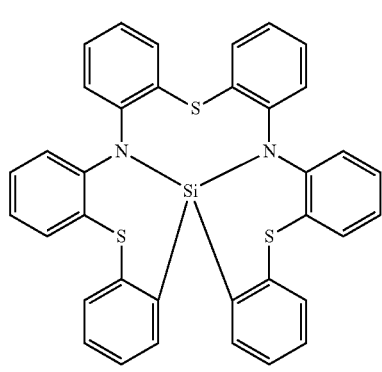
10
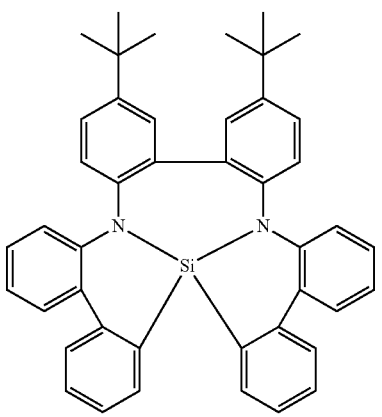

11
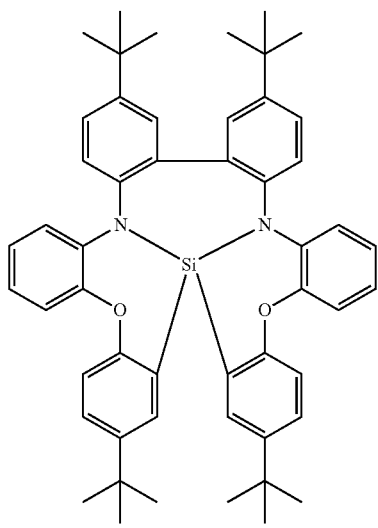
12
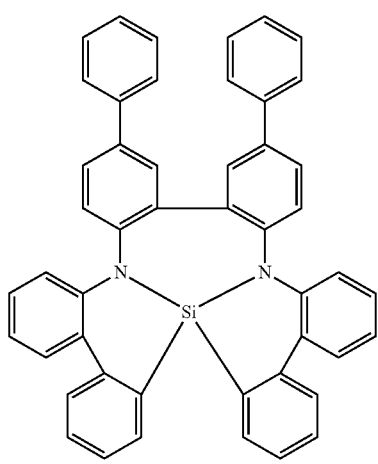
13
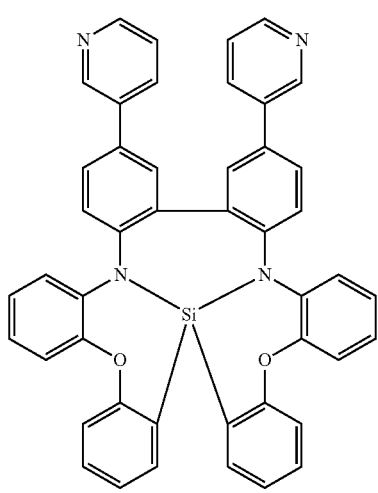
14
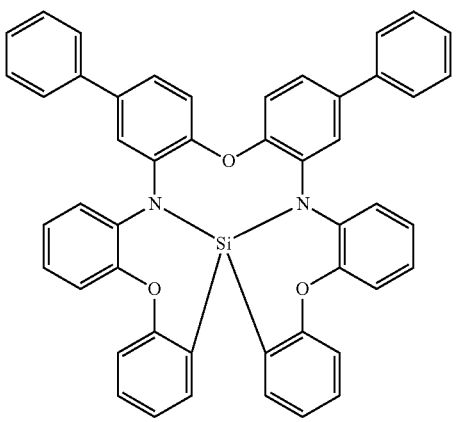
15
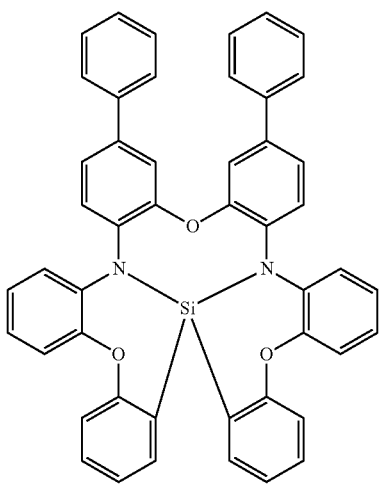
16
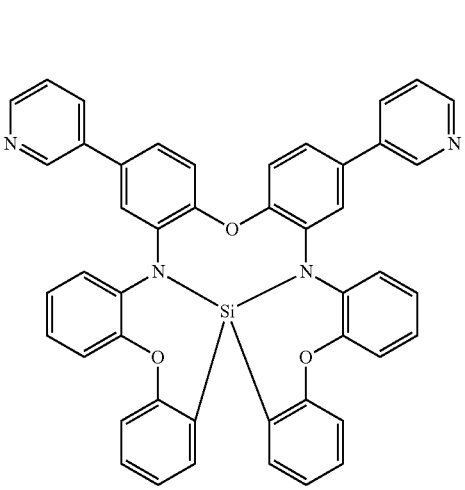

17
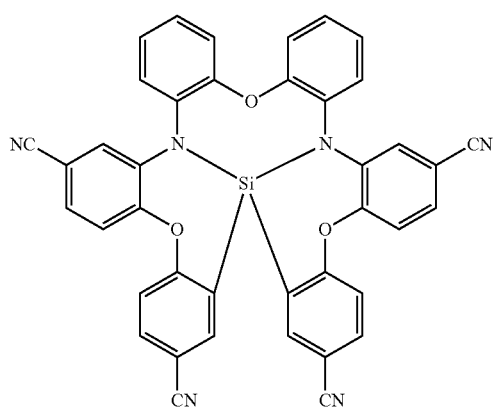
18
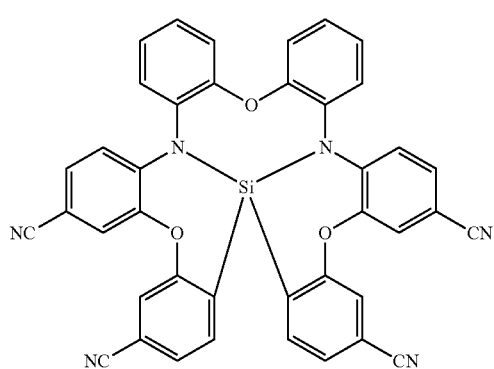
19
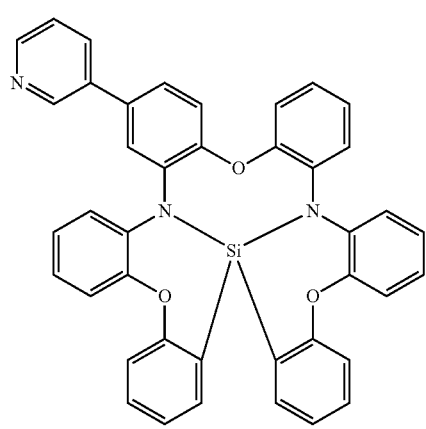
20
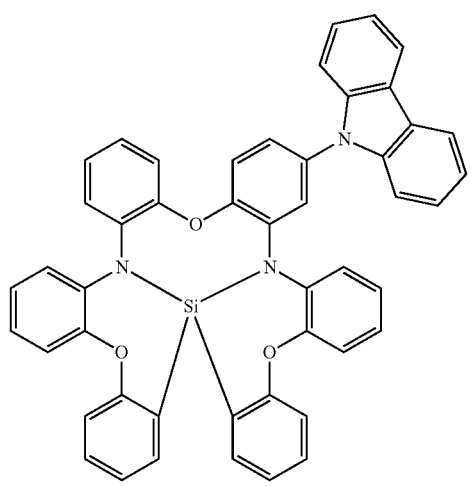
21
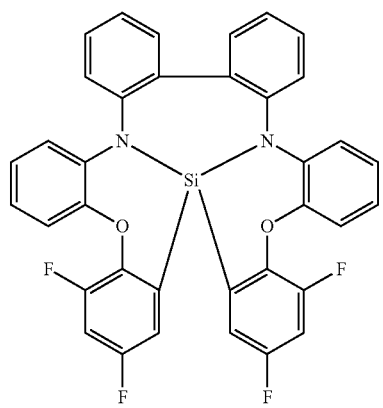
22
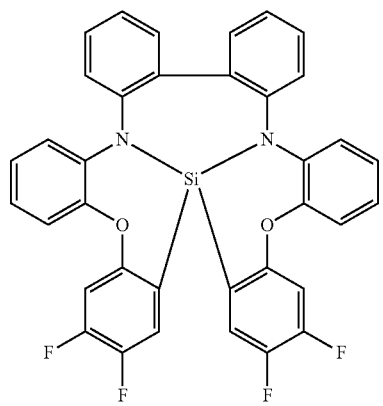

23
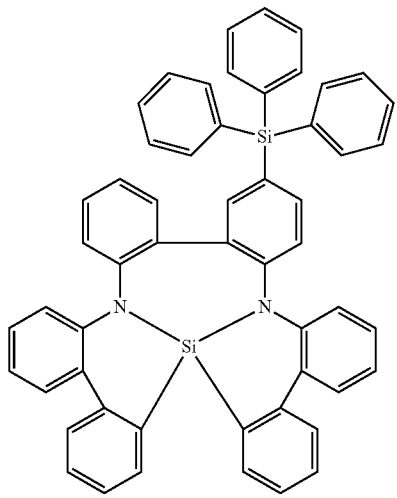

24
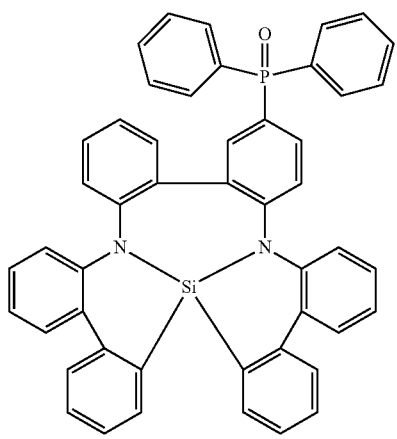

25
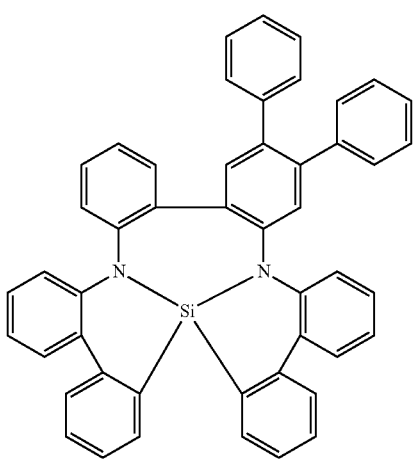

26
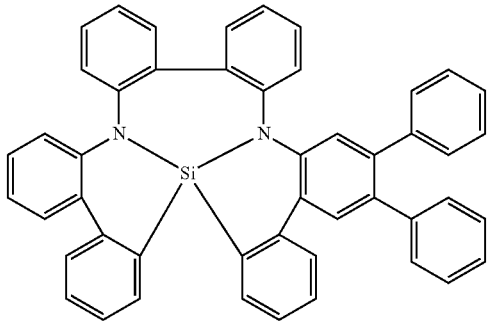

27
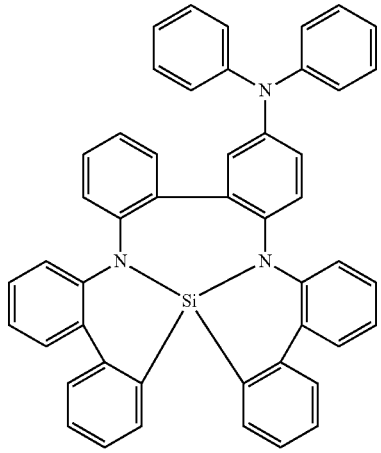

The above-described silicon-containing compound according to an embodiment may be used in an organic electroluminescence device to improve the emission efficiency of the organic electroluminescence device. The silicon-containing compound of an embodiment may be used as a material of an organic layer disposed between opposite electrodes of an organic electroluminescence device. For example, the silicon-containing compound of an embodiment of the present disclosure may be used as or in a material for an emission layer or as or in a material for a hole transport region to improve the emission efficiency of an organic electroluminescence device.

In addition, the silicon-containing compound of an embodiment of the present disclosure may be included in an emission layer together with a thermally activated delayed fluorescence dopant to further improve emission efficiency. In addition, the silicon-containing compound of the present disclosure may be used in an emission layer emitting blue light to further improve the emission efficiency of an organic electroluminescence device.

The silicon-containing compound of an embodiment of the present disclosure may be included in a hole transport region of an organic electroluminescence device. For example, the silicon-containing compound of an embodiment may be included as a material for a hole transport layer of a hole transport region to improve the emission efficiency of the organic electroluminescence device.

According to embodiments of the present disclosure, the silicon-containing compound has a cyclic shape in which a silicon (Si) atom is in the center, and substituents bonded to the silicon (Si) atom are connected via linkers, thereby achieving high molecular stability. In some embodiments, the silicon-containing compound in which a silicon (Si)

atom is in the center, has a high triplet energy level (T1), and may be used in an emission layer or in a hole transport region emitting thermally activated delayed fluorescence to further improve the emission efficiency of an organic electroluminescence device.

Hereinafter, an organic electroluminescence device according to an embodiment of the present disclosure is described. Hereinafter, reference to the silicon-containing compound includes all embodiments of the silicon-containing compound described in this disclosure.

Figure 2:
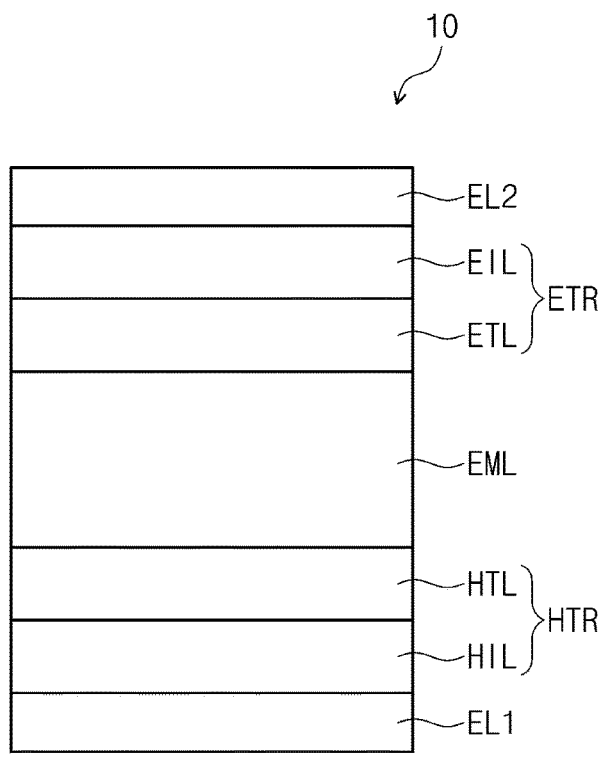
FIG. 2 is a cross-sectional view schematically illustrating an organic electroluminescence device according to exemplary embodiments of the present disclosure.

FIGS. 1 and 2 are cross-sectional views schematically illustrating organic electroluminescence devices according to embodiments of the present disclosure. Referring to FIGS. 1 and 2, an organic electroluminescence device 10 according to an embodiment of the present disclosure includes a first electrode EL1, a hole transport region HTR, an emission layer EML, an electron transport region ETR, and a second electrode EL2 laminated as layers one by one.

The first electrode EL1 and the second electrode EL2 are disposed to face each other, and a plurality of organic layers may be disposed between the first electrode EL1 and the second electrode EL2. The plurality of the organic layers may include the hole transport region HTR, the emission layer EML, and the electron transport region ETR.

The organic electroluminescence device 10 may include the silicon-containing compound of any embodiment in the present disclosure, with the silicon-containing compound in at least one organic layer of the plurality of organic layers. At least one organic layer may be disposed between the first electrode EL1 and the second electrode EL2. For example, the silicon-containing compound may be included in the emission layer EML.

FIG. 2 illustrates a cross-sectional view of an organic electroluminescence device of an embodiment of the present disclosure, in which a hole transport region HTR includes a hole injection layer HIL and a hole transport layer HTL, and an electron transport region ETR includes an electron injection layer EIL and an electron transport layer ETL.

The first electrode EL1 has conductivity. The first electrode EL1 may be formed using a metal alloy or a conductive compound. The first electrode EL1 may be an anode.

The first electrode EL1 may be a transmissive electrode, a transflective electrode, or a reflective electrode. If the first electrode EL1 is the transmissive electrode, the first electrode EL1 may be formed using a transparent metal oxide such as indium tin oxide (ITO), indium zinc oxide (IZO), zinc oxide (ZnO), and indium tin zinc oxide (ITZO). If the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). Also, the first electrode EL1 may include a plurality of layers including a reflective layer or a transflective layer formed using the above materials, and a transmissive layer formed using ITO, IZO, ZnO, or ITZO. For example, the first electrode EL1 may include a plurality of layers of ITO/Ag/ITO.

The hole transport region HTR is provided on the first electrode EL1. The hole transport region HTR may include at least one of a hole injection layer HIL, a hole transport layer HTL, a hole buffer layer, or an electron blocking layer.

The hole transport region HTR may have a single layer formed using a single material, a single layer formed using a plurality of different materials, or a multilayer structure including a plurality of layers formed using a plurality of different materials.

For example, the hole transport region HTR may have the structure of a single layer such as a hole injection layer HIL, or a hole transport layer HTL, in which the single layer is formed using a hole injection material or a hole transport material. Alternatively, the hole transport region HTR may have a structure of a single layer formed using a plurality of different materials. For example, the HTR may be formed by lamination on the first electrode EL1 as a hole injection layer HIL/hole transport layer HTL as shown in FIG. 2. Additionally, the HTR may be formed by lamination on the first electrode EL1 as a hole injection layer HIL/hole transport layer HTL/hole buffer layer, a hole injection layer HIL/hole buffer layer, a hole transport layer HTL/hole buffer layer, or a hole injection layer HIL/hole transport layer HTL/electron blocking layer, without limitation.

The hole transport region HTR may be formed using any suitable method. Non-limiting examples of methods for forming the HTR include a vacuum deposition method, a spin coating method, a cast method, a Langmuir-Blodgett (LB) method, an inkjet printing method, a laser printing method, and a laser induced thermal imaging (LITI) method.

The hole injection layer HIL of the organic electroluminescence device 10 of an embodiment may include any suitable hole injection material. For example, the hole injection layer HIL may include triphenylamine-containing polyetherketone (TPAPEK), 4-isopropyl-4'-methyldiphenyliodoniumtetrakis(pentafluorophenyl)borate (PPBL), N,N'-diphenyl-N,N'-bis-[4-(phenyl-m-tolyl-amino)-phenyl]-phenyl-4,4'-diamine (DNTPD), a phthalocyanine compound such as copper phthalocyanine, 4,4',4"-tris(3-methylphenylphenylamino)triphenylamine (m-MTDATA), N,N'-di(1-naphthyl)-N,N'-diphenyl-benzidine (NPB), N,N'-bis(1-naphthyl)-N,N'-diphenyl-4,4'-diamine (α-NPD), 4,4',4"-tris (N,N-diphenylamino)triphenylamine (TDATA), 4,4',4"-tris (N,N-2-naphthyphenylamino)triphenylamine (2-TNATA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), or polyaniline/poly(4-styrenesulfonate) (PANI/PSS). However, embodiments of the present disclosure are not limited thereto.

The hole transport layer HTL of the organic electroluminescence device 10 of an embodiment may include a suitable hole transport material. For example, the hole transport layer HTL may include 1,1-bis[(di-4-trileamino)phenyl]cyclohexane (TAPC), carbazole derivatives such as N-phenyl carbazole and polyvinyl carbazole, N,N'-bis(3-methylphenyl)-N,N'-diphenyl-[1,1-biphenyl]-4,4'-diamine (TPD), 4,4',4"-tris(N-carbazolyl)triphenylamine (TCTA), N,N'-di(1-naphtyl)-N,N'-diphenylbenzidine (NPB), N,N'-bis(1-naphthyl)-N,N'-diphenyl-4,4'-diamine (α-NPD). However, an embodiment of the inventive concept is not limited thereto.

The thickness of the hole transport region HTR may be from about 100 Å to about 10,000 Å, for example, from about 100 Å to about 1,000 Å. If the hole transport region HTR includes both the hole injection layer HIL and the hole transport layer HTL, the thickness of the hole injection layer HIL may be from about 100 Å to about 1,000 Å, and the thickness of the hole transport layer HTL may be from about 30 Å to about 1,000 Å. If the thicknesses of the hole transport region HTR, the hole injection layer HIL, and the hole transport layer HTL satisfy the above-described ranges, satisfactory hole transport properties may be obtained without substantial increase of a driving voltage.

The hole transport region HTR may further include a charge generating material in addition to the above-described materials to improve conductivity. The charge generating material may be dispersed uniformly or non-uniformly in the hole transport region HTR. The charge generating material may be, for example, a p-dopant. The p-dopant may be one of quinone derivatives, metal oxides, or cyano group-containing compounds, without limitation. For example, non-limiting examples of the p-dopant may include quinone derivatives such as tetracyanoquinodimethane (TCNQ) and 2,3,5,6-tetrafluoro-7,7,8,8-tetracyanoquinodimethane (F4-TCNQ), metal oxides such as tungsten oxide and molybdenum oxide, without limitation.

As described above, the hole transport region HTR may further include one of a hole buffer layer and an electron blocking layer in addition to the hole injection layer HIL and the hole transport layer HTL. The hole buffer layer may compensate an optical resonance distance according to the wavelength of light emitted from the emission layer EML and increase light emission efficiency. Materials included in the hole transport region HTR may be used as materials included in the hole buffer layer.

In some embodiments of the present disclosure, the hole transport region HTR may further include an electron blocking layer, and the electron blocking layer may be disposed between the hole transport layer HTL and the emission layer EML. The electron blocking layer may be a layer playing the role of preventing the electron injection from the electron transport region ETR to the hole transport region HTR. The electron blocking layer may use a suitable material for an electron blocking layer. For example, the electron blocking layer may include 1,3-bis(N-carbazolyl)benzene (mCP). However, embodiments of the present disclosure are not limited thereto.

The emission layer EML is provided on the hole transport region HTR. The thickness of the emission layer EML may be from about 100 Å to about 300 Å. The emission layer EML may have a single layer formed using a single material, a single layer formed using a plurality of different materials, or a multilayer structure having a plurality of layers formed using a plurality of different materials.

The emission layer EML may emit one of red light, green light, blue light, white light, yellow light, or cyan light. The emission layer EML may include a phosphorescent material or a fluorescent material.

In the organic electroluminescence device 10 of an embodiment of the present disclosure, the emission layer EML may be a fluorescence emission layer. For example, a portion of lights emitted from the emission layer EML may be due to thermally activated delayed fluorescence. In particular, the emission layer EML of the organic electroluminescence device 10 may include a light-emitting component which emits thermally activated delayed fluorescence, and the emission layer EML of the organic electroluminescence device 10 may be a blue emitting emission layer which emits thermally activated delayed fluorescence.

In some embodiments of the present disclosure, the emission layer EML of the organic electroluminescence device 10 includes a host and a dopant. In some embodiments, the emission layer EML may have a thickness of about 100 Å to about 600 Å.

In some embodiments of the present disclosure, the emission layer EML of the organic electroluminescence device 10 includes the silicon-containing compound as disclosed herein. In some embodiments, the organic electroluminescence device 10 includes a silicon-containing compound represented by the following Formula 1 in an emission layer EML and emits fluorescence.

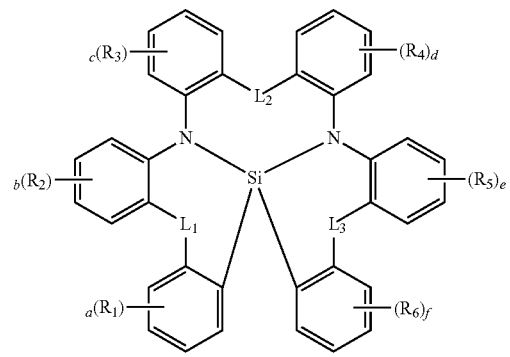

Formula 1

In Formula 1: $L_1$, $L_2$ and $L_3$ may each independently be a direct linkage, O, or S, $R_1$ to $R_6$ may each independently be a hydrogen atom, a deuterium atom, a halogen atom, a cyano group, a substituted or unsubstituted amine group, a substituted or unsubstituted silyl group, a substituted or unsubstituted phosphine group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, and "a" to "f" may each independently be an integer of 0 to 4.

In some embodiments of the present disclosure, the silicon-containing compound represented by Formula 1 is used in the organic electroluminescence device 10 and $L_1$ to $L_3$, $R_1$ to $R_6$, and "a" to "f" are as previously defined herein for Formula 1.

In addition, in the organic electroluminescence device 10 of an embodiment, the emission layer EML may include a silicon-containing compound represented by any one in the following Formula 1-1 to Formula 1-3:

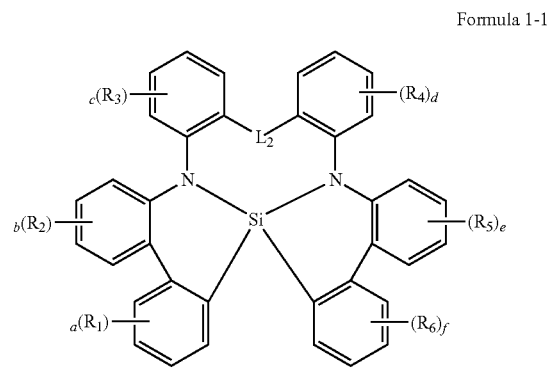

Formula 1-1

Formula 1-2

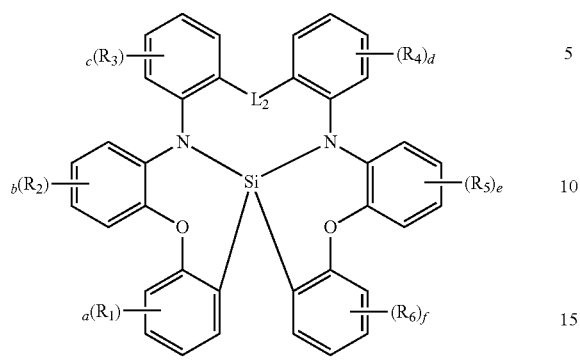

Formula 1-3

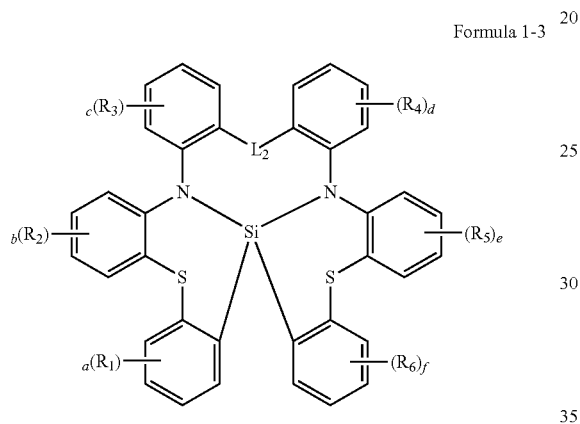

In Formula 1-1 to Formula 1-3, $L_2$, $R_1$ to $R_6$, and "a" to "f" are as defined for Formula 1.

In some embodiments of the present disclosure, the organic electroluminescence device 10 may include the silicon-containing compound represented by Formula 1 in an emission layer EML and the emission layer may emit delayed fluorescence. For example, the organic electroluminescence device 10 may include the silicon-containing compound represented by Formula 1 in an emission layer EML and may emit thermally activated delayed fluorescence. Additionally, the emission layer EML of the organic electroluminescence device 10 may include the silicon-containing compound represented by Formula 1 as a host material.

In some embodiments, the organic electroluminescence device 10 may include at least one of the compounds represented in Compound Group 1 (e.g., one of Compound 1-27) in an emission layer EML. For example, the organic electroluminescence device 10 may include at least one of the compounds represented in Compound Group 1 as a host material of an emission layer EML. In particular, at least one silicon-containing compound of the compounds represented in Compound Group 1 may be included in the emission layer EML of the organic electroluminescence device 10 together with a thermally activated delayed fluorescence dopant material.

Compound Group 1

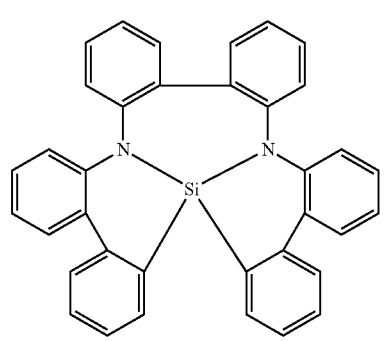

1

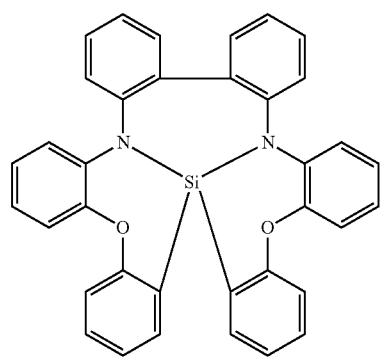

2

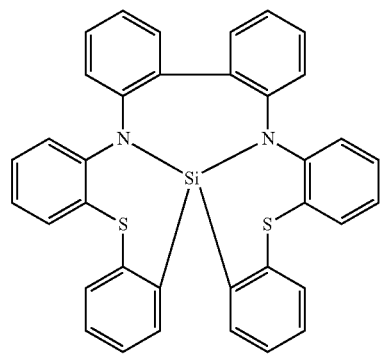

3

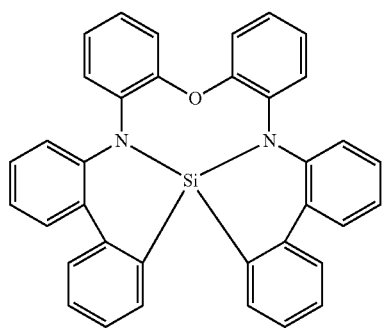

4

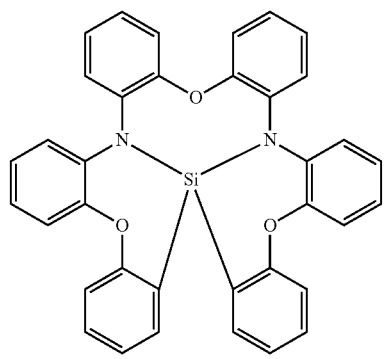
5
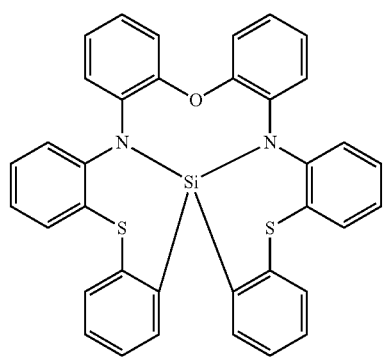
6
7
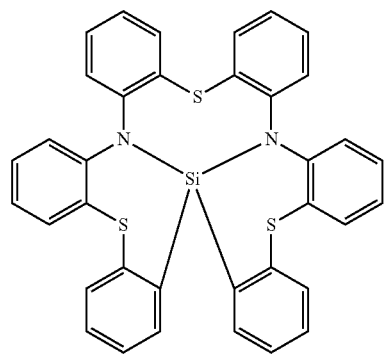
9
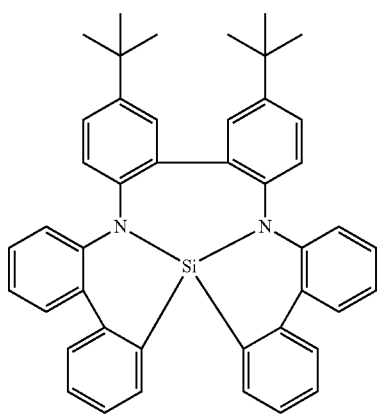
10
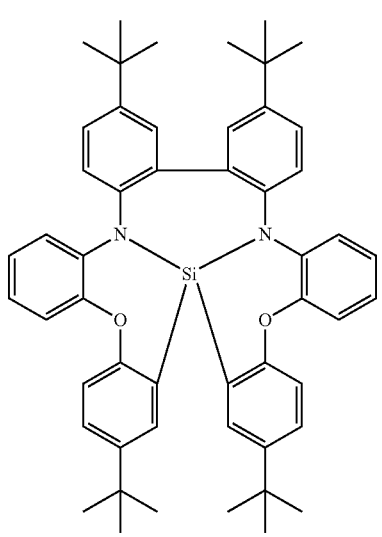
11

12
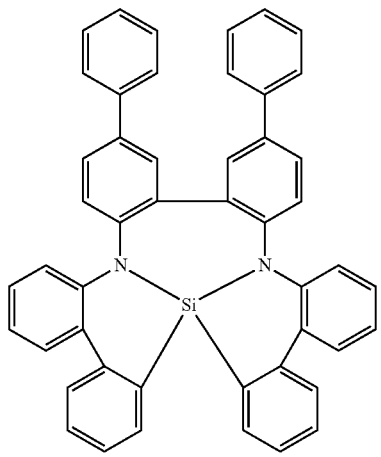
13
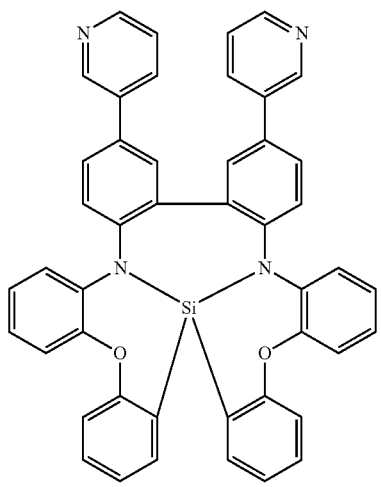
14
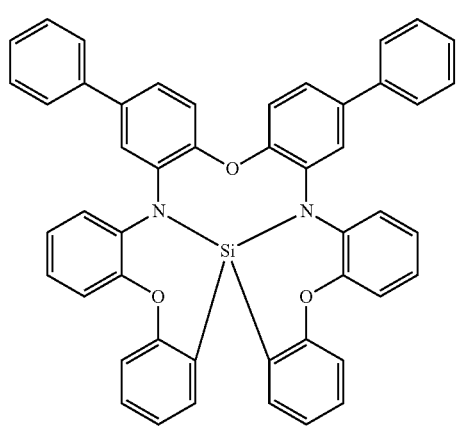
15
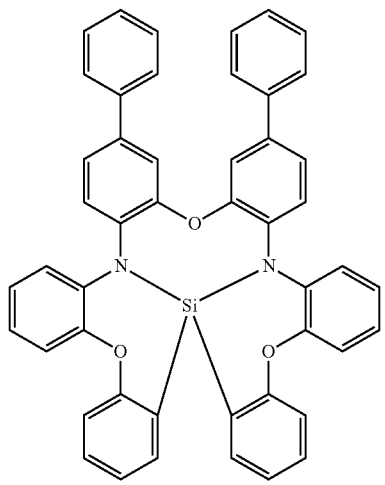
16
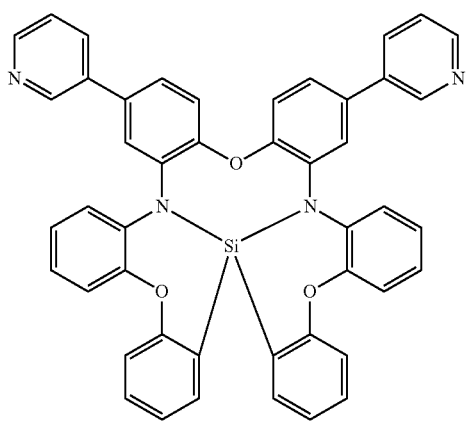
17
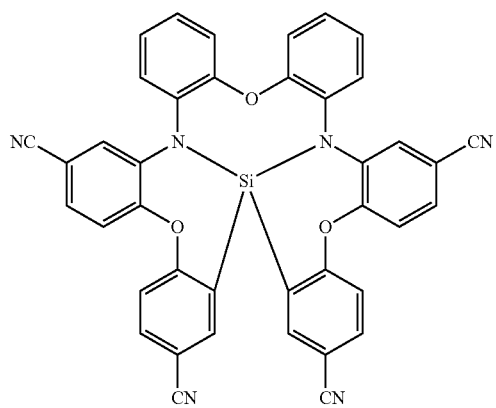

-continued
18
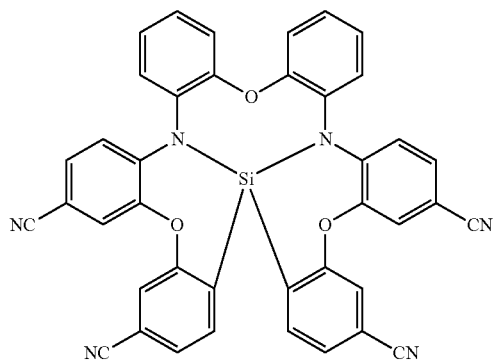
19
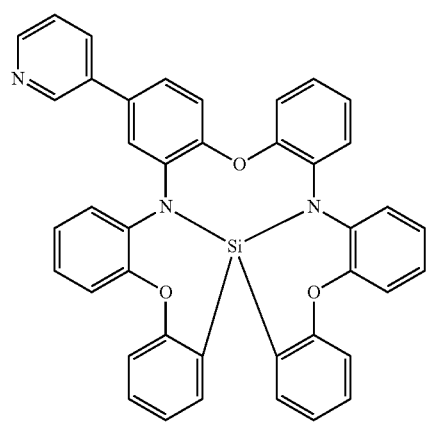
20
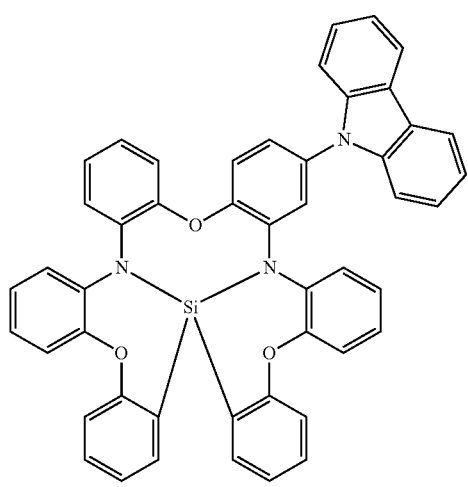
-continued
21
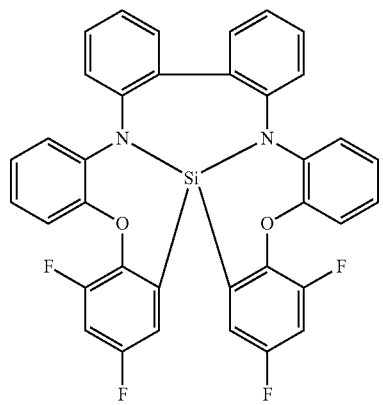
22
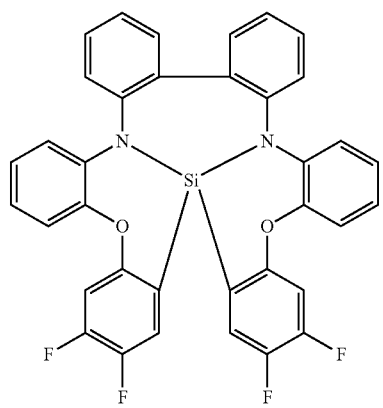
23
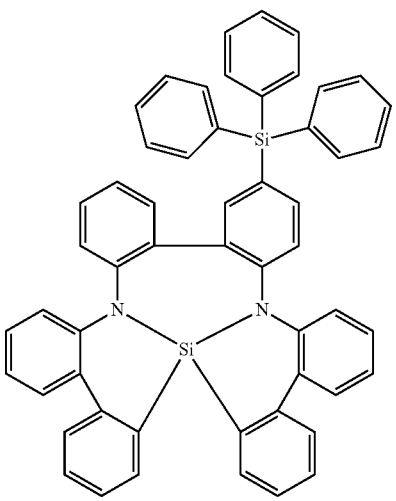

24

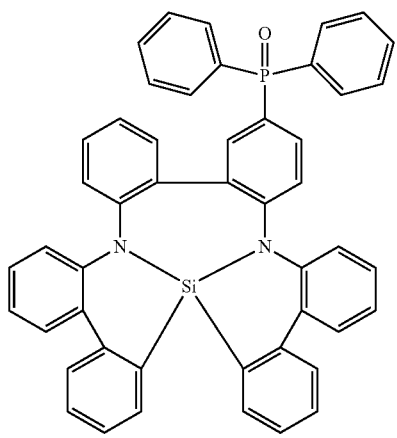

25

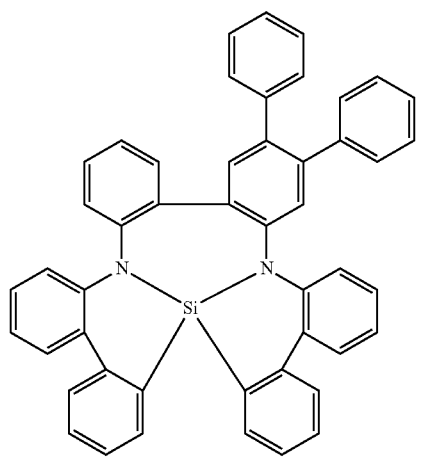

26

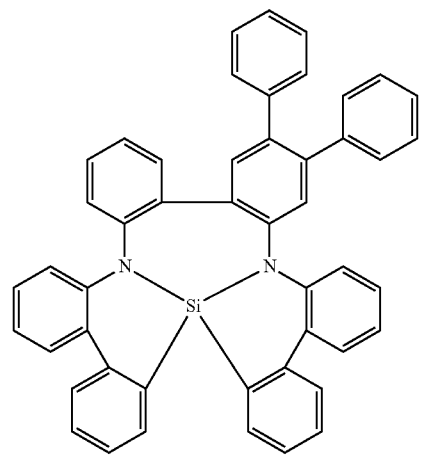

27

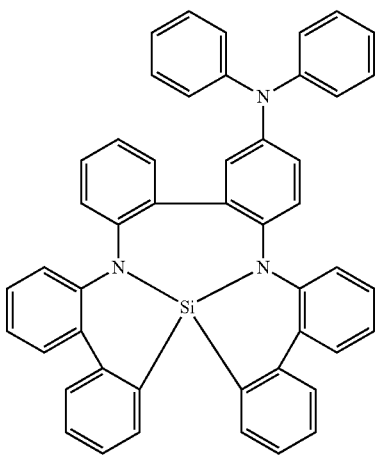

In some embodiments of the present disclosure, the organic electroluminescence device 10 includes a silicon-containing compound represented by Formula 1 and a dopant material represented by Formula 2 below, and may emit blue light. The material represented by Formula 2 may be a thermally activated delayed fluorescence emitting dopant.

Formula 2

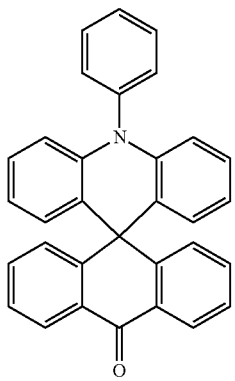

In some embodiments, the organic electroluminescence device 10 having the emission layer EML, emitting delayed fluorescence, includes the presently disclosed silicon-containing compound as a host, and may include the thermally activated delayed fluorescence dopant represented by Formula 2 as a dopant. For example, the dopant for emitting thermally activated delayed fluorescence may have a high triplet energy level (T1), and an absolute value (Est) (i.e., a difference between a singlet energy level (S1) and a triplet energy level (T1)) may be about 0.2 eV or less.

The emission layer EML may include any suitable delayed fluorescence emitting dopant in addition to 10-phenyl-10H,10H'-spiro[acridine-9,9'-anthracene]-10'-one (ACRSA). For example, the emission layer EML may include at least one delayed fluorescence emitting dopant of 3,4,5,6-tetra-9H-carbazol-9-yl-1,2-benzenedicarbonitrile (4CzPN), 2,4,5,6-tetra-9H-carbazo-9-yl-isophthalonitrile (4CzIPN), bis[4-9,9-dimethyl-9,10-dihydroacridine)phenyl] sulfone (DMAC-DPS), or 2-phenoxazine-4,6-diphenyl-1,3,5-triazine (PSZ-TRZ). In addition, the emission layer EML of the organic electroluminescence device 10 may include a dopant of the emission layer EML selected from 9,9'-(sulfonylbis(4,1-phenylene))bis(3,6-di-tert-butyl-9H-carbazole), 10,10'-((4-phenyl-4H-1,2,4-triazole-3,5-diyl)bis(4,1-phenylene))bis(10H-phenoxazine), bis(4-(9H-[3,9'-bicarbazol]-9-yl)phenyl)methanone, 10,10'-(sulfonylbis(4,1-phenylene))bis(9,9-dimethyl-9,10-dihydroacridine), 9'-(4-(4,6-diphenyl-1,3,5-triazin-2-yl)phenyl)-3,3'',6,6''-tetraphenyl-9'H-9,3':6',9''-tercarbazole, 9'-(4-(4,6-diphenyl-1,3,5-triazin-2-yl)phenyl)-9'H-9,3':6',9''-tercarbazole, 9,9'-(5-(4,6-diphenyl-1,3,5-triazin-2-yl)-1,3-phenylene)bis(9H-carbazole), 9,9',9'',9'''-((6-phenyl-1,3,5-triazine-2,4-diyl)bis(benzene-5,3,1-triyl))tetrakis(9H-carbazole), 9,9'-(sulfonylbis(4,1-phenylene))bis(3,6-dimethoxy-9H-carbazole), 9-(4-(4,6-diphenyl-1,3,5-triazin-2-yl)phenyl)-9H-carbazole, 5,9-diphenyl-5,9-dihydro-5,9-diaza-13b-boranaphtho[3,2,1-de]anthracene, 10-(4-(4,6-diphenyl-1,3,5-triazin-2-yl)phenyl)-9,9-dimethyl-9,10-dihydroacridine, 2,6-di(9H-carbazol-9-yl)-4-phenylpyridine-3,5-dicarbonitrile, styryl derivatives (for example, 1,4-bis[2-(3-N-ethylcarbazoryl)vinyl]benzene (BCzVB), 4-(di-p-tolylamino)-4'-[(di-p-tolylamino)styryl]stilbene (DPAVB), and N-(4-((E)-2-(6-((E)-4-(diphenylamino)styryl)naphthalen-2-yl)vinyl)phenyl)-N-phenylbenzenamine (N-BDAVBi), perylene and the derivatives thereof (for example, 2,5,8,11-tetra-t-butylperylene (TBP)), pyrene and the derivatives thereof (for example, 1,1-dipyrene, 1,4-dipyrenylbenzene, and 1,4-bis(N,N-Diphenylamino)pyrene).

In some embodiments of the present disclosure, the emission layer EML may further include any suitable host material. For example, the emission layer EML may further include a host material selected from tris(8-hydroxyquinolino)aluminum (Alq3), 4,4'-bis(N-carbazolyl)-1,1'-biphenyl (CBP), 1,3-bis(N-carbazolyl)benzene (mCP), 3,3'-bis(N-carbazolyl)-1,1'-biphenyl (mCBP), poly(n-vinylcabazole (PVK), 9,10-di(naphthalene-2-yl)anthracene (ADN), 4,4',4''-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), bis[2-(diphenylphosphino)phenyl] ether oxide (DPEPO), hexaphenyl cyclotriphosphazene (CP1), 1,4-bis(triphenylsilyl)benzene (UGH2), hexaphenylcyclotrisiloxane (DPSiO3), octaphenylcyclotetra siloxane (DPSiO4), or 2,8-bis(diphenylphosphoryl)dibenzofuran (PPF).

In some embodiments of the present disclosure, the emission layer EML of the organic electroluminescence device 10 emits blue light. In some embodiments, the emission layer EML of the organic electroluminescence device 10 may emit deep blue light.

In the organic electroluminescence device 10, the electron transport region ETR is provided on the emission layer EML. The electron transport region ETR may include at least one of a hole blocking layer, an electron transport layer ETL, or an electron injection layer EIL. However, embodiments of the present disclosure are not limited thereto.

The electron transport region ETR may include a single layer formed using a single material, a single layer formed using a plurality of different materials, or a multilayer structure having a plurality of layers formed using a plurality of different materials.

For example, the electron transport region ETR may have a single layer structure of the electron injection layer EIL or the electron transport layer ETL, or a single layer structure formed using an electron injection material and an electron transport material. Additionally, the electron transport region ETR may have a single layer structure having a plurality of different materials, or the ETR may have a structure laminated on the emission layer EML having an electron transport layer ETL/electron injection layer EIL, or a hole blocking layer/electron transport layer ETL/electron injection layer EIL, without limitation. The thickness of the electron transport region ETR may be, for example, from about 100 Å to about 1,500 Å.

In some embodiments of the present disclosure, the electron transport region ETR of the organic electroluminescence device 10 may be formed using any suitable method. Examples of suitable methods for forming the include a vacuum deposition method, a spin coating method, a cast method, a Langmuir-Blodgett (LB) method, an inkjet printing method, a laser printing method, and a laser induced thermal imaging (LITI) method.

In some embodiments of the present disclosure, if the electron transport region ETR includes the electron transport layer ETL, then the electron transport region ETR may include, for example, tris(8-hydroxyquinolinato)aluminum (Alq3), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate (Bebq2), 9,10-di(naphthalene-2-yl) anthracene (ADN), or a mixture thereof. However, embodiments of the present disclosure are not limited thereto.

In some embodiments of the present disclosure, if the electron transport region ETR includes the electron transport layer ETL, then the thickness of the electron transport layer ETL may be from about 100 Å to about 1,000 Å. In other embodiments, the thickness of the ETL is from about 150 Å to about 500 Å. If the thickness of the electron transport layer ETL satisfies the above-described range, satisfactory electron transport properties may be obtained without a substantial increase of the driving voltage.

In some embodiments of the present disclosure, if the electron transport region ETR includes the electron injection layer EIL, then the electron transport region ETR may include, for example, LiF, lithium quinolate (LiQ), $Li_2O$, BaO, NaCl, CsF, a metal in lanthanoides such as Yb, or a metal halide such as RbCl, RbI and KI. However, embodiments of the present disclosure are not limited thereto.

In some embodiments, the electron injection layer EIL may be formed using a mixture material of an electron transport material and an insulating organo metal salt. The organo metal salt may be a material having an energy band gap of about 4 eV or more. In particular, the organo metal salt may include, for example, metal acetates, metal benzoates, metal acetoacetates, metal acetylacetonates, or metal stearates.

In some embodiments of the present disclosure, if the electron transport region ETR includes the electron injection layer EIL, the thickness of the electron injection layer EIL may be from about 1 Å to about 100 Å. In other embodiments, the thickness of the EIL is from about 3 Å to about 90 Å. If the thickness of the electron injection layer EIL satisfies the above described range, satisfactory electron injection properties may be obtained without inducing a substantial increase of the driving voltage.

The electron transport region ETR may include a hole blocking layer, as described herein. For example, the hole blocking layer may include at least one of 2,9-dimethyl-4,7-diphenyl-1,10-phenanthroline (BCP), or 4,7-diphenyl-1,10-phenanthroline (Bphen). However, embodiments of the present disclosure are not limited thereto.

In some embodiments of the present disclosure, the second electrode EL2 is provided on the electron transport region ETR. The second electrode EL2 has conductivity. The second electrode EL2 may be formed using a metal alloy or a conductive compound. The second electrode EL2 may be a cathode. The second electrode EL2 may be a transmissive electrode, a transflective electrode or a reflective electrode. In some embodiments, if the second electrode EL2 is the transmissive electrode, the second electrode EL2 may include a transparent metal oxide, for example, ITO, IZO, ZnO, and/or ITZO.

If the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). The second electrode EL2 may have a multilayered structure including a reflective layer or a transflective layer formed using the above-described materials and a transparent conductive layer formed using ITO, IZO, ZnO, and/or ITZO.

In some embodiments of the present disclosure, the second electrode EL2 may be connected with an auxiliary electrode. If the second electrode EL2 is connected with the auxiliary electrode, the resistance of the second electrode EL2 may be comparatively decreased.

In the organic electroluminescence device 10 of the present disclosure, upon application of a voltage to each of the first electrode EL1 and second electrode EL2, holes injected from the first electrode EL1 may move via the hole transport region HTR to the emission layer EML, and electrons injected from the second electrode EL2 may move via the electron transport region ETR to the emission layer EML. Accordingly, the electrons and the holes are recombined in the emission layer EML to produce excitons, and the excitons may emit light via transition from an excited state to a ground state.

In some embodiments of the present disclosure, if the organic electroluminescence device 10 is a top emission type, the first electrode EL1 may be a reflective electrode and the second electrode EL2 may be a transmissive electrode or a transflective electrode. Alternatively, if the organic electroluminescence device 10 is a bottom emission type, the first electrode EL1 may be a transmissive electrode or a transflective electrode and the second electrode EL2 may be a reflective electrode.

In other embodiments of the present disclosure, the silicon-containing compound as disclosed herein may be included in the hole transport region. The organic electroluminescence device 10 as shown in FIG. 1 and FIG. 2 may include a first electrode EL1, a hole transport region HTR, an emission layer EML, an electron transport region ETR, and a second electrode EL2 laminated in layers one by one, and the hole transport region HTR may include the silicon-containing compound as disclosed herein.

An organic electroluminescence device 10 including the silicon-containing compound in the hole transport region HTR has been described according to embodiments of the present disclosure and is relevant to and may be applied to the first electrode EL1, the second electrode EL2, and the electron transport region ETR.

In some embodiments of the present disclosure, the hole transport region HTR of the organic electroluminescence device 10 is provided on the first electrode EL1. The hole transport region HTR may include at least one of a hole injection layer HIL, a hole transport layer HTL, a hole buffer layer, or an electron blocking layer.

The hole transport region HTR may have a single layer formed using a single material, a single layer formed using a plurality of different materials, or a multilayer structure including a plurality of layers formed using a plurality of different materials.

For example, the hole transport region HTR may have the structure of a single layer such as a hole injection layer HIL, or a hole transport layer HTL, and may have a structure of a single layer formed using a hole injection material and a hole transport material. Alternatively, the hole transport region HTR may have a structure of a single layer formed using a plurality of different materials, or a structure laminated from the first electrode EL1 of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/ electron blocking layer, without limitation.

The hole transport region HTR may be formed using any suitable method. Examples of suitable methods include such as a vacuum deposition method, a spin coating method, a cast method, a Langmuir-Blodgett (LB) method, an inkjet printing method, a laser printing method, and a laser induced thermal imaging (LITI) method.

An organic electroluminescence device 10 according to embodiments of the present disclosure may include the silicon-containing compound represented by Formula 1 in a hole transport region HTR. For example, an organic electroluminescence device 10 may include a silicon-containing compound represented by the following Formula 1 in a hole transport layer HTL:

Formula 1

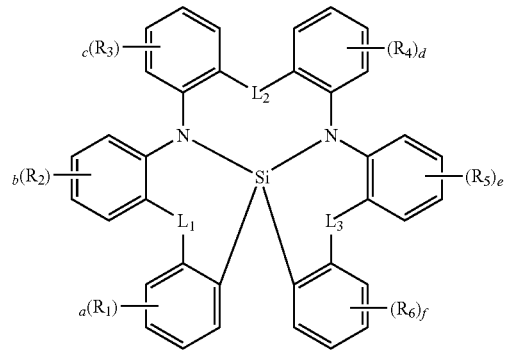

In Formula 1, $L_1$, $L_2$ and $L_3$ may each independently be a direct linkage, O, or S, $R_1$ to $R_6$ may each independently be a hydrogen atom, a deuterium atom, a halogen atom, a cyano group, a substituted or unsubstituted amine group, a substituted or unsubstituted silyl group, a substituted or unsubstituted phosphine group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, and "a" to "f" may each independently be an integer of 0 to 4.

For a silicon-containing compound represented by Formula 1 and used in the organic electroluminescence device 10, $L_1$ to $L_3$, $R_1$ to $R_6$, and "a" to "f" are as defined herein.

Alternatively, in the organic electroluminescence device 10, the hole transport region HTR may include a silicon-containing compound represented by any one of the following Formula 1-1 to Formula 1-3:

Formula 1-1

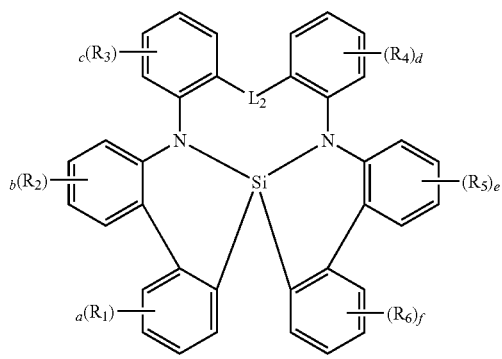

Formula 1-2

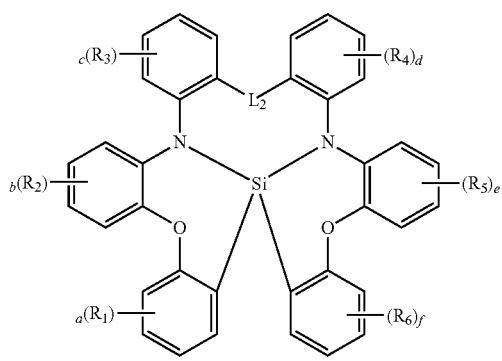

Formula 1-3

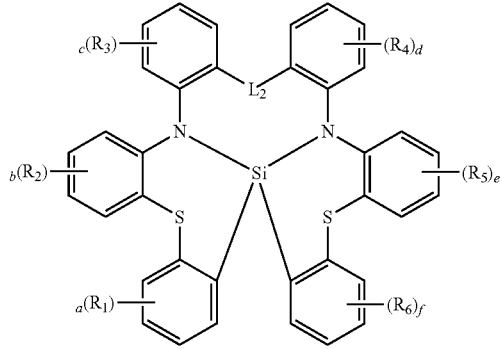

In Formula 1-1 to Formula 1-3, $L_2$, $R_1$ to $R_6$, and "a" to "f" are as defined for Formula 1.

The organic electroluminescence device 10 may include the silicon-containing compound represented by Formula 1 in a hole transport region HTR. For example, the organic electroluminescence device 10 may include any one of the compounds (e.g., one of Compounds 1-27) represented in the following Compound Group 1 in a hole transport layer HTL.

Compound Group 1

1

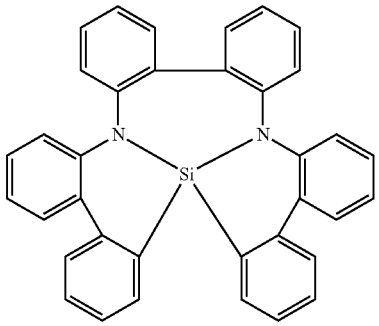

2

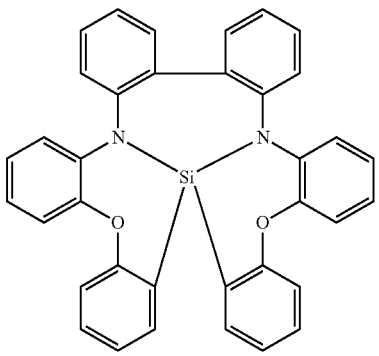

3

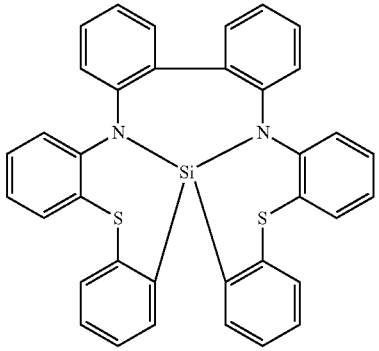

4

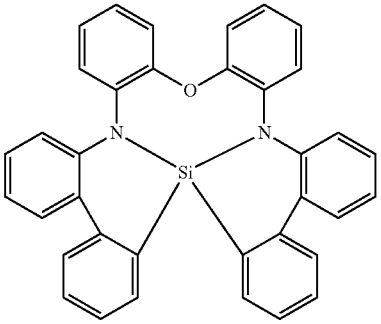

5
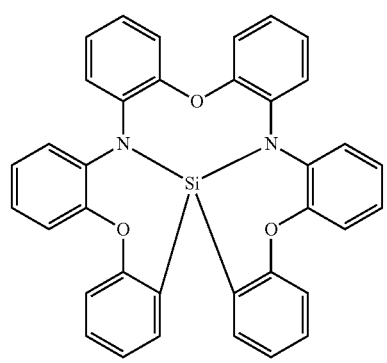
6
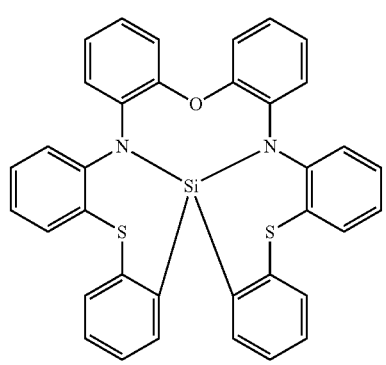
7
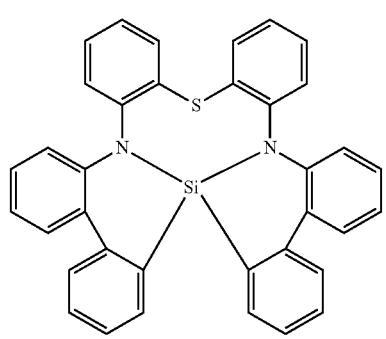
8
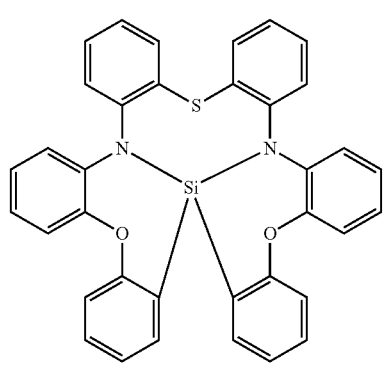
9
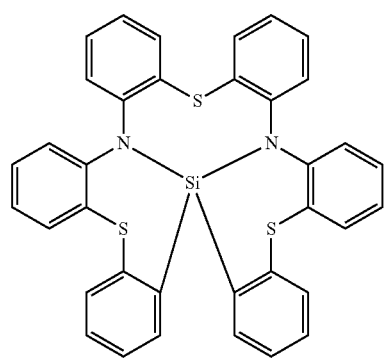
10
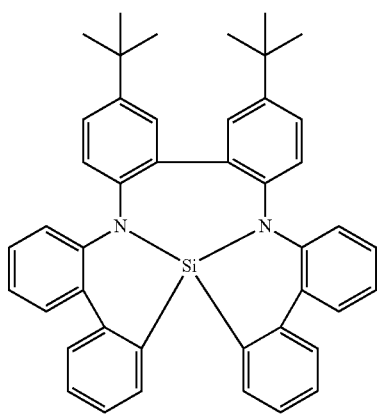
11
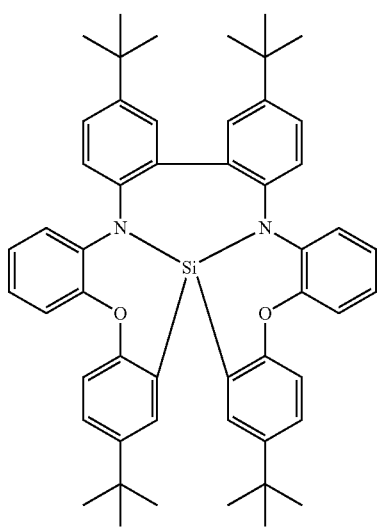

57
-continued
12
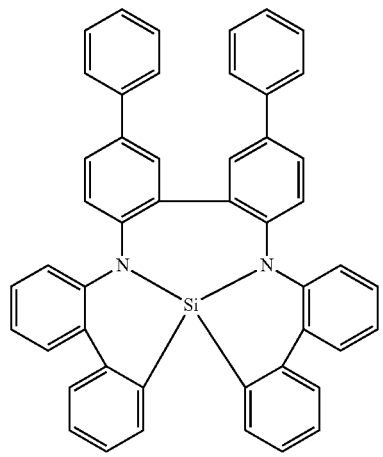
13
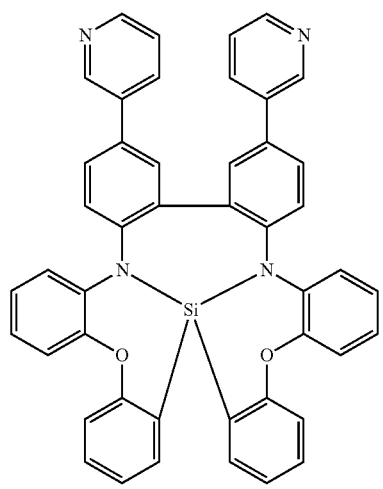
14
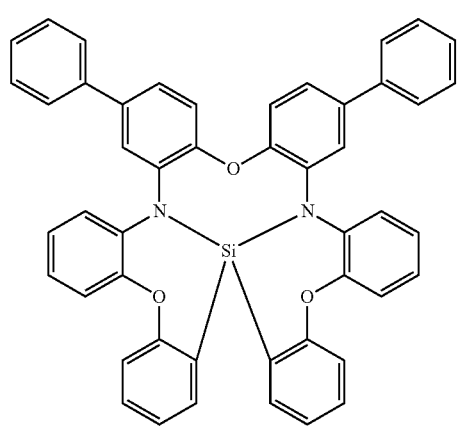
58
-continued
15
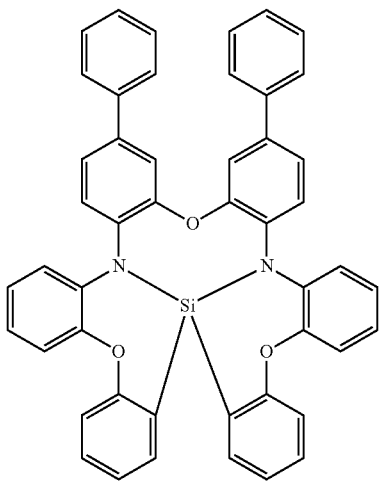
16
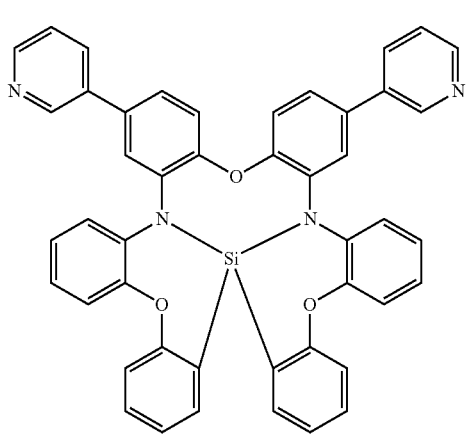
17
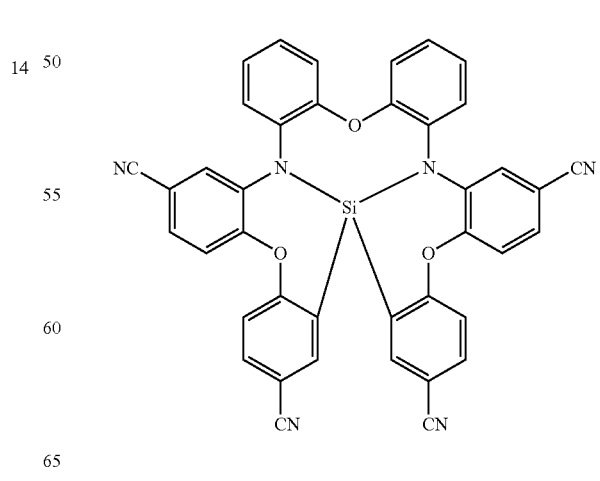

18
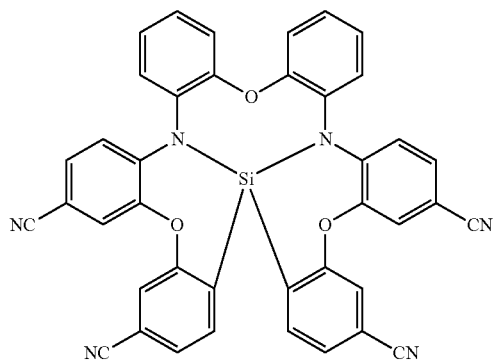
19
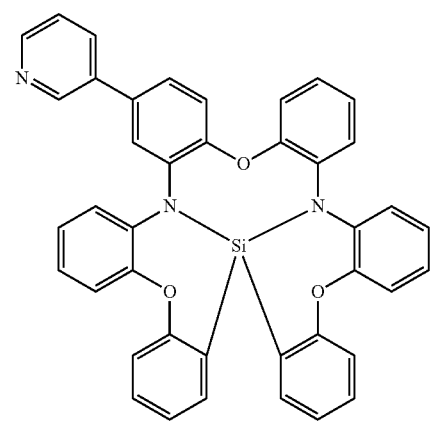
20
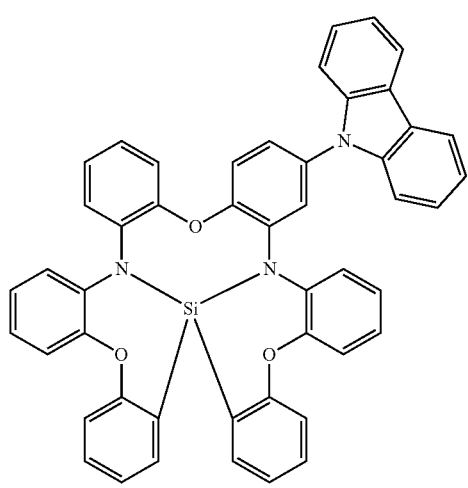
21
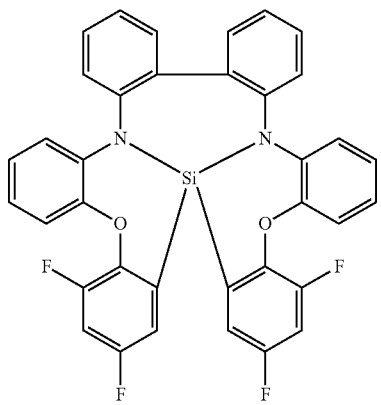
22
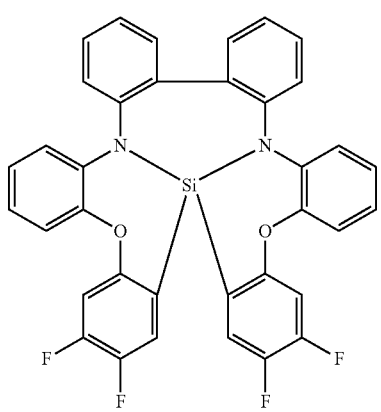
23
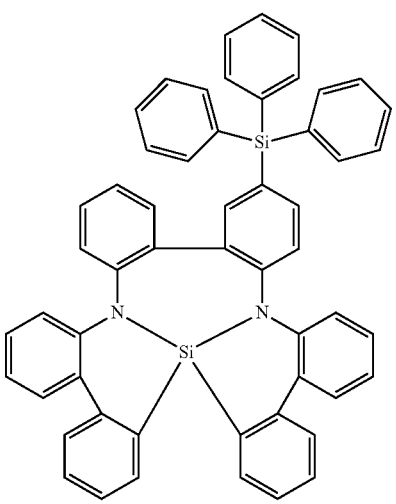

24

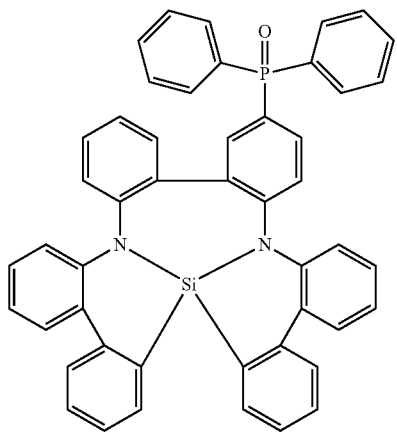

27

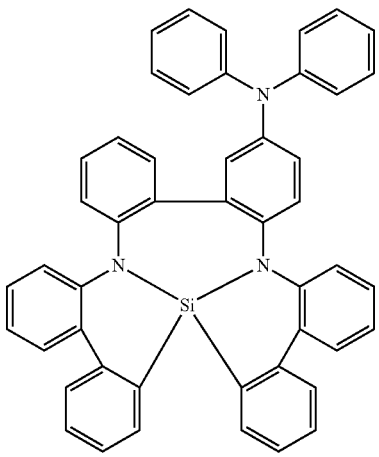

Accordingly, in some embodiments of the present disclosure, the organic electroluminescence device 10 may include the silicon-containing compound as disclosed herein in a hole transport region HTR or in a hole transport layer HTL, in the hole transport region HTR.

In some embodiments of the present disclosure, if the hole transport region HTR includes a hole transport layer HTL and a hole injection layer HIL, the hole injection layer HIL may include any suitable hole injection material. For example, the hole transport layer HTL may include the silicon-containing compound represented by Formula 1, and the hole injection layer HIL may include a any suitable hole injection material. For example, the hole injection layer HIL may include triphenylamine-containing polyetherketone (TPAPEK), 4-isopropyl-4'-methyldiphenyliodoniumtetrakis(pentafluorophenyl)borate (PPBI), N,N'-diphenyl-N,N'-bis-[4-(phenyl-m-tolyl-amino)-phenyl]-phenyl-4,4'-diamine (DNTPD), a phthalocyanine compound such as copper phthalocyanine, 4,4',4''-tris(3-methylphenylphenylamino)triphenylamine (m-MTDATA), N,N'-di(1-naphthyl)-N,N'-diphenyl-benzidine (NPB), 4,4',4''-tris(N,N-diphenylamino)triphenylamine (TDATA), 4,4',4''-tris(N,N-2-naphthyphenylamino)triphenylamine (2-TNATA), polyaniline/docecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), or polyaniline/poly(4-styrenesulfonate) (PANI/PSS). However embodiments of the present disclosure are not limited thereto.

25

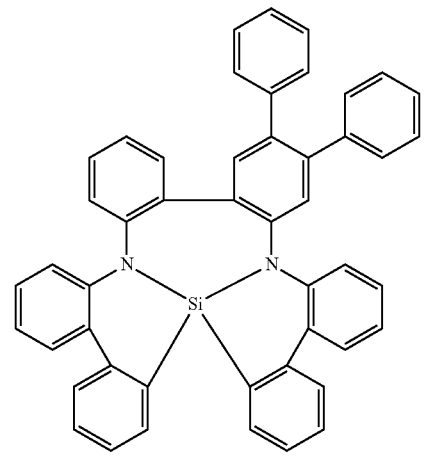

26

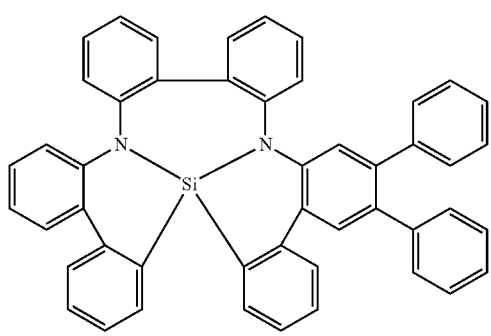

The hole transport layer HTL of the organic electroluminescence device 10 may include any suitable hole transport material. For example, the hole transport layer HTL may include 1,1-bis[(di-4-tolyamino)phenyl]cyclohexane (TAPC), carbazole derivatives such as N-phenyl carbazole and polyvinyl carbazole, N,N'-bis(3-methylphenyl)-N,N'-diphenyl-[1,1-biphenyl]-4,4'-diamine (TPD), 4,4',4''-tris(N-carbazolyl)triphenylamine (TCTA), N,N'-di(1-naphtyl)-N,N'-diphenylbenzidine (NPB). However embodiments of the present disclosure are not limited thereto In some embodiments of the present disclosure, the thickness of the hole transport region HTR may be from about 100 Å to about 10,000 Å. In other embodiments, the thickness of the HTR is from about 100 Å to about 1,000 Å. If, for example, the hole transport region HTR includes both the hole injection layer HIL and the hole transport layer HTL, the thickness of the hole injection layer HIL may be, for example, from about 100 Å to about 1000 Å, and the thickness of the hole transport layer HTL may be from about 30 Å to about 1,000 Å. Accordingly, if an organic electroluminescence device made according to embodiments of the present disclosure includes the thicknesses of the hole transport region HTR, the hole injection layer HIL, and the hole transport layer HTL within the ranges described in this disclosure, satisfactory hole transport properties may be obtained without a substantial increase of the driving voltage of the organic electroluminescence device.

The hole transport region HTR in the organic electroluminescence device 10 may further include a charge generating material in addition to the above-described materials to improve conductivity. The charge generating material may be dispersed uniformly or non-uniformly in the hole transport region HTR. The charge generating material may be, for example, a p-dopant. The p-dopant may be one of quinone derivatives, metal oxides, or cyano group-containing compounds, without limitation. Non-limiting examples of the p-dopant include quinone derivatives such as tetracyanoquinodimethane (TCNQ) and 2,3,5,6-tetrafluoro-7,7,8,8-tetracyanoquinodimethane (F4-TCNQ), metal oxides such as tungsten oxide, and molybdenum oxide.

As disclosed above, the hole transport region HTR of organic electroluminescence device 10 may further include at least one of a hole buffer layer or an electron blocking layer in addition to the hole injection layer HIL and the hole transport layer HTL. The hole buffer layer may compensate an optical resonance distance according to the wavelength of light emitted from the emission layer EML and increase light emission efficiency. Materials suitable for or included in the hole transport region HTR are suitable for and may be used as materials in the hole buffer layer.

The hole transport region HTR of organic electroluminescence device 10 may further include an electron blocking layer, and the electron blocking layer may be disposed between the hole transport layer HTL and the emission layer EML. The electron blocking layer may be a layer playing the role of blocking or preventing the electron injection from the electron transport region ETR to the hole transport region HTR. The electron blocking layer may use a suitable material for an electron blocking layer. For example, the electron blocking layer may include 1,3-bis(N-carbazolyl)benzene (mCP). However, embodiments of the present disclosure are not limited thereto.

The emission layer EML may be provided on the hole transport region HTR of organic electroluminescence device 10. In some embodiments of the present disclosure, the thickness of the emission layer EML may be from about 100 Å to about 300 Å. The emission layer EML may have a single layer formed using a single material, a single layer formed using a plurality of different materials, or the EML may be a multilayer structure having a plurality of layers formed using a plurality of different materials.

The emission layer EML of organic electroluminescence device 10 may emit one of red light, green light, blue light, white light, yellow light, or cyan light. The emission layer EML may include a phosphorescence emitting material or a fluorescence emitting material. In the organic electroluminescence device 10, the emission layer EML may include a host and a dopant. In some embodiments of the present disclosure, the emission layer EML may have a thickness of about 100 Å to about 600 Å.

In the organic electroluminescence device 10, the emission layer EML may be a fluorescence emission layer. For example, a portion of lights emitted from the emission layer EML may be due to thermally activated delayed fluorescence. In particular, the emission layer EML of the organic electroluminescence device 10 may include a light-emitting component which emits thermally activated delayed fluorescence, and the emission layer EML of the organic electroluminescence device 10 of an embodiment may be a blue emitting emission layer which emits thermally activated delayed fluorescence.

In some embodiments of the present disclosure, the emission layer EML may further include a suitable host material. For example, the emission layer EML may further include as a host material, tris(8-hydroxyquinolino)aluminum (Alq3), 4,4'-bis(N-carbazolyl)-1,1'-biphenyl (CBP), 1,3-bis(N-carbazolyl)benzene (mCP), 3,3'-bis(N-carbazolyl)-1,1'-biphenyl (mCBP), poly(n-vinylcabazole (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), bis[2-(diphenylphosphino)phenyl] ether oxide (DPEPO), hexaphenyl cyclotriphosphazene (CP1), 1,4-bis(triphenylsilyl)benzene (UGH2), hexaphenylcyclotrisiloxane (DPSiO3), octaphenylcyclotetra siloxane (DPSiO4), and 2,8-bis(diphenylphosphoryl)dibenzofuran (PPF).

The emission layer EML may include a suitable delayed fluorescence emitting dopant in addition to 10-phenyl-10H,10H'-spiro[acridine-9,9'-anthracene]-10'-one (ACRSA) represented by Formula 2. For example, in addition to ACRSA, the emission layer EML may include at least one delayed fluorescence emitting dopant selected from 3,4,5,6-tetra-9H-carbazol-9-yl-1,2-benzenedicarbonitrile(4CzPN), 2,4,5,6-tetra-9H-carbazol-9-yl-isophthalonitrile(4CzIPN), bis[4-9,9-dimethyl-9,10-dihydroacridine)phenyl]sulfone(DMAC-DPS), and 2-phenoxazine-4,6-diphenyl-1,3,5-triazine (PSZ-TRZ). In addition, the emission layer EML of the organic electroluminescence device 10 may include a dopant of the emission layer EML selected from 9,9'-(sulfonylbis(4,1-phenylene))bis(3,6-di-tert-butyl-9H-carbazole), 10,10'-((4-phenyl-4H-1,2,4-triazole-3,5-diyl)bis(4,1-phenylene))bis(10H-phenoxazine), bis(4-(9H-[3,9'-bicarbazol]-9-yl)phenyl)methanone, 10,10'-(sulfonylbis(4,1-phenylene))bis(9,9-dimethyl-9,10-dihydroacridine), 9'-(4-(4,6-diphenyl-1,3,5-triazin-2-yl)phenyl)-3,3'',6,6''-tetraphenyl-9'H-9,3':6',9'''-tercarbazole, 9'-(4-(4,6-diphenyl-1,3,5-triazin-2-yl)phenyl)-9'H-9,3':6',9'''-tercarbazole, 9,9'-(5-(4,6-diphenyl-1,3,5-triazin-2-yl)-1,3-phenylene)bis(9H-carbazole), 9,9',9'',9'''-((6-phenyl-1,3,5-triazine-2,4-diyl)bis(benzene-5,3,1-triyl))tetrakis(9H-carbazole), 9,9'-(sulfonylbis(4,1-phenylene))bis(3,6-dimethoxy-9H-carbazole), 9-(4-(4,6-diphenyl-1,3,5-triazin-2-yl)phenyl)-9H-carbazole, 5,9-diphenyl-5,9-dihydro-5,9-diaza-13b-boranaphtho[3,2,1-de]anthracene, 10-(4-(4,6-diphenyl-1,3,5-triazin-2-yl)phenyl)-9,9-dimethyl-9,10-dihydroacridine, 2,6-di(9H-carbazol-9-yl)-4-phenylpyridine-3,5-dicarbonitrile, styryl derivatives (for example, 1,4-bis[2-(3-N-ethylcarbazoryl)vinyl]benzene (BCzVB), 4-(di-p-tolylamino)-4'-[(di-p-tolylamino)styryl] stilbene (DPAVB), and N-(4-((E)-2-(6-((E)-4-(diphenylamino)styryl)naphthalen-2-yl)vinyl)phenyl)-N-phenyl-benzenamine (N-BDAVBi), perylene and the derivatives thereof (for example, 2,5,8,11-tetra-t-butylperylene (TBP)), pyrene and the derivatives thereof (for example, 1,1-dipyrene, 1,4-dipyrenylbenzene, and 1,4-bis(N,N-Diphenylamino)pyrene).

According to embodiments of the present disclosure, the organic electroluminescence device 10 achieves improved emission efficiency as a result of the hole transport region HTR having at least one of the disclosed silicon-containing compounds, and the emission layer EML having a material emitting thermally activated delayed fluorescence.

An organic electroluminescence device 10 having at least one of the disclosed silicon-containing compounds operates with improved emission efficiency. For example, an organic electroluminescence device 10 having at least one of the disclosed silicon-containing compounds in an emission layer as a host material or in a hole transport region, achieves improved emission efficiency.

Hereinafter, examples of the silicon-containing compounds as disclosed herein and an organic electroluminescence device including the silicon-containing compound according to embodiments of the present disclosure are described with reference to embodiments and comparative embodiments. The following embodiments are only illustrations to assist the understanding of the embodiments, and the scope of the embodiments is not limited thereto.

EXAMPLES

Example 1. Synthesis of Silicon-Containing Compounds

In accordance with embodiments of the present disclosure, a synthetic method of silicon-containing compounds is described with reference to synthetic methods for Compound 1, Compound 2, Compound 5, Compound 8, Compound 11 and Compound 12. In addition, the following synthetic methods of the silicon-containing compounds are for illustration, and the synthetic method of the silicon-containing compounds is not limited to the following examples.

Synthesis of Compound 1

Compound 1 is a silicon-containing compound and may be synthesized, for example, by Reaction 1 as follows.

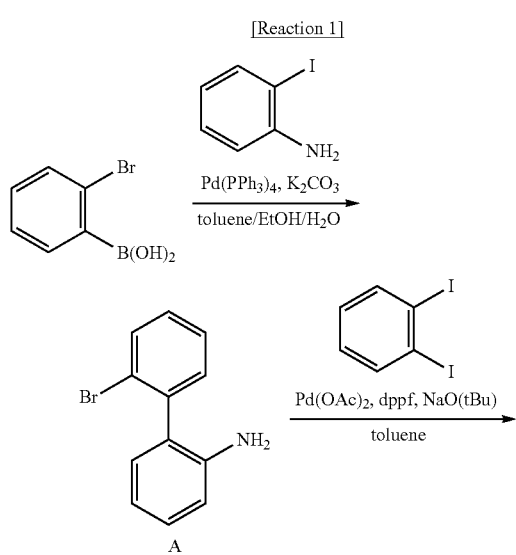

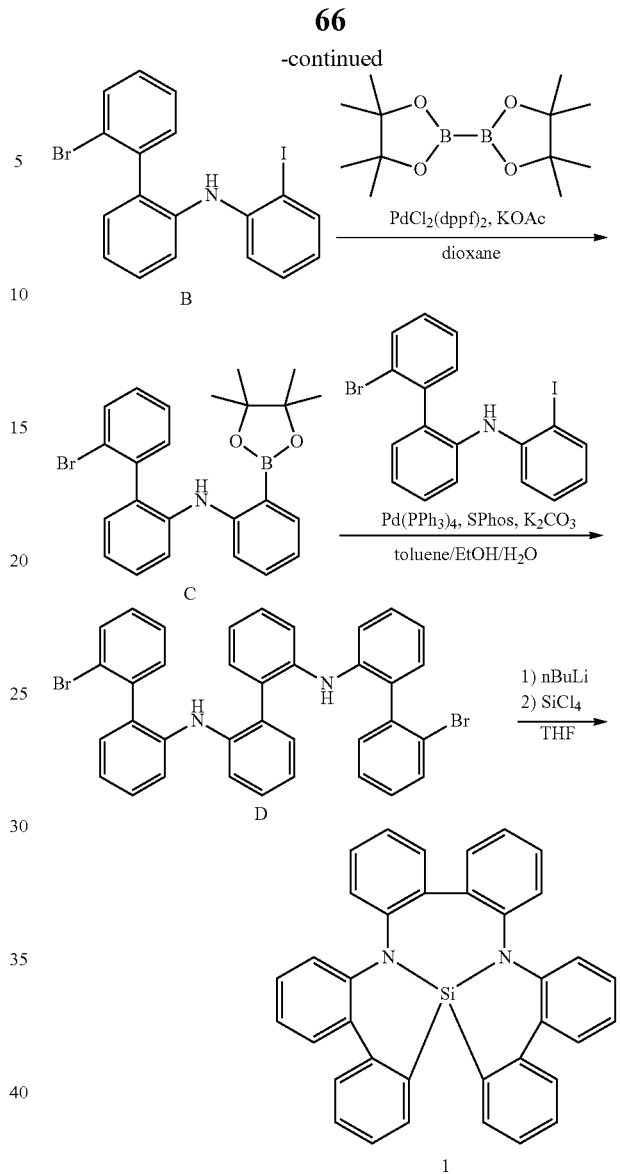

Under an argon (Ar) atmosphere, in a 500 ml three-neck flask, 5.00 g of 2-bromophenylboronic acid, 5.45 g of 2-iodoaniline, 1.44 g of tetrakis(triphenylphosphine)palladium(0), and 6.90 g of potassium carbonate were dissolved in 170 ml of a mixture solvent of toluene, ethanol (EtOH) and water (toluene:ethanol:water=10:2:1), followed by stirring at about 80° C. for about 8 hours.

After cooling in the air, water was added and extraction with toluene was performed. Organic layers were collected and dried with magnesium sulfate (MgSO$_4$). After that, solvents were distilled and removed under pressurization conditions. The crude product thus obtained was separated by silica gel column chromatography to obtain 5.25 g (yield 85%) of Intermediate A. The molecular weight of Intermediate A measured by FAB-MS was 248.

Under an argon atmosphere, in a 500 ml three-neck flask, 5.00 g of Intermediate A, 6.64 g of 1,2-diiodobenzene, 0.23 g of palladium(II) acetate, 1.12 g of bis(diphenylphosphino) ferrocene, and 1.94 g of sodium tert-butoxide were dissolved in 100 ml of anhydrous toluene, followed by stirring at about 80° C. for about 4 hours. After cooling in the air, water was added and extraction with dichloromethane (CH$_2$Cl$_2$) was performed. Organic layers were collected and dried with magnesium sulfate (MgSO$_4$). After that, solvents were distilled and removed under pressurization conditions. The crude product thus obtained was separated by silica gel column chromatography to obtain 7.26 g (yield 80%) of Intermediate B. The molecular weight of Intermediate B measured by FAB-MS was 450.

Under an argon atmosphere, in a 300 ml three-neck flask, 5.00 g of Intermediate B, 2.82 g of bis(pinacolato)diboron, 0.90 g of [1,1'-bis(diphenylphosphino)ferrocene]dichloropalladium(II) dichloromethane adduct, and 2.18 g of potassium acetate were dissolved in 70 ml of anhydrous 1,4-dioxane, followed by stirring at about 90° C. for about 6 hours. After cooling in the air, water was added and extraction with dichloromethane (CH$_2$Cl$_2$) was performed. After drying with magnesium sulfate (MgSO$_4$), solvents were distilled and removed under pressurization conditions. The crude product thus obtained was separated by silica gel column chromatography to obtain 3.50 g (yield 70%) of Intermediate C. The molecular weight of Intermediate C measured by FAB-MS was 450.

Under an argon atmosphere, in a 200 ml three-neck flask, 3.00 g of Intermediate B, 3.00 g of Intermediate C, 0.38 g of tetrakis(triphenylphosphine)palladium(0), 1.84 g of potassium carbonate, and 0.55 g of 2-dicyclohexylphosphino-2',6'-dimethoxybiphenyl (SPhos) were dissolved in 50 ml of a mixture solvent of toluene, ethanol and water (toluene:ethanol:water=10:2:1), followed by stirring at about 80° C. for about 8 hours. After cooling in the air, water was added and extraction with toluene was performed. Organic layers were collected and dried with magnesium sulfate (MgSO$_4$). After that, solvents were distilled and removed under pressurization conditions. The crude product thus obtained was separated by silica gel column chromatography to obtain 3.27 g (yield 76%) of Intermediate D. The molecular weight of Intermediate D measured by FAB-MS was 646.

Under an argon atmosphere, in a 500 ml, three-neck flask, 3.00 g of Intermediate D was dissolved in 100 ml of anhydrous tetrahydrofuran (THF), and 11.6 ml of n-BuLi (1.6 M concentration in hexane) was dropwisely added thereto at about −78° C. After stirring at about −78° C. for about 1 hour, 0.53 ml of tetrachlorosilane was added dropwisely and stirred for about 16 hours while recovering the temperature to room temperature. Water was added and extraction of a mixture with dichloromethane (CH$_2$Cl$_2$) was performed. Organic layers were collected and dried with magnesium sulfate (MgSO$_4$). After that, solvents were distilled and removed under pressurization conditions. The crude product thus obtained was separated by silica gel column chromatography to obtain 0.83 g (yield 35%) of Compound 1. The molecular weight of Compound 1 measured by FAB-MS was 512.

Synthesis of Compound 2

Compound 2 is a silicon-containing compound and may be synthesized, for example, by Reaction 2 as follows.

[Reaction 2]

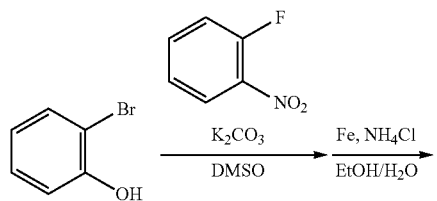

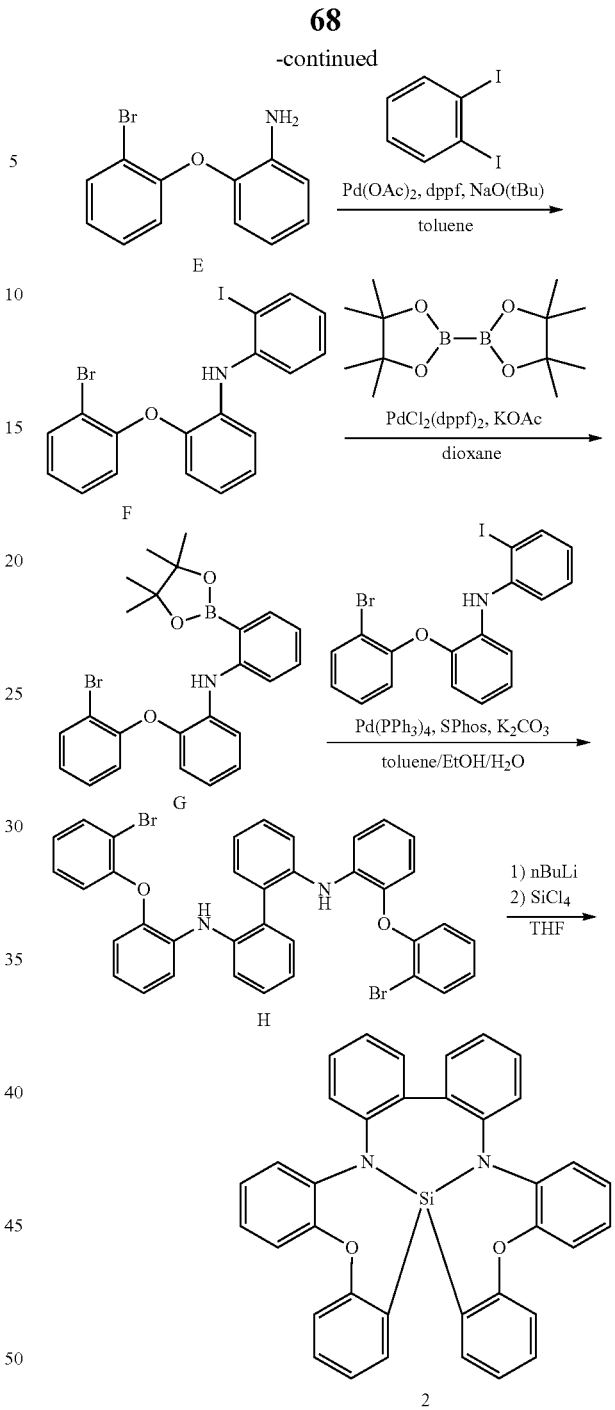

Under an argon atmosphere, in a 500 ml three-neck flask, 10.00 g of 2-bromophnol, 8.16 g of 2-fluoronitrobenzene, and 16.00 g of potassium carbonate were dissolved in 200 ml of anhydrous dimethyl sulfoxide (DMSO), followed by stirring at about 100° C. for about 20 hours. After cooling in the air, water was added and extraction with ethyl acetate (EtOAc) was performed. Organic layers were collected and dried with magnesium sulfate (MgSO$_4$). After that, solvents were distilled and removed under pressurization conditions. To the crude product thus obtained, 50 ml of ethanol (EtOH) and 50 ml of water were added, and 9.68 g of iron (powder) and 9.27 g of ammonium chloride were added, followed by heating and refluxing for about 3 hours. After cooling in the air, the reaction solvents were filtered using Celite, and solvents were distilled and removed under pressurization conditions. Then, water was added and extraction with ethyl acetate (EtOAc) was performed. Organic layers were collected and dried with magnesium sulfate (MgSO$_4$). After that, solvents were distilled and removed under pressurization conditions. The crude product thus obtained was separated by silica gel column chromatography to obtain 12.21 g (yield 80%) of Intermediate E. The molecular weight of Intermediate E measured by FAB-MS was 264.

Intermediate F was obtained in a yield of 74% from Intermediate E by the same method as the synthetic method of Intermediate B. The molecular weight of Intermediate F measured by FAB-MS was 466.

Intermediate G was obtained in a yield of 69% from Intermediate F by the same method as the synthetic method of Intermediate C. The molecular weight of Intermediate G measured by FAB-MS was 466.

Intermediate H was obtained in a yield of 68% from Intermediate F and Intermediate G by the same method as the synthetic method of Intermediate D. The molecular weight of Intermediate H measured by FAB-MS was 678.

Compound 2 was obtained in a yield of 42% from Intermediate H by the same method as the synthetic method of Compound 1. The molecular weight of Compound 2 measured by FAB-MS was 544.

Synthesis of Compound 5

Compound 5 is a silicon-containing compound and may be synthesized, for example, by Reaction 3 as follows.

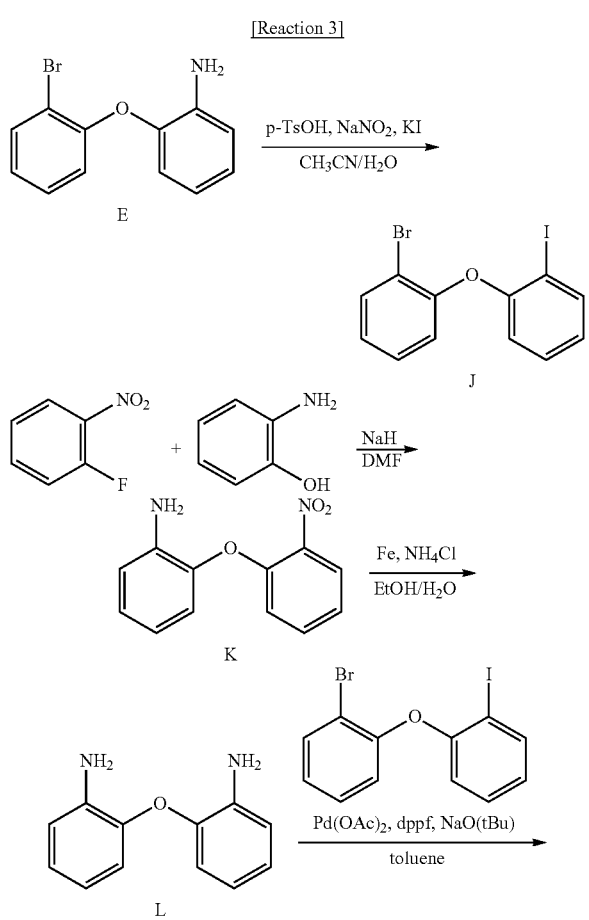

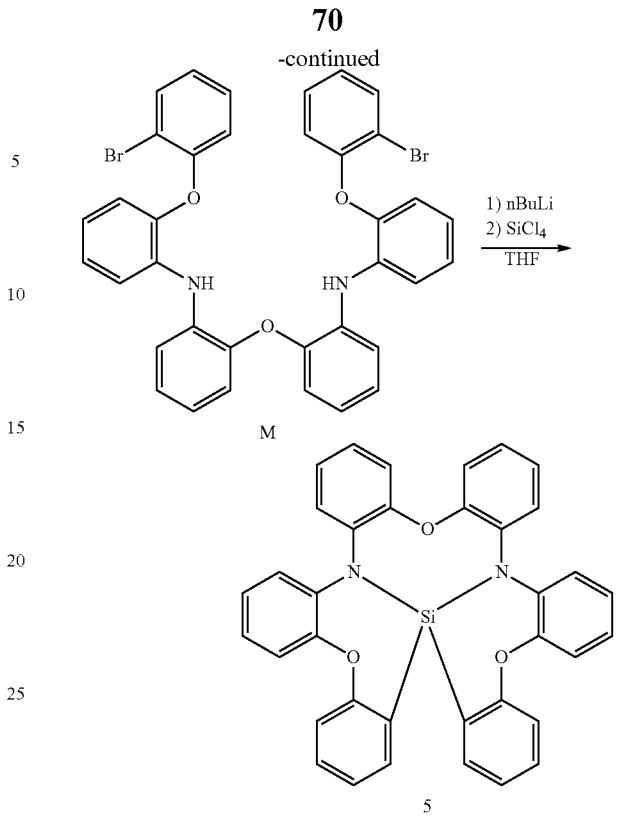

Under an argon atmosphere, in a 500 ml three-neck flask, 5.00 g of Intermediate E was dissolved in 100 ml of acetonitrile, and 10.80 g of p-toluenesulfonic acid monohydrate was added thereto. After cooling to about 0° C., 2.61 g of sodium nitride and 7.86 g of potassium iodide dissolved in 50 ml of water were added thereto dropwisely, followed by stirring at room temperature for about 16 hours. After finishing the reaction, 20 ml of a saturated aqueous sodium bicarbonate solution was added and extraction with ethyl acetate (EtOAc) was performed. Organic layers were collected and then, washed with an aqueous sodium thiosulfate solution and dried with magnesium sulfate (MgSO$_4$). After that, solvents were distilled and removed under pressurization conditions. The crude product thus obtained was separated by silica gel column chromatography to obtain 5.68 g (yield 80%) of Intermediate J. The molecular weight of Intermediate J measured by FAB-MS was 375.

Under an argon atmosphere, in a 200 ml three-neck flask, 5.00 g of 2-fluoronitrobenzene was dissolved in 50 ml of anhydrous dimethylformamide (THF), and then cooled to about 0° C. Then, 3.86 g of 2-aminophenol and 2.83 g of sodium hydride (60% in oil) were added thereto. After stirring at about 0° C. for about 1 hour, the stirring was performed for about 18 hours while slowly recovering the temperature to room temperature. After finishing the reaction, water was added at about 0° C. and extraction was performed with dichloromethane (CH$_2$Cl$_2$). After drying with magnesium sulfate (MgSO$_4$), solvents were distilled and removed under pressurization conditions. The crude product thus obtained was separated by silica gel column chromatography to obtain 7.34 g (yield 90%) of Intermediate K. The molecular weight of Intermediate K measured by FAB-MS was 230.

Under an argon atmosphere, to a 200 ml three-neck flask, 5.00 g of Intermediate K was added, 30 ml of ethanol (EtOH) and 30 ml of water were added, and 3.63 g of iron (powder) and 3.48 g of ammonium chloride were added, followed by heating and refluxing for about 3 hours. After cooling in the air, the reaction solvents were filtered using Celite and solvents were distilled and removed under pressurization conditions. Then, water was added and extraction with ethyl acetate (EtOH) was performed. Organic layers were collected and dried with magnesium sulfate ($MgSO_4$). After that, solvents were distilled and removed under pressurization conditions. The crude product thus obtained was separated by silica gel column chromatography to obtain 4.00 g (yield 92%) of Intermediate L. The molecular weight of Intermediate L measured by FAB-MS was 200.

Under an argon atmosphere, in a 500 ml three-neck flask, 3.00 g of Intermediate L, 11.2 g of Intermediate J, 0.16 g of palladium(II) acetate, 0.83 g of bis(diphenylphosphino)ferrocene, and 2.88 g of sodium tert-butoxide were dissolved in 100 ml of anhydrous toluene, followed by stirring at about 80° C. for about 6 hours. After finishing the reaction, water was added and extraction with dichloromethane ($CH_2Cl_2$) was performed. Organic layers were collected and dried with magnesium sulfate ($MgSO_4$). After that, solvents were distilled and removed under pressurization conditions. The crude product thus obtained was separated by silica gel column chromatography to obtain 3.75 g (yield 36%) of Intermediate M. The molecular weight of Intermediate M measured by FAB-MS was 694.

Compound 5 was obtained in a yield of 36% from Intermediate M by the same method as the synthetic method of Compound 1. The molecular weight of Compound 5 measured by FAB-MS was 560.

Synthesis of Compound 8

Compound 8 is a silicon-containing compound and may be synthesized, for example, by Reaction 4 as follows.

[Reaction 4]

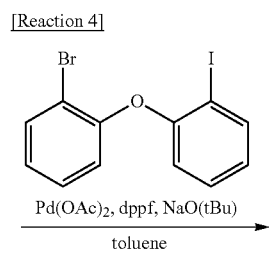

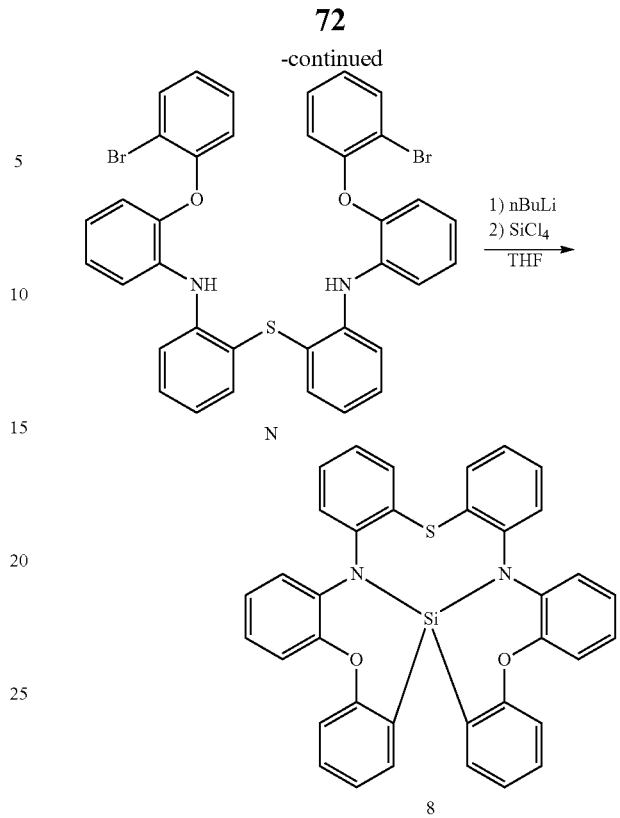

In the synthesis of Compound 5, Intermediate N was obtained in a yield of 39% from bis(2-aminophenyl)sulfide by the same method as the synthetic method of Intermediate M. The molecular weight of Intermediate N measured by FAB-MS was 710.

Compound 8 was obtained in a yield of 35% from Intermediate N by the same method as the synthetic method of Compound 1. The molecular weight of Compound 8 measured by FAB-MS was 576.

Synthesis of Compound 11

Compound 11 which is a silicon-containing compound according to an embodiment may be synthesized, for example, by Reaction 5 as follows.

[Reaction 5]

-continued
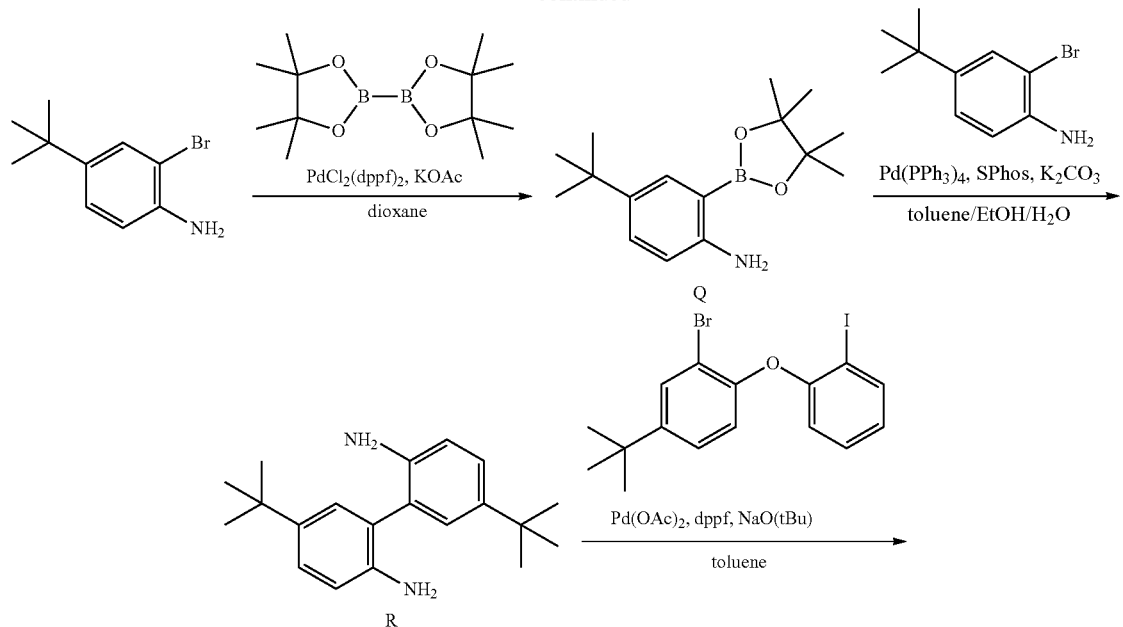
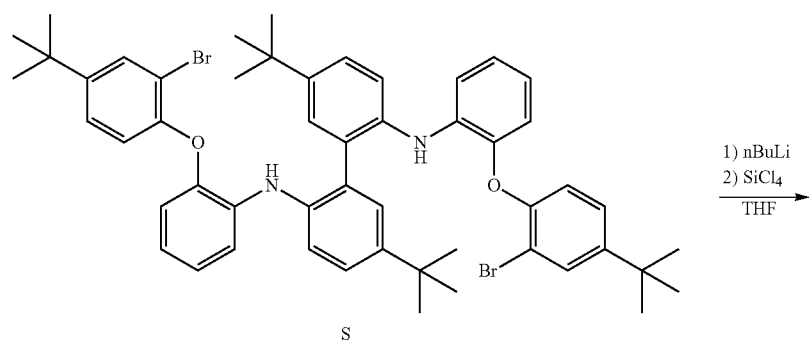
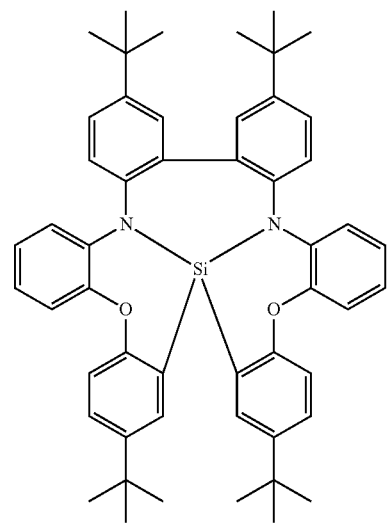

In the synthesis of Compound 2, Intermediate O was obtained in a yield of 82% from 2-bromo-4-tert-butylphenol by the same method as the synthetic method of Intermediate E. The molecular weight of Intermediate O measured by FAB-MS was 320.

In the synthesis of Compound 5, Intermediate P was obtained in a yield of 82% from Intermediate O by the same method as the synthetic method of Intermediate J. The molecular weight of Intermediate P measured by FAB-MS was 431.

In the synthesis of Compound 1, Intermediate Q was obtained in a yield of 65% from 2-bromo-4-tert-butylaniline by the same method as the synthetic method of Intermediate C. The molecular weight of Intermediate Q measured by FAB-MS was 275.

In the synthesis of Compound 1, Intermediate R was obtained in a yield of 62% from 2-bromo-4-tert-butylaniline and Intermediate Q by the same method as the synthetic method of Intermediate D. The molecular weight of Intermediate R measured by FAB-MS was 296.

In the synthesis of Compound 5, Intermediate S was obtained in a yield of 35% from Intermediate R and Intermediate P by the same method as the synthetic method of Intermediate M. The molecular weight of Intermediate S measured by FAB-MS was 902.

Compound 11 was obtained in a yield of 30% from Intermediate S by the same method as the synthetic method of Compound 1. The molecular weight of Compound 11 measured by FAB-MS was 769.

Synthesis of Compound 12

Compound 12 is a silicon-containing compound and may be synthesized, for example, by Reaction 6 as follows.

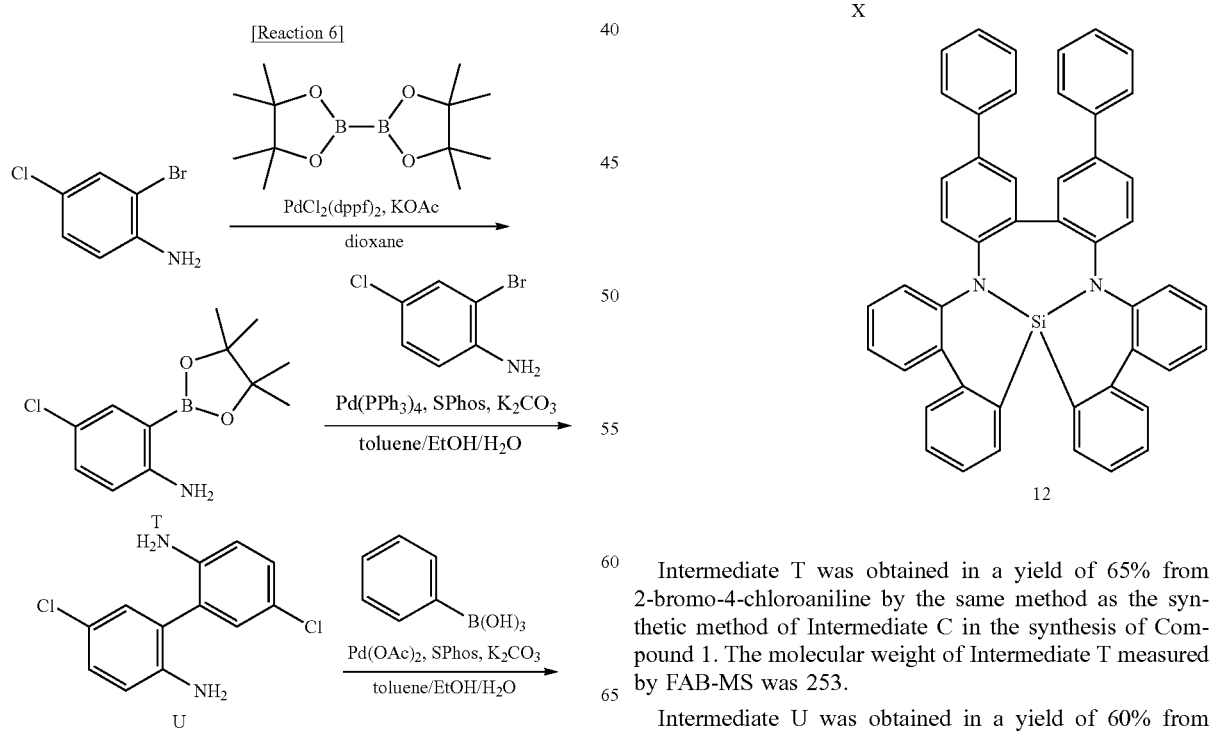

Intermediate T was obtained in a yield of 65% from 2-bromo-4-chloroaniline by the same method as the synthetic method of Intermediate C in the synthesis of Compound 1. The molecular weight of Intermediate T measured by FAB-MS was 253.

Intermediate U was obtained in a yield of 60% from 2-bromo-4-chloroaniline by the same method as the synthetic method of Intermediate D in the synthesis of Compound 1. The molecular weight of Intermediate U measured by FAB-MS was 253.

Under an argon atmosphere, in a 300 ml three-neck flask, 3.00 g of Intermediate U, 2.89 g of phenylboronic acid, 0.26 g of palladium(II) acetate, 6.55 g of potassium carbonate, and 1.94 g of SPhos were dissolved in 60 ml of a mixture solvent of toluene, ethanol, and water (toluene:ethanol:water=10:2:1), followed by stirring at about 80° C. for about 8 hours. After cooling in the air, water was added and extraction with toluene was performed. Organic layers were collected and dried with magnesium sulfate ($MgSO_4$). After that, solvents were distilled and removed under pressurization conditions. The crude product thus obtained was separated by silica gel column chromatography to obtain 2.95 g (yield 74%) of Intermediate V. The molecular weight of Intermediate V measured by FAB-MS was 336.

Under an argon atmosphere, in a 200 ml three-neck flask, 2.50 g of Intermediate V, 4.90 g of 1,2-diiodobenzene, 0.16 g of palladium(II) acetate, 0.41 g of bis(diphenylphosphino)ferrocene, and 1.42 g of sodium tert-butoxide were dissolved in 50 ml of anhydrous toluene, followed by stirring at about 80° C. for about 5 hours. After cooling in the air, water was added and extraction was performed with dichloromethane ($CH_2Cl_2$). Organic layers were collected and dried with magnesium sulfate ($MgSO_4$). After that, solvents were distilled and removed under pressurization pconditions. The crude product thus obtained was separated by silica gel column chromatography to obtain 3.30 g (yield 60%) of Intermediate W. The molecular weight of Intermediate W measured by FAB-MS was 740.

Under an argon atmosphere, in a 200 ml three-neck flask, 3.00 g of Intermediate W, 1.35 g of 2-bromophenylboronic acid, 0.39 g of tetrakis(triphenylphosphine)palladium(0), 1.86 g of potassium carbonate, and 0.55 g of SPhos were dissolved in 50 ml of a mixture solvent of toluene, ethanol, and water (toluene:ethanol:water=10:2:1), followed by stirring at about 80° C. for about 10 hours. After cooling in the air, water was added and extraction with toluene was performed. Organic layers were collected and dried with magnesium sulfate ($MgSO_4$). After that, solvents were distilled and removed under pressurization conditions. The crude product thus obtained was separated by silica gel column chromatography to obtain 1.67 g (yield 62%) of Intermediate X. The molecular weight of Intermediate X measured by FAB-MS was 798.

Compound 12 was obtained in a yield of 28% from Intermediate X by the same method as the synthetic method of Compound 1. The molecular weight of Compound 12 measured by FAB-MS was 664.

Example 2. Manufacture and Evaluation of Organic Electroluminescence Devices Including Silicon-Containing Compounds 2-1. Example A Organic Electroluminescence Devices Including Silicon-Containing Compounds Organic electroluminescence devices including silicon-containing compounds of the present disclosure were added to emission layers, where the emission layer includes a component emitting delayed fluorescence, were manufactured as follows. For example, the emission layer of the organic electroluminescence device of an embodiment may include a disclosed silicon-containing compound as a fluorescent host and additionally includes a thermally activated delayed fluorescence dopant.

(Manufacture of Organic Electroluminescence Devices)

Organic electroluminescence devices, according to embodiments of the present disclosure (including at least one of the disclosed silicon-containing compounds in emission layers) were manufactured as follows. Organic electroluminescence devices of Example 1-1 to Example 1-6 were manufactured using silicon-containing compounds of the above-described Compound 1, Compound 2, Compound 5, Compound 8, Compound 11, and Compound 12 as materials for emission layers. In Table 1, compounds used in Example 1-1 to Example 1-6, and Comparative Example 1-1 to Comparative Example 1-3 are listed.

TABLE 1

| | |
|---|---|
| Compound 1 | 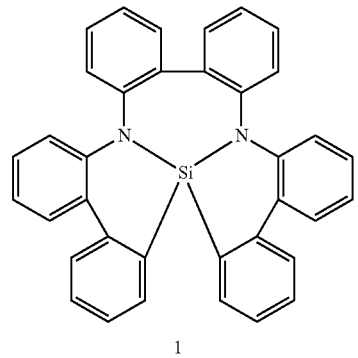 [SMILES: c1ccc2c(c1)-c1ccccc1N1c3ccccc3-c3ccccc3[Si]13c1ccccc1-c1ccccc1N23]<br>1 |
| Compound 2 | 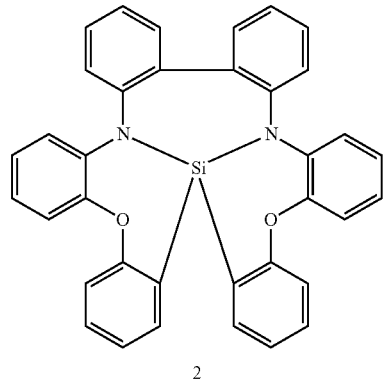 [SMILES: c1ccc2c(c1)Oc1ccccc1[Si]13c4ccccc4Oc4ccccc4N1c1ccccc1-c1ccccc1N23]<br>2 |
| Compound 5 | 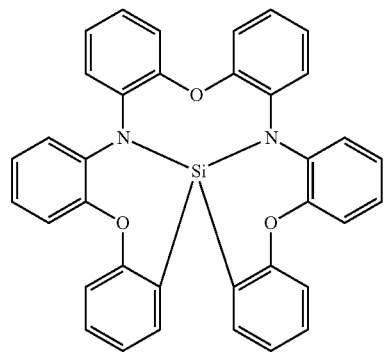<br>5 |

TABLE 1-continued

| Compound 8 | 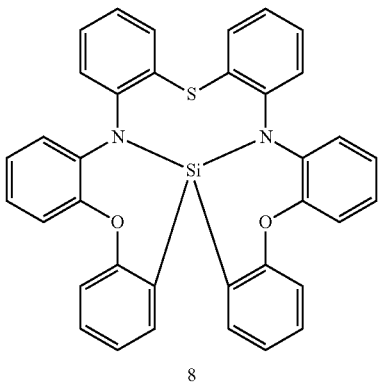 [SMILES: c1ccc2c(c1)Oc1ccccc1[Si]13c4ccccc4Oc4ccccc4N1c1ccccc1Sc1ccccc1N23] |
| --- | --- |
| Compound 11 | 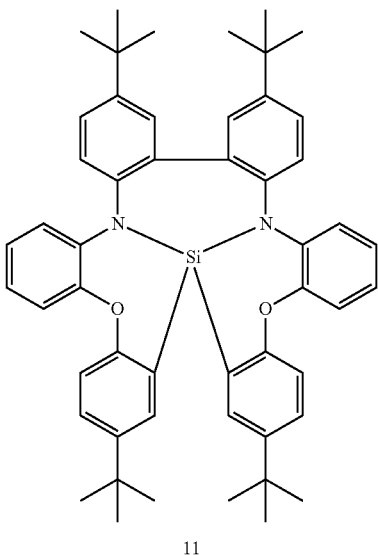 [SMILES: CC(C)(C)c1ccc2c(c1)-c1cc(C(C)(C)C)ccc1N1c3ccccc3Oc3ccc(C(C)(C)C)cc3[Si]13c1cc(C(C)(C)C)ccc1Oc1ccccc1N23] |
| Compound 12 | 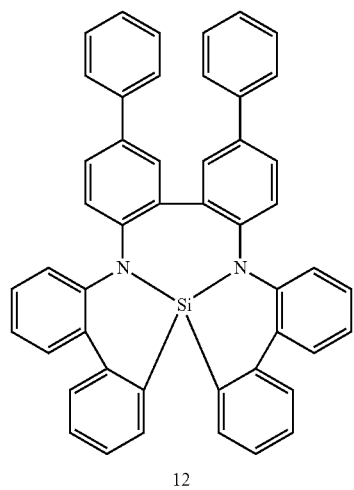 [SMILES: c1ccc(-c2ccc3c(c2)-c2cc(-c4ccccc4)ccc2N2c4ccccc4-c4ccccc4[Si]24c2ccccc2-c2ccccc2N34)cc1] |

TABLE 1-continued

| Comparative Compound X-1 | 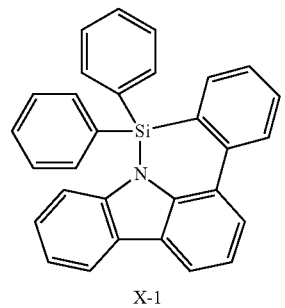 |
| --- | --- |
| Comparative Compound X-2 | 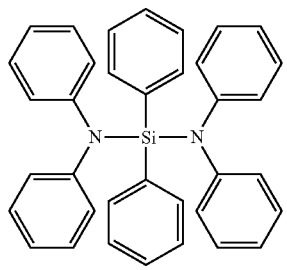 |
| Comparative Compound X-3 | 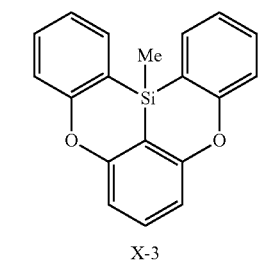 |

The organic electroluminescence devices of the examples and the comparative examples were manufactured as follows.

On a glass substrate, ITO was patterned to a thickness of about 1,500 Å, and then washed with ultrapure water and treated with UV ozone for about 10 minutes. Then, HAT-CN was deposited to a thickness of about 100 Å, α-NPD was deposited to a thickness of about 800 Å, and mCP was deposited to a thickness of about 50 Å to form a hole transport region.

After that, for forming a emission layer, ACRSA and the silicon-containing compound of an embodiment or the comparative compound were co-deposited in a ratio of 18:82 to a thickness of about 200 Å. That is, the emission layer formed via the co-deposition was formed by depositing a mixture of ACRSA with each of Compound 1, Compound 2, Compound 5, Compound 8, Compound 11, and Compound 12 in Example 1-1 to Example 1-6, or depositing a mixture of ACRSA with Comparative Compounds X-1, X-2, or X-3 in Comparative Example 1-1 to Comparative Example 1-3.

After forming the emission layer, a layer was formed using DPEPO to a thickness of about 100 Å. Then, on the emission layer, a layer was formed using TPBi to a thickness of about 300 Å, and a layer was formed using LiF to a thickness of about 5 Å to form an electron transport region. After that, a second electrode was formed using aluminum (Al) to a thickness of about 1,000 Å.

In some examples, the hole transport region, the emission layer, the electron transport region, and the second electrode were formed using a vacuum deposition apparatus.

The materials used for the manufacture of the organic electroluminescence devices are represented as follows.

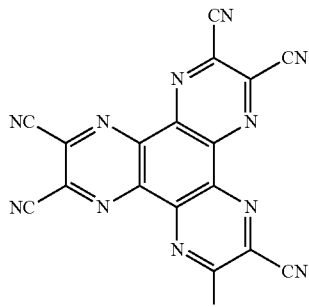
HAT-CN

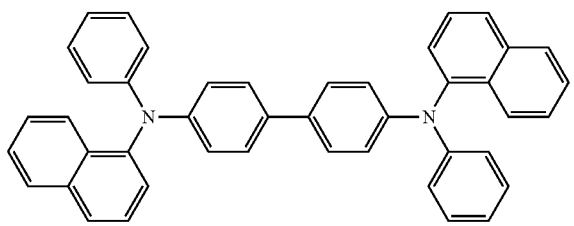
α-NPD

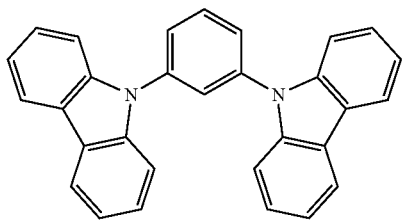
mCP

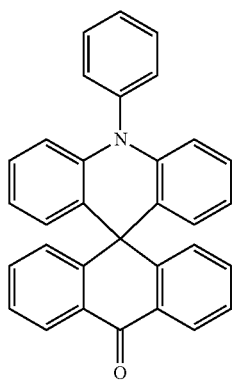
ACRSA

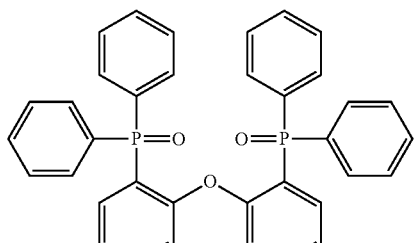
DPEPO

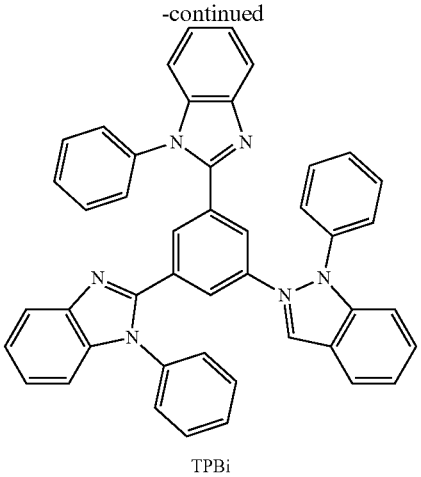
TPBi (Evaluation of Properties of Organic Electroluminescence Devices)

The maximum emission efficiency of the organic electroluminescence devices according to the examples and the comparative examples was evaluated. The maximum emission efficiency is shown in a relative sense based on Comparative Example 1-1. The emission efficiency of Example 1-1 to Example 1-6, Comparative Example 1-2, and Comparative Example 1-3 are shown in a relative sense based on 100% of the emission efficiency of Comparative Example 1-1. The emission properties of the organic electroluminescence devices according to the examples and the comparative examples were measured using a brightness light distribution characteristics measurement system, C9920-11 of HAMAMATSU Photonics Co.

TABLE 2

| Device manufacturing example | Host material | Maximum emission efficiency (%) |
|---|---|---|
| Example 1-1 | Compound 1 | 160 |
| Example 1-2 | Compound 2 | 160 |
| Example 1-3 | Compound 5 | 180 |
| Example 1-4 | Compound 8 | 170 |
| Example 1-5 | Compound 11 | 150 |
| Example 1-6 | Compound 12 | 140 |
| Comparative Example 1-1 | Comparative Compound X-1 | 100 |
| Comparative Example 1-2 | Comparative Compound X-2 | 80 |
| Comparative Example 1-3 | Comparative Compound X-3 | 90 |

The device manufacturing examples in Table 2 correspond to the examples using the silicon-containing compounds of exemplary embodiments or the comparative compounds as the host materials of emission layers. The suggested device manufacturing examples include an emission layer emitting blue light, and ACRSA used as the dopant in an emission layer may be a thermally activated, delayed fluorescent dopant.

With reference to Table 2, the organic electroluminescence devices of Example 1-1 to Example 1-6 were found to show excellent emission efficiency when compared to the organic electroluminescence devices of Comparative Example 1-1 to Comparative Example 1-3. When compared to Comparative Compound X-1 used in Comparative Example 1-1, the silicon-containing compounds used in Example 1-1 to Example 1-6 had low planarity and a high triplet energy level (T1) to achieve easy emission of thermally activated delayed fluorescence, thereby improving the emission efficiency of organic electroluminescence devices. In addition, in Comparative Compound X-2 used in Comparative Example 1-2, different from the example compounds, substituents such as an amine group and a phenyl group, which are connected with silicon (Si), are not connected with each other, and molecular stability thereof is relatively low when compared to the example compounds. Accordingly, it may be found that Comparative Compound X-2 may be easily damaged during the manufacturing process of an organic electroluminescence device, thereby decreasing emission efficiency.

According to the embodiments and examples of the present disclosure, by using the disclosed silicon-containing compounds as the host materials of emission layers, the organic electroluminescence devices of Example 1-1 to Example 1-6 may restrain energy transfer from a dopant to a host in emission layers due to the high triplet energy level (T1) of the silicon-containing compounds. In addition, by using at least one of the disclosed silicon-containing compound together with a thermally activated delayed fluorescence dopant as the host of the emission layer in an organic electroluminescence device, the efficiency of the emission layer was found to be improved in an embodiment.

2-2. Example B of Organic Electroluminescence Devices Including Silicon-Containing Compounds Organic electroluminescence devices including silicon-containing compounds in hole transport regions were manufactured as follows.

(Manufacture of Organic Electroluminescence Devices)

Organic electroluminescence devices according to embodiments of the present disclosure having at least one of the disclosed silicon-containing compounds or comparative compounds in hole transport regions were manufactured as follows. Organic electroluminescence devices of Example 2-1 to Example 2-6 were manufactured using silicon-containing compounds of the above-described Compound 1, Compound 2, Compound 5, Compound 8, Compound 11, and Compound 12 as materials for hole transport regions. In addition, organic electroluminescence devices of Comparative Example 2-1 to Comparative Example 2-3 were manufactured using Comparative Compound X-1, Comparative Compound X-2, and Comparative Compound X-3 as the materials for hole transport regions. Compound 1, Compound 2, Compound 5, Compound 8, Compound 11, Compound 12, Comparative Compound X-1, Comparative Compound X-2, and Comparative Compound X-3 were the same as illustrated in Table 1.

The organic electroluminescence devices of the examples and the comparative examples were manufactured as follows.

On a glass substrate, ITO was patterned to a thickness of about 1,500 Å, and then washed with ultrapure water and treated with UV ozone for about 10 minutes. Then, HAT-CN was deposited to a thickness of about 100 Å, and α-NPD was deposited to a thickness of about 800 Å. Then, Compound 1, Compound 2, Compound 5, Compound 8, Compound 11, Compound 12, Comparative Compound X-1, Comparative Compound X-2, or Comparative Compound X-3 was deposited to form a hole transport region. That is, each of Compound 1, Compound 2, Compound 5, Compound 8, Compound 11, and Compound 12 was deposited to form a hole transport layer in Example 2-1 to Example 2-6, or each of Comparative Compound X-1, Comparative Compound X-2, and Comparative Compound X-3 was deposited to form a hole transport layer in Comparative Example 2-1 to Comparative Example 2-3.

On the hole transport region, an emission layer was formed, and during forming the emission layer, ACRSA and DPEPO were co-deposited in a ratio of 18:82 to a thickness of about 200 Å. After that, a layer was formed using DPEPO to a thickness of about 100 Å. Then, on the emission layer, a layer was formed using TPBi to a thickness of about 300 Å, and a layer was formed using LiF to a thickness of about 5 Å to form an electron transport region. After that, a second electrode was formed using aluminum (Al) to a thickness of about 1,000 Å.

In exemplary embodiments, the hole transport region, the emission layer, the electron transport region, and the second electrode were formed using a vacuum deposition apparatus.

The materials used for the manufacture of the organic electroluminescence devices are represented as follows.

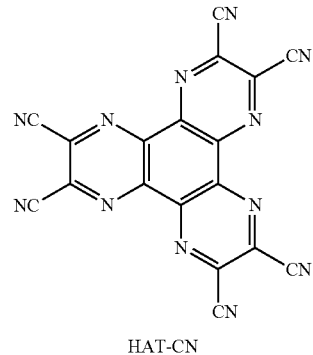

HAT-CN

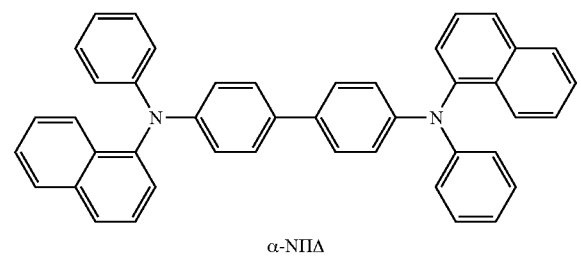

α-NPD

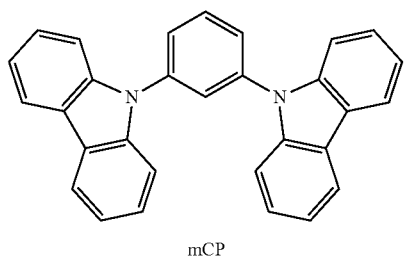

mCP

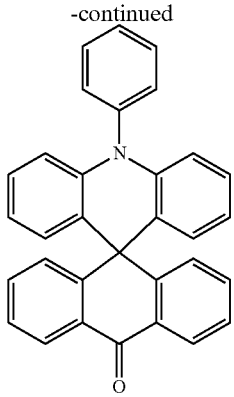

ACRSA

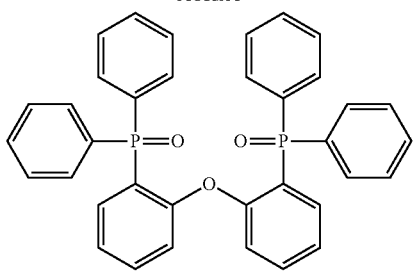

DPEPO

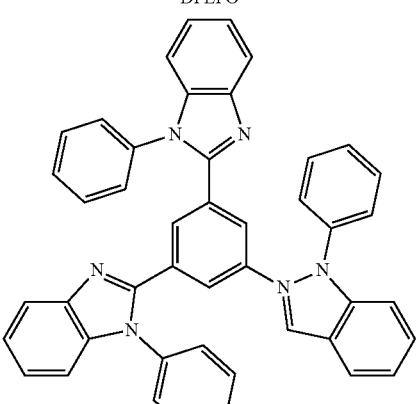

TPBi (Evaluation of Properties of Organic Electroluminescence Device)

The maximum emission efficiency of the organic electroluminescence devices according to the examples and the comparative examples was evaluated. The maximum emission efficiency was shown in a relative sense based on Comparative Example 2-1. The emission efficiency of Example 2-1 to Example 2-6, Comparative Example 2-2, and Comparative Example 2-3 was shown in a relative sense based on 100% of the emission efficiency of Comparative Example 2-1. The emission properties of the organic electroluminescence devices according to the examples and the comparative examples were measured using a brightness light distribution characteristics measurement system, C9920-11 of HAMAMATSU Photonics Co.

TABLE 3

| Device manufacturing example | Hole transport layer material | Maximum emission efficiency (%) |
| --- | --- | --- |
| Example 2-1 | Compound 1 | 120 |
| Example 2-2 | Compound 2 | 130 |
| Example 2-3 | Compound 5 | 150 |
| Example 2-4 | Compound 8 | 150 |
| Example 2-5 | Compound 11 | 140 |
| Example 2-6 | Compound 12 | 110 |
| Comparative Example 2-1 | Comparative Compound X-1 | 100 |
| Comparative Example 2-2 | Comparative Compound X-2 | 90 |
| Comparative Example 2-3 | Comparative Compound X-3 | 90 |

The device manufacturing examples in Table 3 correspond to the examples using the disclosed silicon-containing compounds or the comparative compounds as the hole transport materials of hole transport regions. The suggested device manufacturing examples include an emission layer emitting blue light, and ACRSA used as the dopant in the emission layer may be a thermally activated delayed fluorescent dopant.

Referring to the results of Table 3, the organic electroluminescence devices of Example 2-1 to Example 2-6 were found to show excellent emission efficiency when compared to the organic electroluminescence devices of Comparative Example 2-1 to Comparative Example 2-3. When compared to Comparative Compound X-1 to Comparative Compound X-3 used in Comparative Example 2-1 to Comparative Example 2-3, the silicon-containing compounds used in Example 2-1 to Example 2-6 had high triplet energy levels (T1) to achieve high emission efficiency by restraining the diffusion of excitons in an emission layer to neighboring layers.

The silicon-containing compound according to embodiments of the present disclosure may be used in an emission layer or a hole transport region to improve the emission efficiency of an organic electroluminescence device.

According to embodiments of the present disclosure, an organic electroluminescence device having at least one of the disclosed silicon-containing compound together with a thermally activated delayed fluorescence emitting dopant in an emission layer, shows improved emission efficiency. Without being bound by any particular theory, when at least one of the silicon-containing compounds is used in a hole transport region of an organic electroluminescence device, the movement of excitons from an emission layer to a neighboring region may be restrained, thereby improving the emission efficiency of an organic electroluminescence device.

For example, the organic electroluminescence device including at least one of the disclosed silicon-containing compounds in a hole transport region may emit blue light with high efficiency.

A silicon-containing compound as disclosed herein according to embodiments of the present disclosure may improve the emission efficiency of an organic electroluminescence device.

For example, an organic electroluminescence device having at least one of the disclosed silicon-containing compounds in an emission layer or a hole transport region may attain high efficiency.

While one or more embodiments have been described with reference to the figures, it will be understood by those of ordinary skill in the art that various changes in form and details may be made therein without departing from the spirit and scope as defined by the following claims, and equivalents thereof.

What is claimed is:

1. A silicon-containing compound represented by the following Formula 1:

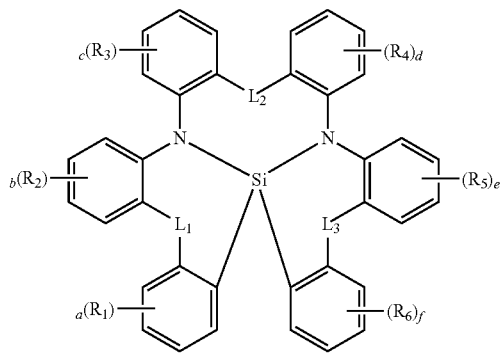

Formula 1 in Formula 1, $L_1$, $L_2$ and $L_3$ are each independently a direct linkage, O, or S, $R_1$ to $R_6$ are each independently a hydrogen atom, a deuterium atom, a halogen atom, a cyano group, a substituted or unsubstituted amine group, a substituted or unsubstituted silyl group, a substituted or unsubstituted phosphine group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, and "a" to "f" are each independently an integer of 0 to 4.

2. The silicon-containing compound of claim 1, wherein $L_1$ to $L_3$ are the same.

3. The silicon-containing compound of claim 1, wherein $L_1$ and $L_3$ are the same, and $L_2$ is different from $L_1$ and $L_3$.

4. The silicon-containing compound of claim 1, wherein Formula 1 is represented by any one of the following Formula 1-1 to Formula 1-3:

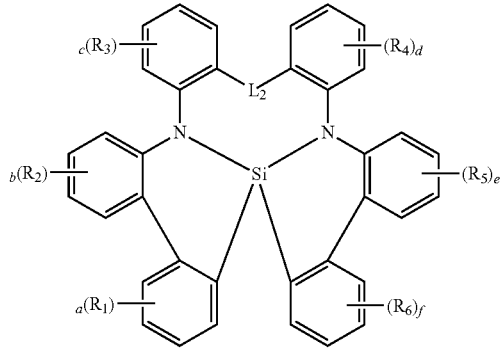

Formula 1-1

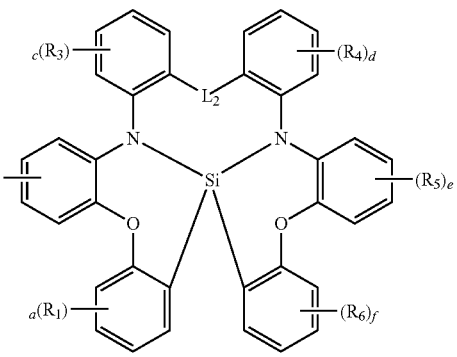

Formula 1-2

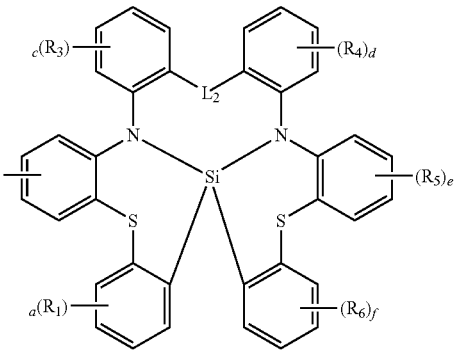

Formula 1-3 in Formula 1-1 to Formula 1-3, $L_2$, $R_1$ to $R_6$, and "a" to "f" are the same as defined in Formula 1.

5. The silicon-containing compound of claim 1, wherein $R_1$ to $R_6$ are each independently a fluorine atom, a t-butyl group, a substituted or unsubstituted phenyl group, a triphenylsilyl group, a diphenylamino group, a diphenylphosphine oxide group, or a substituted or unsubstituted heteroaryl group comprising N as a heteroatom and having 2 to 30 carbon atoms for forming a ring.

6. The silicon-containing compound of claim 1, wherein the silicon-containing compound represented by Formula 1 is any one of the compounds represented in the following Compound Group 1:

Compound Group 1

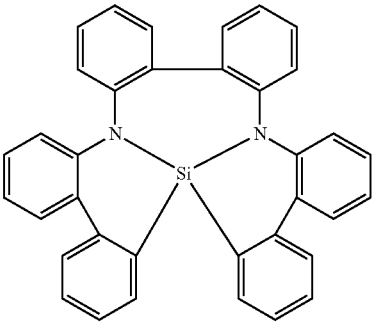

1

2
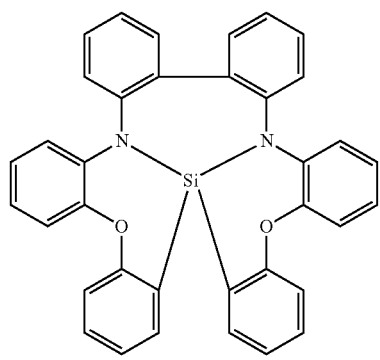
3
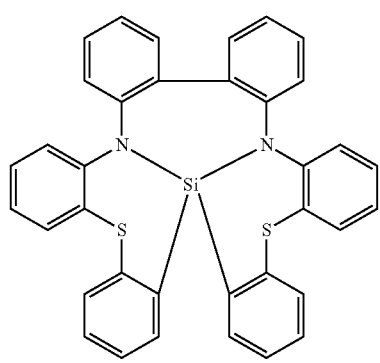
4
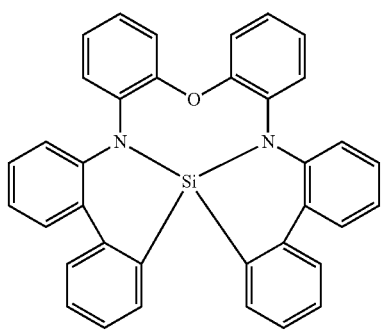
5
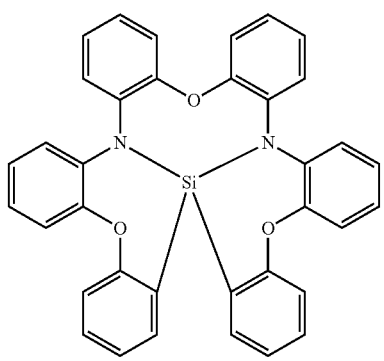
6
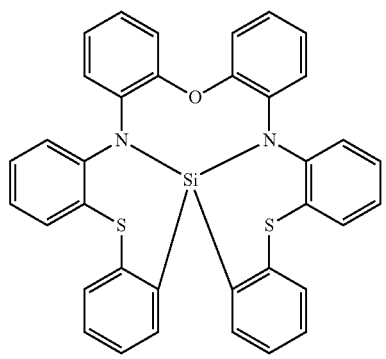
7
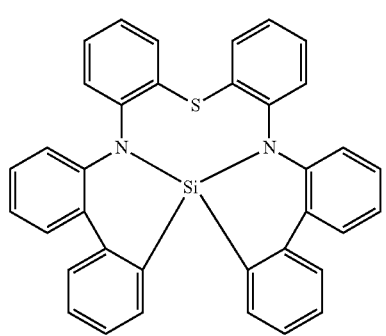
8
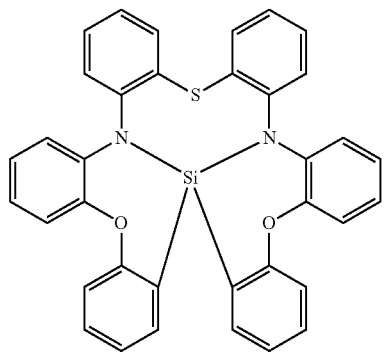
9
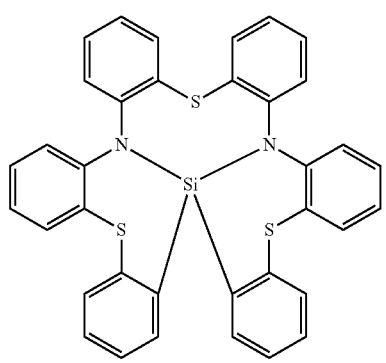

10
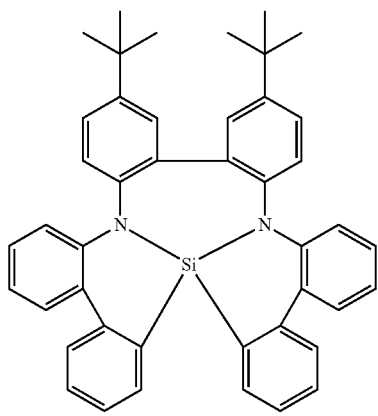
11
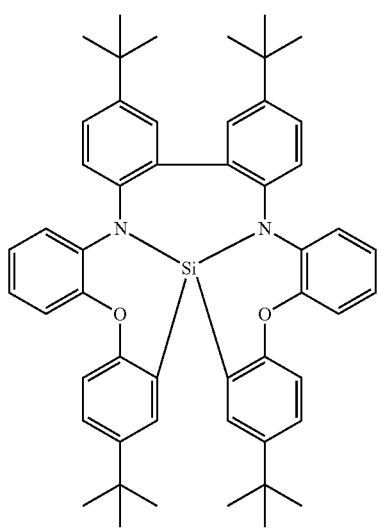
12
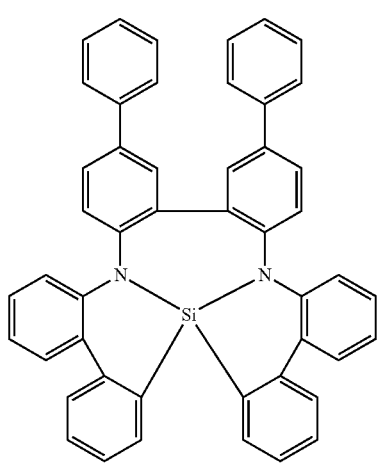
13
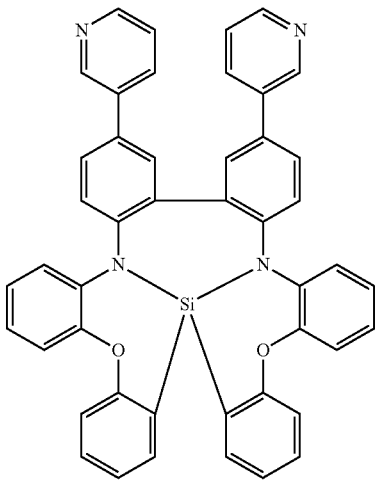
14
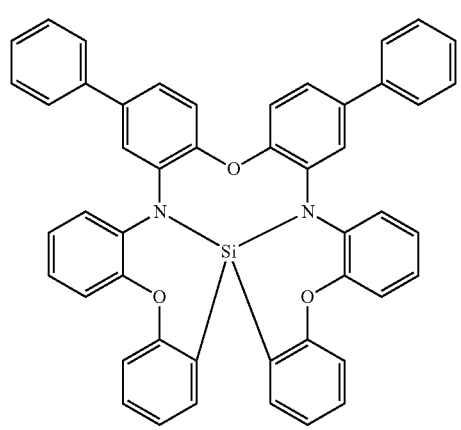
15
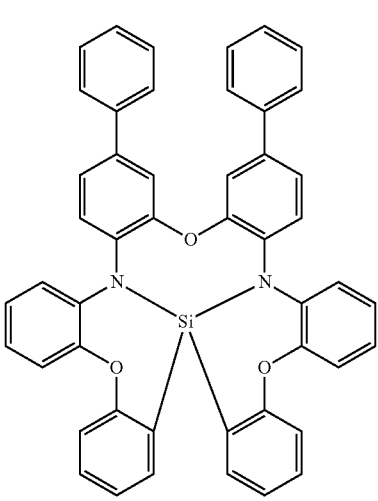

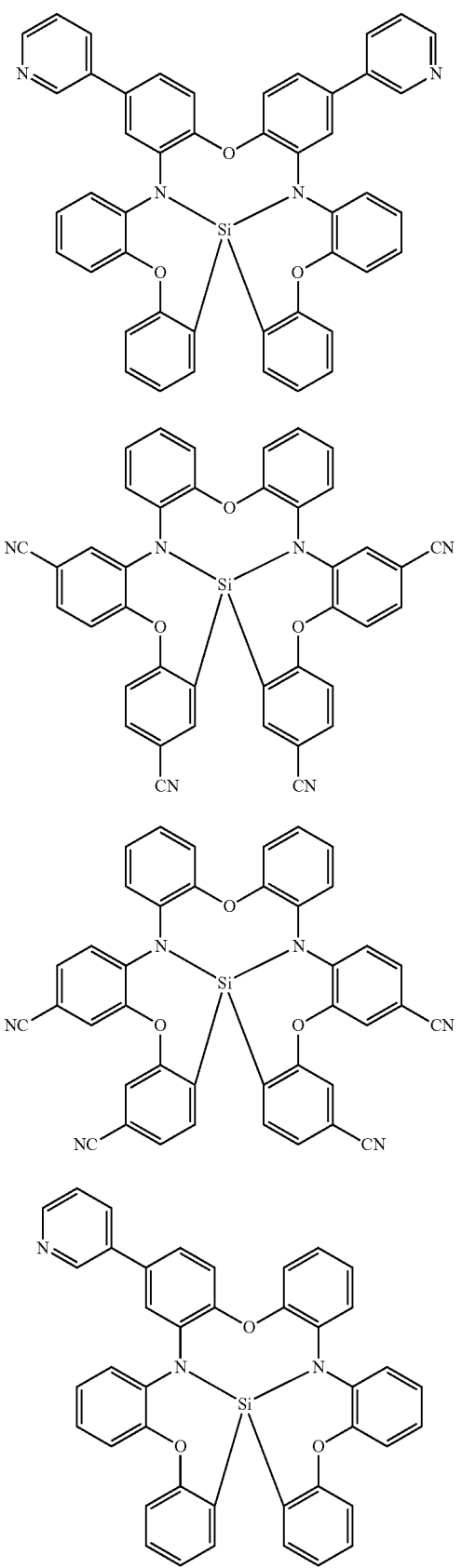
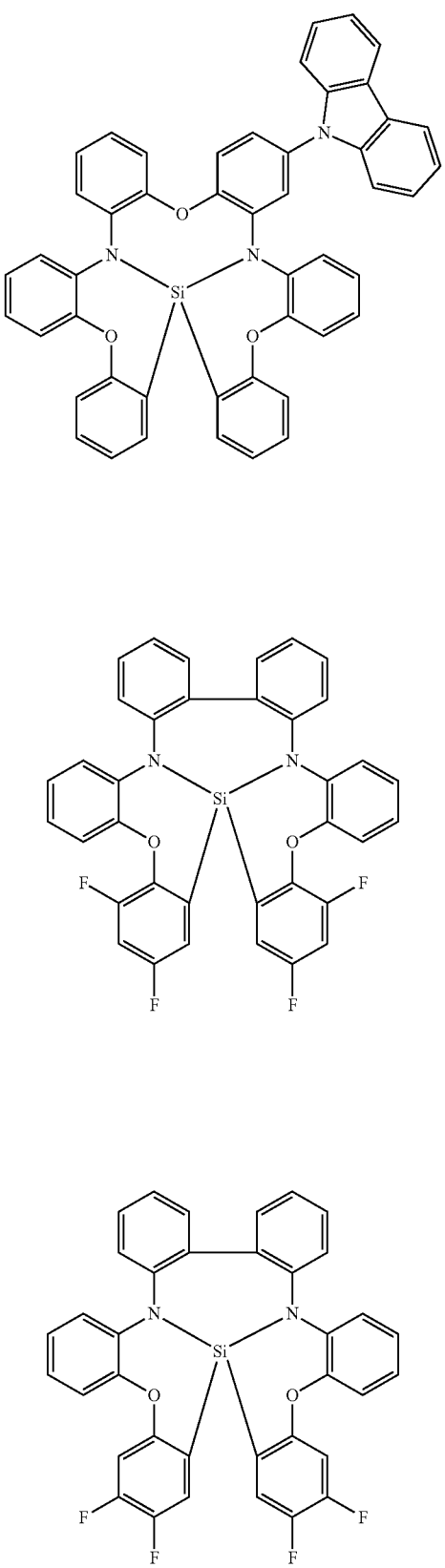

23

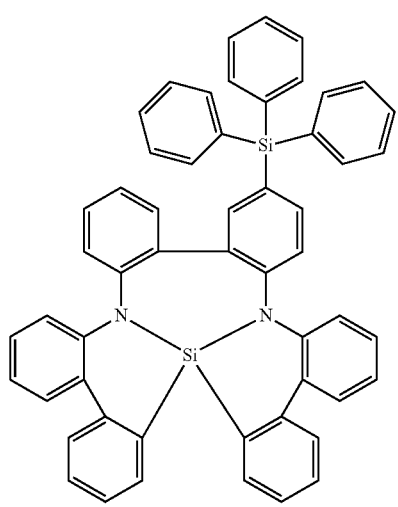

24

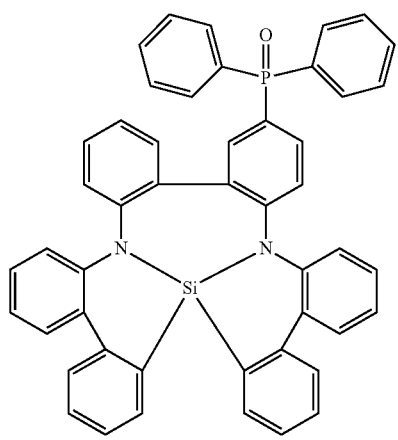

25

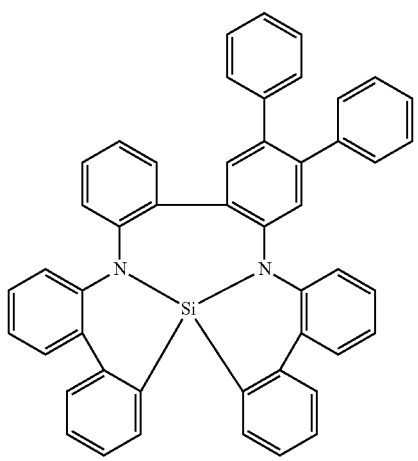

26

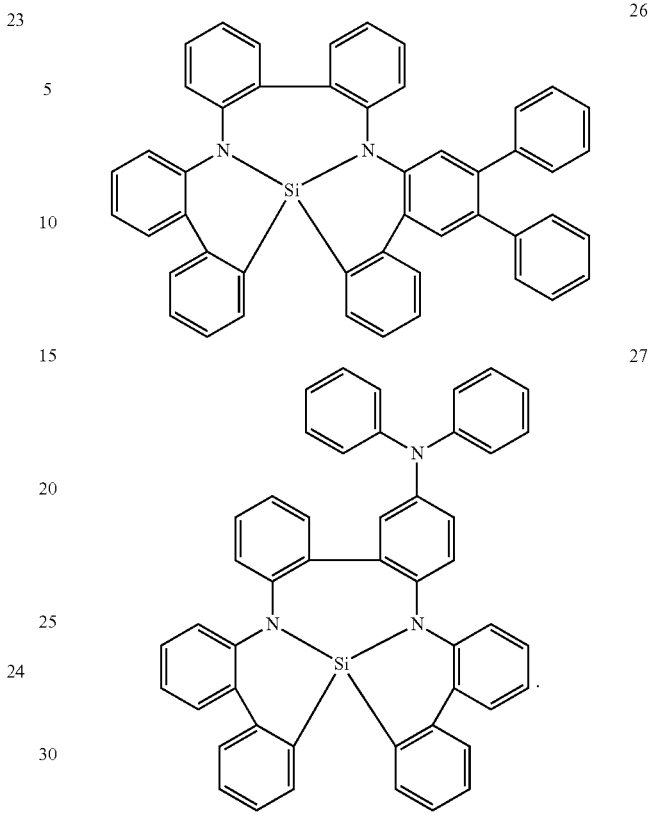

27

7. An organic electroluminescence device, comprising:
a first electrode;
a second electrode opposite to the first electrode; and
a plurality of organic layers between the first electrode and the second electrode, the organic layers comprising an emission layer,
wherein the first electrode and the second electrode are each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, a compound of two or more selected from them, a mixture of two or more selected from them, and an oxide thereof, and
wherein at least one organic layer of the organic layers comprises a silicon-containing compound represented by the following Formula 1:

Formula 1

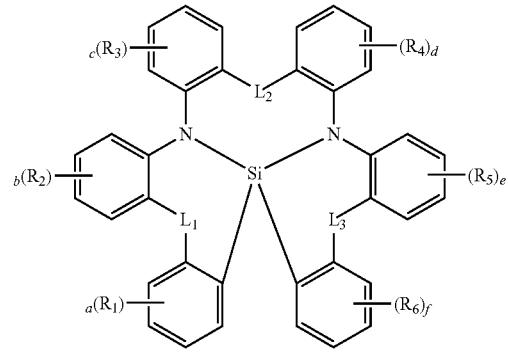

in Formula 1, $L_1$, $L_2$ and $L_3$ are each independently a direct linkage, O, or S, $R_1$ to $R_6$ are each independently a hydrogen atom, a deuterium atom, a halogen atom, a cyano group, a substituted or unsubstituted amine group, a substituted or unsubstituted silyl group, a substituted or unsubstituted phosphine group, a substituted or unsubstituted alkyl group having 1 to 20 carbon atoms, a substituted or unsubstituted aryl group having 6 to 30 carbon atoms for forming a ring, or a substituted or unsubstituted heteroaryl group having 2 to 30 carbon atoms for forming a ring, and "a" to "f" are each independently an integer of 0 to 4.

8. The organic electroluminescence device of claim 7, wherein Formula 1 is represented by any one of the following Formula 1-1 to Formula 1-3:

Formula 1-1

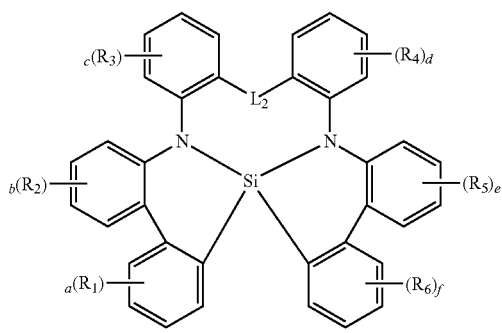

Formula 1-2

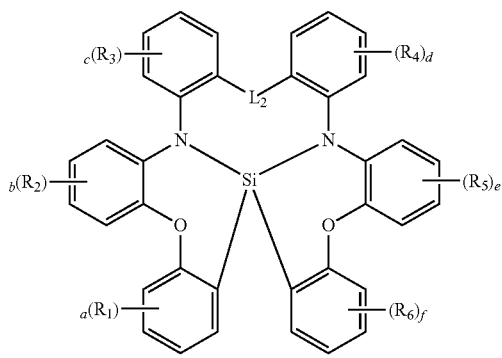

Formula 1-3

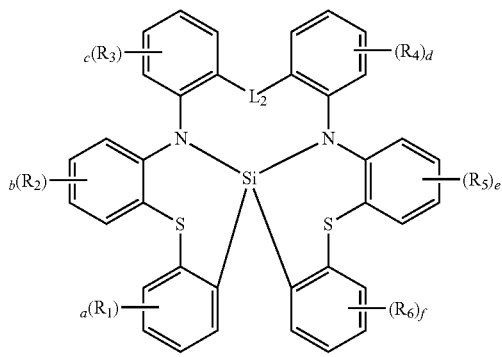

in Formula 1-1 to Formula 1-3, $L_2$, $R_1$ to $R_6$, and "a" to "f" are the same as defined in Formula 1.

9. The organic electroluminescence device of claim 7, wherein the emission layer comprises the silicon-containing compound represented by Formula 1.

10. The organic electroluminescence device of claim 7, wherein the emission layer comprises a host and a dopant, the dopant comprises a thermally activated delayed fluorescence emission dopant, and the host comprises the silicon-containing compound represented by Formula 1.

11. The organic electroluminescence device of claim 10, wherein the dopant comprises at least one of 10-phenyl-10H,10'H-spiro[acridine-9,9'-anthracene]-10'-one (ACRSA), 3,4,5,6-tetra-9H-carbazol-9-yl-1,2-benzenedicarbonitrile (4CzPN), 2,4,5,6-tetra-9H-carbazo-9-yl-isophthalonitrile (4CzIPN), bis[4-9,9-dimethyl-9,10-dihydroacridine]phenyl]solfone (DMAC-DPS), or 2-phenoxazine-4,6-diphenyl-1,3,5-triazine (PSZ-TRZ).

12. The organic electroluminescence device of claim 10, wherein the lowest triplet energy level of the silicon-containing compound is higher than the lowest triplet energy level of the dopant.

13. The organic electroluminescence device of claim 7, wherein the emission layer is configured to emit thermally activated delayed fluorescence blue light.

14. The organic electroluminescence device of claim 7, wherein the organic layers comprise:
    a hole transport region between the first electrode and the emission layer; and
    an electron transport region between the emission layer and the second electrode,
    wherein the hole transport region comprises the silicon-containing compound represented by Formula 1.

15. The organic electroluminescence device of claim 7, wherein at least one organic layer of the organic layers comprises at least one silicon-containing compound of the compounds represented in the following Compound Group 1:

Compound Group 1

1

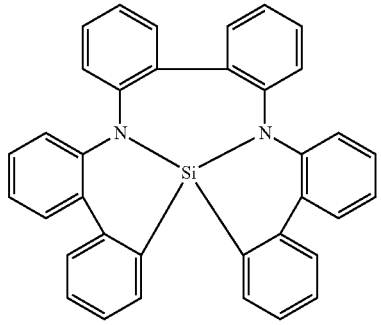

2

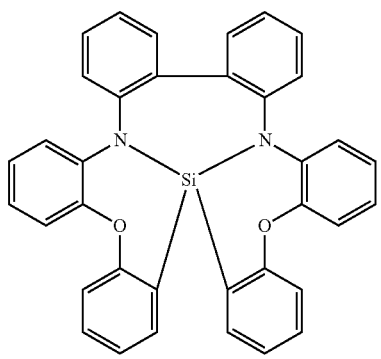

3
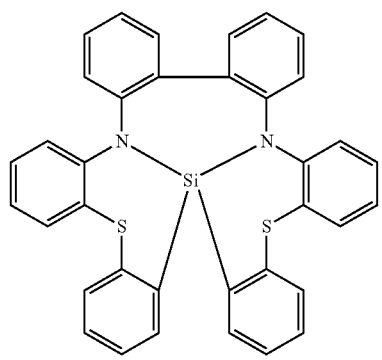
4
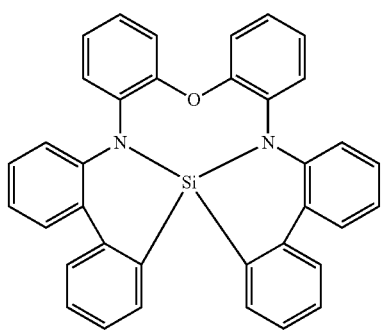
5
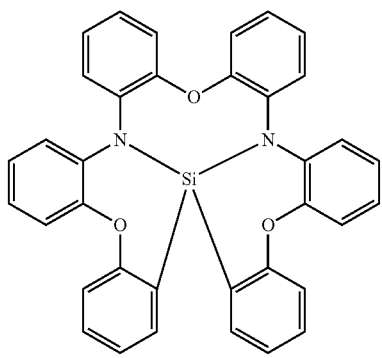
6
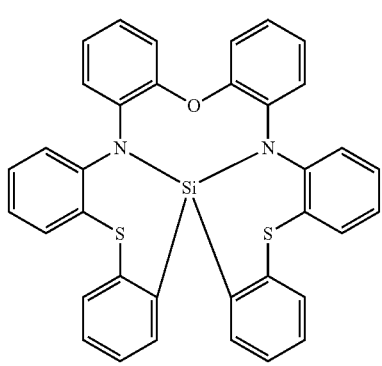
7
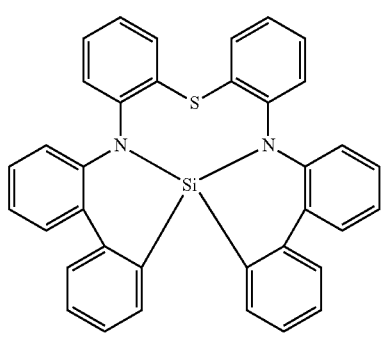
8
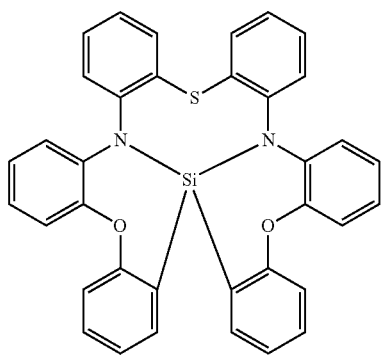
9
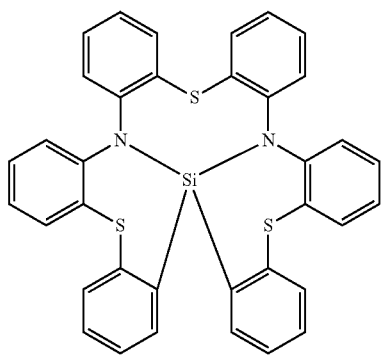
10
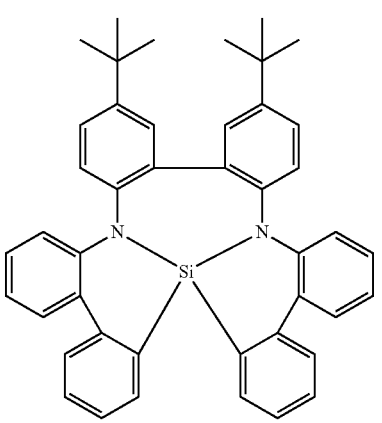

-continued
11
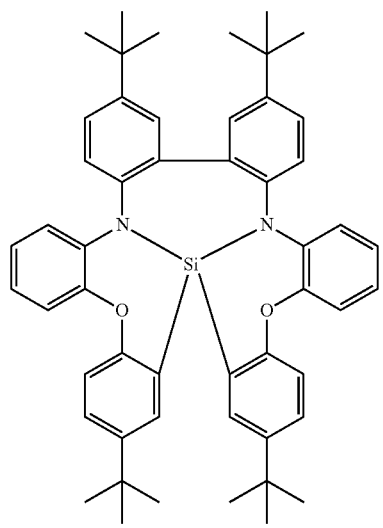
12
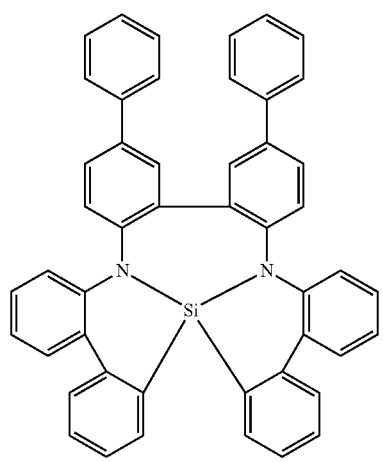
13
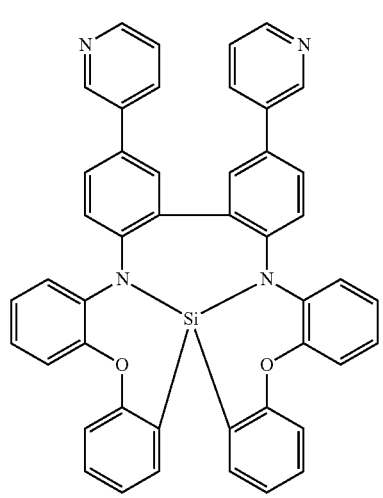
-continued
14
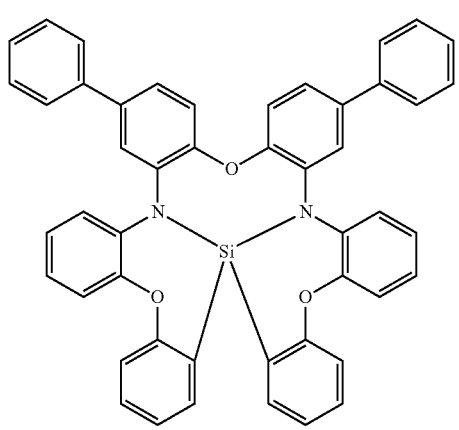
15
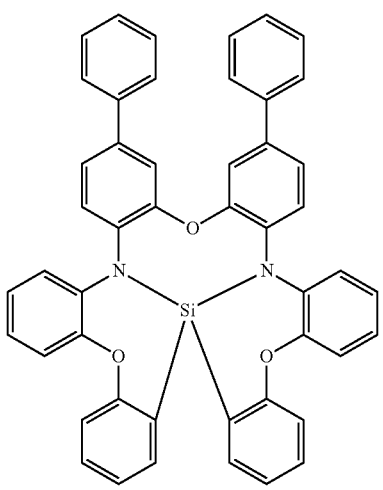
16
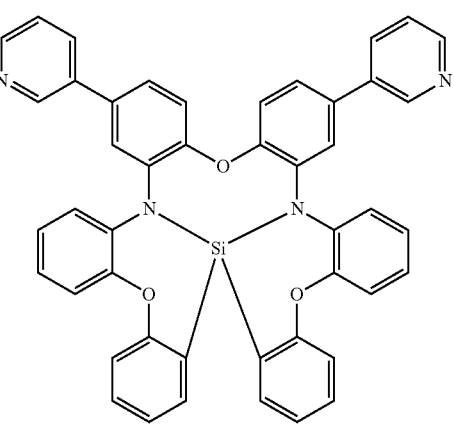

17
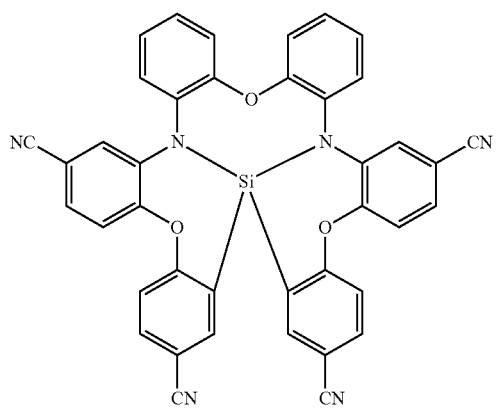
18
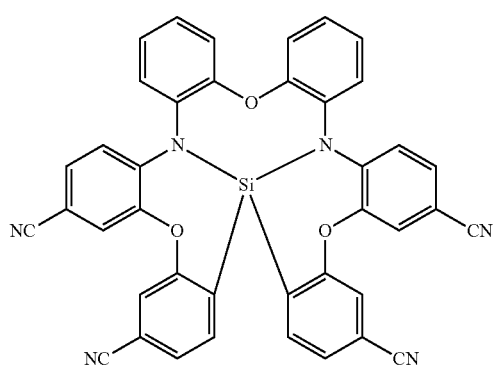
19
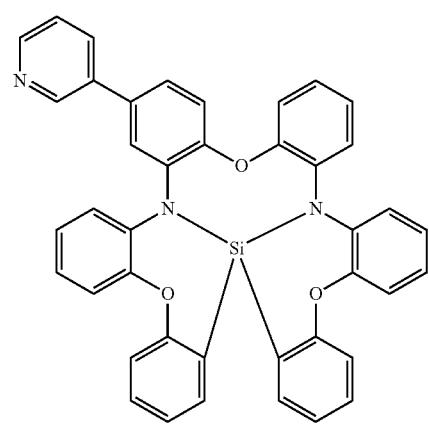
20
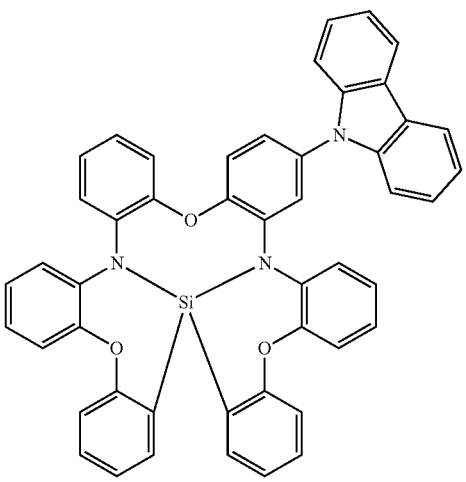
21
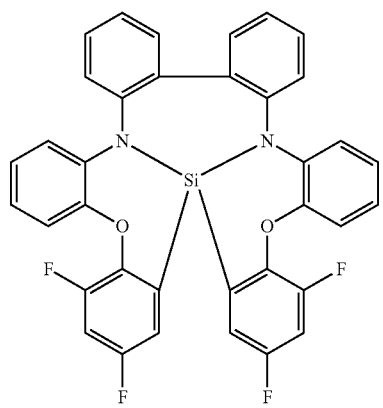
22
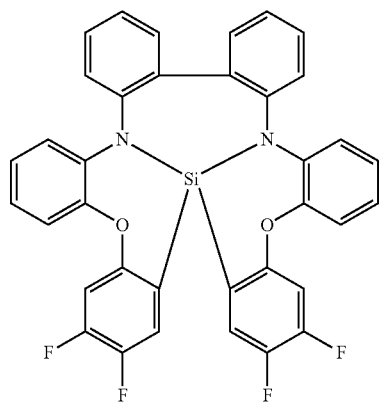

-continued
23
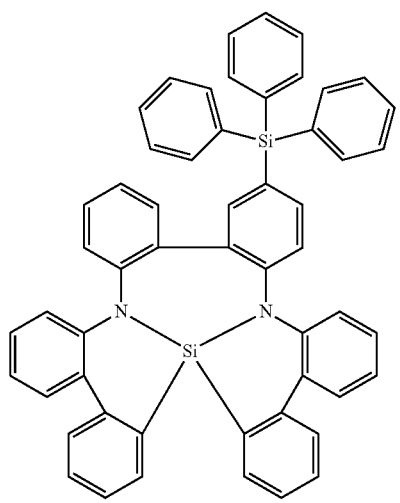
24
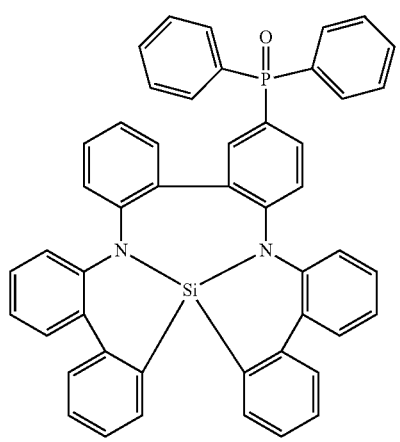
-continued
25
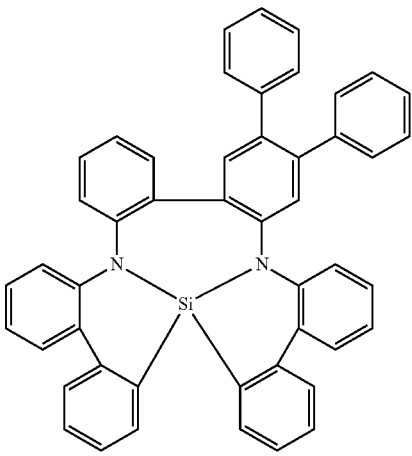
26
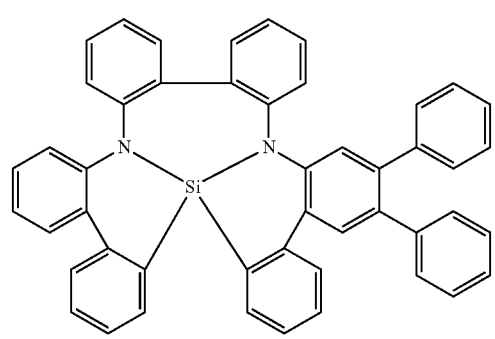
27
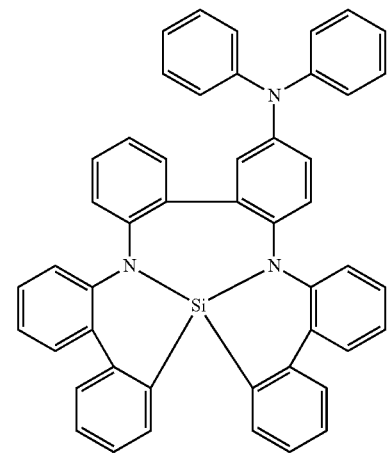
* * * * *